(12) United States Patent
Ueda et al.

(10) Patent No.: US 7,208,359 B2
(45) Date of Patent: Apr. 24, 2007

(54) METHOD OF FORMING SEMICONDUCTOR INTEGRATED DEVICE

(75) Inventors: Naohiro Ueda, Hyogo-ken (JP);
Yoshinori Ueda, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 3 days.

(21) Appl. No.: 11/134,386

(22) Filed: May 23, 2005

(65) Prior Publication Data

US 2005/0221551 A1   Oct. 6, 2005

Related U.S. Application Data

(63) Continuation of application No. 10/422,786, filed on Apr. 25, 2003, now Pat. No. 6,917,081.

(30) Foreign Application Priority Data

Apr. 26, 2002   (JP) ............................. 2002-127407

(51) Int. Cl.
*H01L 21/8234* (2006.01)

(52) U.S. Cl. ..................... 438/197; 438/275

(58) Field of Classification Search ................ 438/197, 438/199, 275, 277, 279, 294
See application file for complete search history.

(56) References Cited

U.S. PATENT DOCUMENTS

| 4,878,096 | A | 10/1989 | Shirai et al. |
| 5,242,841 | A | 9/1993 | Smayling et al. |
| 5,736,445 | A | 4/1998 | Pfirsch |
| 5,880,502 | A | 3/1999 | Lee et al. |
| 6,569,742 | B1 * | 5/2003 | Taniguchi et al. .......... 438/303 |
| 6,717,206 | B2 | 4/2004 | Hsu et al. |
| 2002/0098636 | A1 | 7/2002 | Soderbarg |
| 2004/0259318 | A1 * | 12/2004 | Williams et al. ............ 438/400 |

FOREIGN PATENT DOCUMENTS

| JP | 6-334129 | 12/1994 |
| JP | 2000-286346 | 10/2000 |

* cited by examiner

*Primary Examiner*—Tuan H. Nguyen
(74) *Attorney, Agent, or Firm*—Dickstein Shapiro LLP

(57) ABSTRACT

A semiconductor device is provided comprising several device components formed in the same substrate, such as a P-substrate having an offset Nch transistor including N-type source and drain each formed in a P-well spatially separated from one another, and the drain surrounded by a low concentration N-type diffusion layer; an offset Pch transistor including P-type source and drain each formed in an N-well spatially separated from one another, and the drain surrounded by a low concentration P-type diffusion layer; a triple well including a deep N-well, and a P-type IP well formed therein; a normal N-well for forming a Pch MOS transistor; and a normal P-well for forming an Nch MOS transistor; in which simultaneously formed are the low concentration N-type diffusion layer, N-well and normal N-well; the P-well and normal P-well; and the low concentration P-type diffusion layer and IP well.

41 Claims, 45 Drawing Sheets

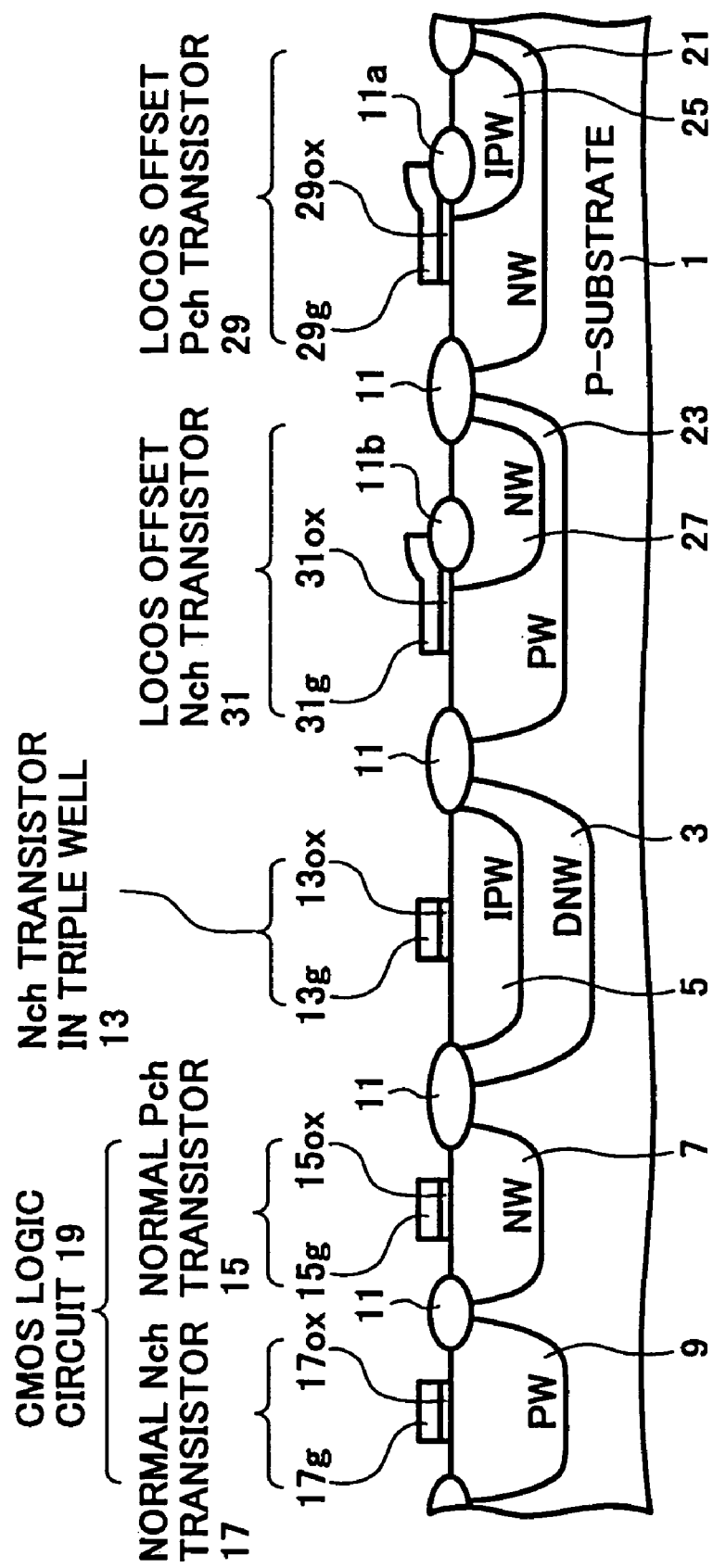

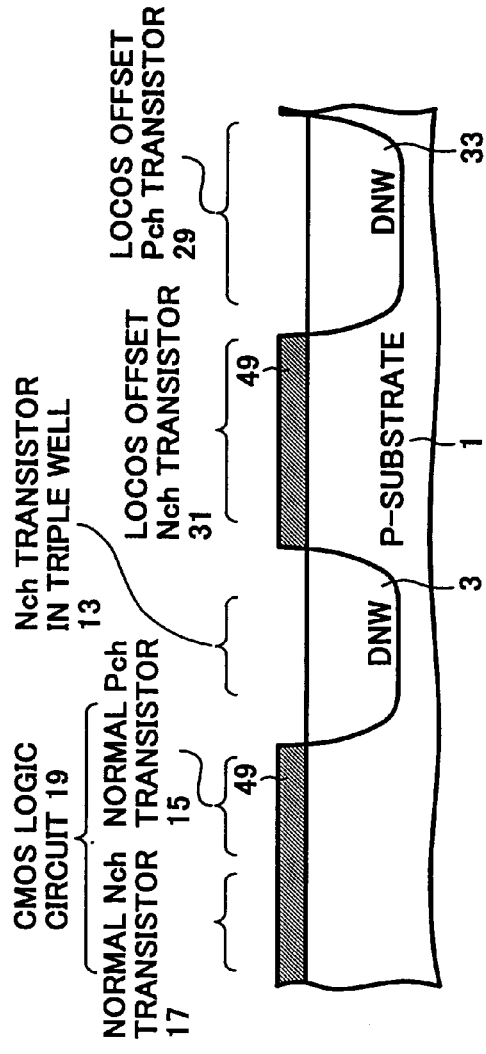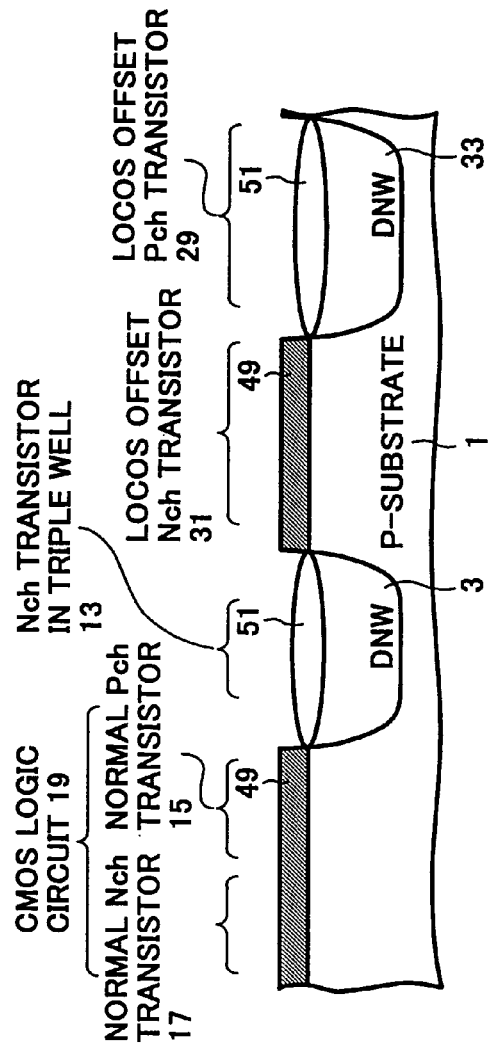
FIG. 11A
FIG. 11B

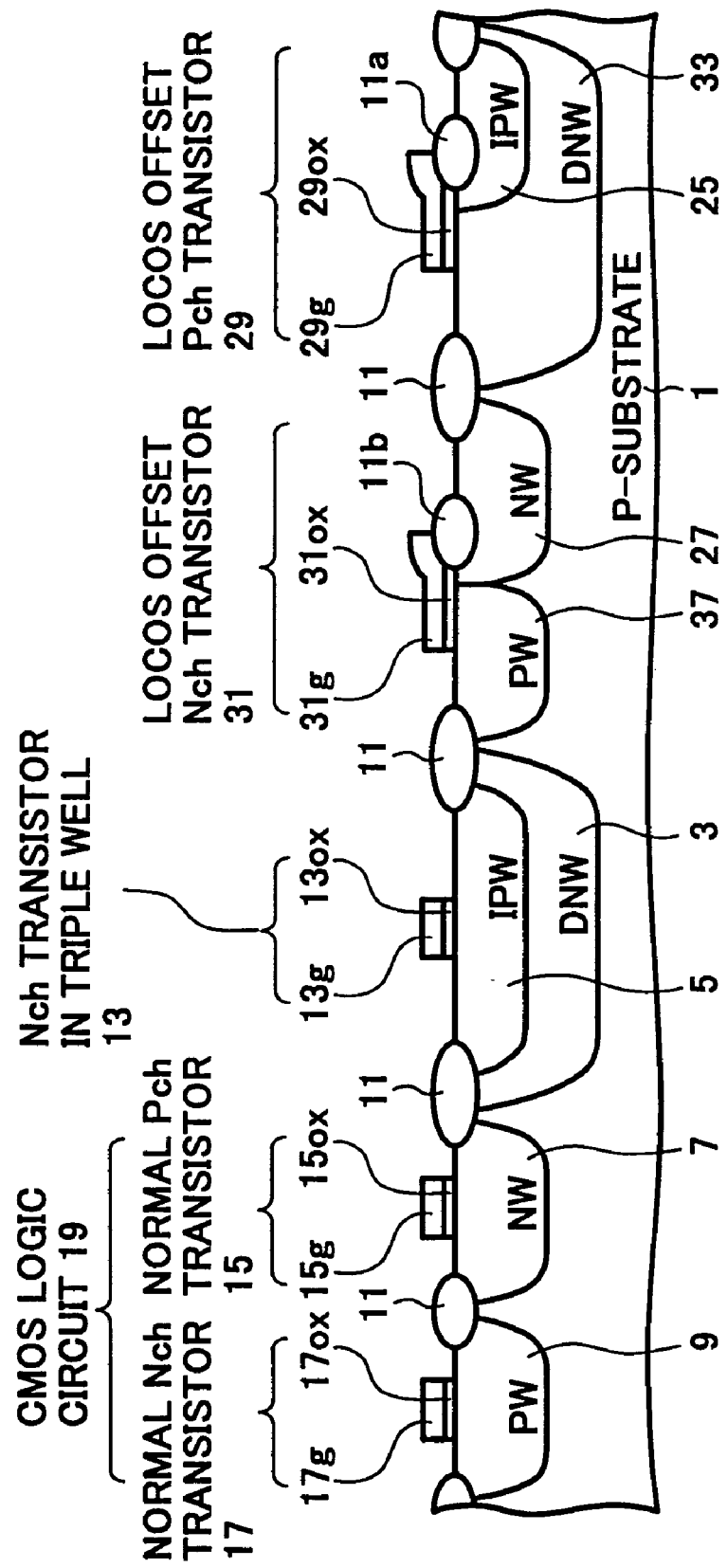

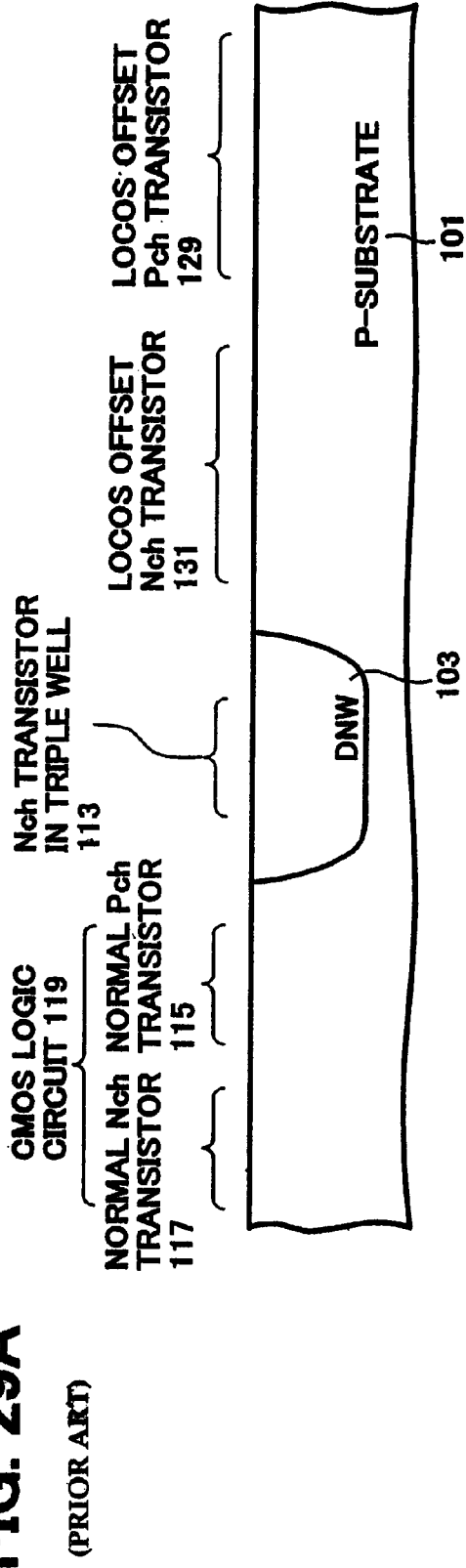
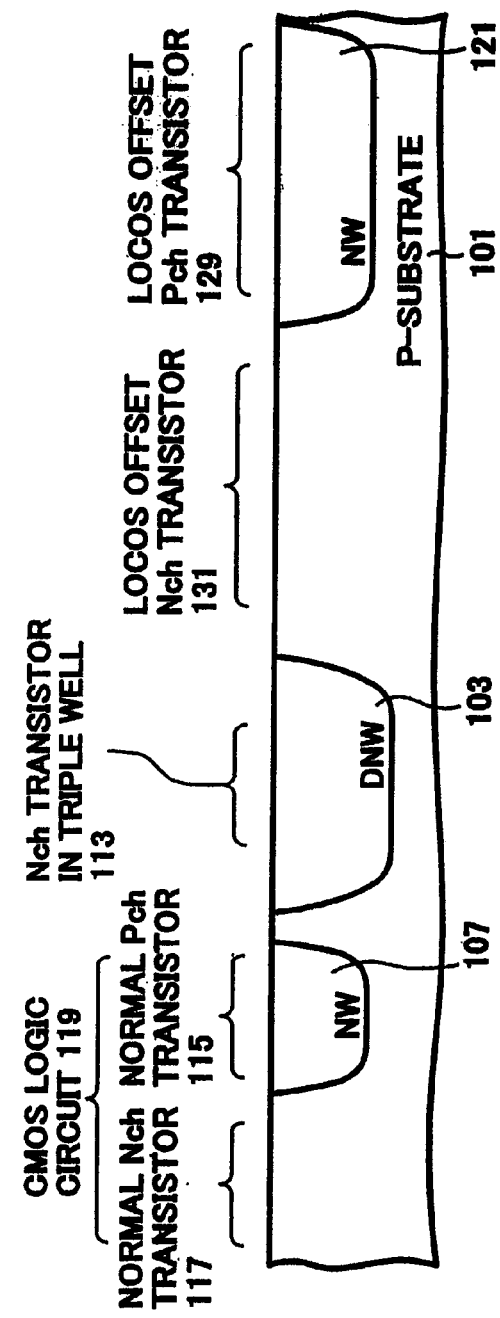
FIG. 29A (PRIOR ART)
FIG. 29B (PRIOR ART)

US 7,208,359 B2

METHOD OF FORMING SEMICONDUCTOR INTEGRATED DEVICE

CROSS-REFERENCE TO RELATED APPLICATION

The present application is a continuation application of U.S. patent application Ser. No. 10/422,786, filed on Apr. 25, 2003 now U.S. Pat. No. 6,917,081, the disclosure of which is incorporated herein by reference in its entirety.

FIELD OF THE INVENTION

This patent specification relates generally to a semiconductor device and methods for fabricating such device, and more specifically to a semiconductor integrated device comprising a MOS transistor and LOCOS offset transistor which include a drain having a high concentration N-type diffusion layer surrounded by a low concentration N-type diffusion layer, and a gate electrode with one edge thereof formed on a thick oxide layer.

This document claims priority and contains subject matter related to Japanese Patent Application No. 2002-127407, filed with the Japanese Patent Office on Apr. 26, 2002, the entire contents of which are hereby incorporated by reference.

DISCUSSION OF THE BACKGROUND

Among numerous silicon transistor technologies, previous methods are known for forming, for example, a well of N-conductivity type in a semiconductor substrate of P-conductivity type, and another well of P-conductivity type is formed in the well of N-conductivity type. These portions are hereinafter referred to as N-well, P-substrate and P-well, respectively.

The thus formed structure, having a well incorporating therein a further well of the opposite conductivity type, is called a 'triple well' or 'double well', as the third well after the P-well and N-well.

In the triple well structure, the outer well is often called in general as a 'deep P-well' or 'deep N-well', and the inner well as a 'IP-well' or 'IN-well', which are herein adopted in the following description. It may be added that a P-well and an N-well alone included in the structure is called as a 'twin well'.

Also in the following description, the term 'normal P-well' is applied to the P-well for forming therein an N-channel MOS transistor (or insulated gate field-effect transistor) which is hereinafter referred to as Nch transistor, and the term 'normal N-well' to the N-well for forming therein a P-channel MOS transistor which is referred to as Pch transistor, hereinafter.

FIG. 22 is a cross-sectional view illustrating the well structure of a known semiconductor device including a triple well.

Referring to FIG. 22, a conventional triple well is formed by first forming a deep N-well (DNW) 103 in a P-substrate 101, and further forming an IP well (IPW) 105 in the deep N-well 103 in a manner electrically isolated from the deep N-well, a triple well is formed. Also formed in the substrate 101 are a normal N-well (NW) 107 and a normal P-well (PW) 109.

In addition, by forming further transistors in the wells of FIG. 22, a semiconductor device of FIG. 23 is formed.

Namely, a LOCOS oxide layer 111 is first formed on the surface of the P-substrate 101 by the LOCOS (local oxidation of silicon) method for isolating the deep N-well 103, normal N-well 107 and normal P-well 109 from each other.

In the region for forming the IP well 105, an Nch transistor 113 is then formed consisting of a source (N+) 113s, a drain (N+) 113d and a gate electrode 113g, in which the source 113s and drain 113d are each formed of high concentration N-type diffusion layers spatially separated from one another, and which the gate electrode 113g of a polysilicon layer is formed over the IP well 105 between the source 113s and drain 113d incorporating an underlying gate oxide layer 113ox.

In addition, a normal Pch transistor 115 is formed in the normal N-well 107 consisting of a source (P+) 115s, a drain (P+) 115d and a gate electrode 115g, in which the source 115s and drain 115d are each formed of P-type diffusion layers spatially separated from one another, and which the gate electrode 115g of a polysilicon layer is formed over the N-well 107 between the source 115s and drain 115d incorporating an underlying gate oxide layer 115ox.

Further, in the region for forming the P well 109, a normal Nch transistor 117 is formed consisting of a source (N+) 117s, a drain (N+) 117d and a gate electrode 117g, in which the source 117s and drain 117d are each formed of high concentration N-type diffusion layers spatially separated from one another, and which the gate electrode 117g of a polysilicon layer is formed over the P-well 109 between the source 117s and drain 117d incorporating an underlying gate oxide layer 117ox.

A CMOS (complementary MOS) logical circuit 119 is then formed with the thus formed Pch transistor 115 and Nch transistor 117.

The Nch transistor 113 of FIG. 23 is formed incorporating therein the above noted triple well structure, further including the CMOS logical circuit 119. It may be noted the triple well structure has been attracting much attention as will be described later on.

The inclusion of the triple well structure offers several advantages which follows:

(1) Since the IP well is electrically isolated from the P-substrate, voltage values applied to the IP well can arbitrarily be adjusted, whereby the degree of freedom in circuit design increases. This is in contrast to the conventional transistor structure, in which the voltage value applied to the IP well is limited to zero potential (GRD), since its IP well is generally connected to the substrate.

(2) Since even negative voltages can be applied to the IP well, negative voltages can be handled in the circuit and the incorporation of a negative voltage source becomes feasible.

(3) The deep N-well functions effectively to absorb noise components transmitted through the P-substrate. By forming a noise sensitive circuit such as, for example, an amplifier in the IP well, therefore, high precision circuits can be attained. In addition, the on-chip fabrication of DC/DC converter also becomes feasible, which has been practically impossible because of the noise problems.

(4) Since the deep N-well also functions effectively to absorb electrons generated in the vicinity thereof, data destruction such as soft error caused, for example, in DRAM (dynamic random access memory) can be prevented.

FIGS. 24A through 24E are each cross sectional views generally illustrating process sequence for fabricating the semiconductor device of FIG. 23.

Referring to FIGS. 23 through 24E, the fabrication process steps will be described herein below.

(1) By photolithographic techniques, a photoresist pattern is formed on a P-substrate 101 for defining the region for forming a deep N-well. Using the photoresist pattern as a mask for ion implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 10 hours in gaseous nitrogen atmosphere, whereby the deep N-well 103 is formed. The photoresist pattern is subsequently removed (FIG. 24A).

(2) Also by photolithographic techniques, a further photoresist pattern is formed on the P-substrate 101 for defining the region for forming an N-well. Using the photoresist pattern as a mask for implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 2 hours in gaseous nitrogen atmosphere, whereby the normal N-well 107 is formed. The photoresist pattern is subsequently removed (FIG. 24B).

(3) By photolithographic techniques, a photoresist pattern is formed also on the P-substrate 101 for defining the region for forming a normal P-well. Using the photoresist pattern as a mask for implantation, boron ions are implanted under the conditions of an acceleration energy of 30 keV and a dose of approximately $1 \times 10^{13}$ cm$^{-2}$. The implanted boron ions are then subjected to thermal diffusion at 1150° C. for 1 hour in gaseous nitrogen atmosphere, whereby the normal P-well 109 is formed. The photoresist pattern is subsequently removed (FIG. 24C).

(4) A photoresist pattern is formed also by photolithographic techniques on the P-substrate 101 for defining the region for forming an IP well having an opening on the portion of the deep N-well region. Using the photoresist pattern as a mask for ion implantation, boron ions are implanted under the conditions of an acceleration energy of 30 keV and a dose of approximately $3 \times 10^{13}$ cm$^{-2}$. The implanted boron ions are then subjected to thermal diffusion at 1150° C. for 1 hour in gaseous nitrogen-atmosphere, whereby the IP well 105 is formed in the deep N-well region. The photoresist pattern is subsequently removed (FIG. 24D).

(5) By the LOCOS method, a LOCOS oxide layer 111 for device isolation is formed on the P-substrate 101. This LOCOS oxide layer is formed by depositing a layer of silicon nitride to a thickness of 100 nm over the entire surface of the structure, carrying out photolithographic process steps for defining the device isolation region as an opening, and removing the silicon nitride layer by etching from the opening region. Thereafter, the thus prepared structure is subjected to wet oxidation steps at 1000° C. for 2 hours, whereby the LOCOS oxide layer 111 is formed in the opening region to a thickness of 500 nm (FIG. 24E).

Subsequently, by conventional transistor fabrication techniques, gate oxide layers 113ox, 115ox and 117ox, gate electrodes 113g, 115g and 117g, sources 113s, 115s and 117s, and drains 113d, 115d and 117d, are then formed respectively, whereby the structure shown in FIG. 23 is formed.

The above description on the triple well has been made rather briefly in general. Therefore, details of the process can be modified if necessary. In the process sequence, for example, the step for forming the normal N-well 107 may be interchanged with that of normal P-well 109, still arriving at the same final structure as FIG. 22.

As a further constituent for forming the present semiconductor device, a LOCOS offset transistor is adopted (for example, Japanese Laid-Open Patent Application No. 6-334129).

Like the aforementioned triple well structure, the LOCOS offset transistor has also been quite noticeable recently, as one of dispensable components for forming high voltage devices for its suitable high withstand voltage characteristics.

In a similar manner to conventional CMOS transistors, there are two types of LOCOS offset transistor, Nch and Pch, and they are typically shown in FIG. 25.

In the P-substrate, an N-well (NW) 121 and a P-well are formed in the regions for forming a LOCOS offset Pch transistor 131 and a LOCOS offset Nch transistor 123, respectively. The N-well (NW) 121 and a P-well (PW) 123 are separated from one another by a LOCOS oxide layer 111.

There formed in the N-well 121 are a source (P+) 129s of high concentration P-type diffusion layer and a low concentration P-type diffusion layer (P−) 125 of a concentration lower than the high concentration P-type diffusion layer, being spatially separated from one another.

A drain (P+) 129d is formed of a high concentration P-type diffusion layer having a concentration higher than the low concentration P-type diffusion layer 125, in the low concentration P-type diffusion layer 125 and spatially separated from the edge portion of the low concentration P-type diffusion layer 125 on the side of the source 129s.

A drain of the LOCOS offset Pch transistor 129 is thus formed of the low concentration P-type diffusion layer 125 and drain 129d.

In addition, a LOCOS oxide layer 111a is formed on the surface of P-type diffusion layer 125 partially overlapped with the drain 129d and spatially separated from the edge portion of low concentration P-type diffusion layer 125 toward the source 129s. The LOCOS oxide layer 111a is herein formed simultaneously with the LOCOS oxide layer 111 at the same stage of forming process.

A gate electrode 129g of a polysilicon layer is formed on the thus prepared structure, extending from the edge portion of the source 129s on the side of the LOCOS oxide layer 111a through the upper face portion of LOCOS oxide layer 111a by way of the upper face portion of the N-well 121 between the source 129s and low concentration P-type diffusion layer 125.

The gate electrode 129g is provided over the source 129s, N-well 121 and low concentration P-type diffusion layer 125 incorporating an underlying gate oxide layer 129ox.

There formed in the N-well 123 are a source (N+) 131s of high concentration P-type diffusion layer and a low concentration N-type diffusion layer (NW) 127 of a concentration lower than the high concentration N-type diffusion layer, being spatially separated from one another.

A drain (N+) 131d is formed of a high concentration N-type diffusion layer having a concentration higher than the low concentration N-type diffusion layer 127, in the low concentration N-type diffusion layer 127 and spatially separated from the edge portion of the low concentration N-type diffusion layer 127 toward the source 131s.

A drain of the LOCOS offset Nch transistor 131 is thus formed of the drain 131d and low concentration N-type diffusion layer 127.

In addition, a LOCOS oxide layer 111b is formed on the surface of N-type diffusion layer 127 partially overlapped with the drain 131d and spatially separated from the edge portion of low concentration N-type diffusion layer 127 toward the source 131s. The LOCOS oxide layer 111b is herein formed simultaneously with the LOCOS oxide layers, 111 and 111*a*, at the same stage of forming process.

A gate electrode 131*g* of a polysilicon layer is formed on the thus prepared structure, extending from the edge portion of the source 131*s* on the side of the LOCOS oxide layer 111*b* through the upper face portion of LOCOS oxide layer 111*b* by way of the upper face portion of the P-well 123 between the source 131*s* and low concentration N-type diffusion layer 127.

The gate electrode 131*g* is provided over the source 131*s*, P-well 123 and low concentration N-type diffusion layer 127 incorporating an underlying gate oxide layer 131*ox*.

The structural characteristics of the LOCOS offset transistors are summarized in the following two points.

(1) The drain accompanies the surrounding low concentration N-type diffusion layer. That is, referring to FIG. 25, the drain 129*d* is surrounded by the low concentration P-type diffusion layer 125 in the LOCOS offset Pch transistor 129, and the drain 131*d* is surrounded by the low concentration N-type diffusion layer 127 in the LOCOS offset Nch transistor 131.

(2) The gate electrode climbs over the LOCOS oxide layer on the side of the drain. That is, referring again to FIG. 25, the gate electrode 129*g* is formed, in the LOCOS offset Pch transistor 129, extending from the portion partially overlying the edge of the source 129*s* on the side of the LOCOS oxide layer 111*a* to the upper face portion of LOCOS oxide layer 111*a*; and the gate electrode 131*g* is formed, in the LOCOS offset Nch transistor 131, extending from the portion partially overlying the edge of the source 131*s* on the side of the LOCOS oxide layer 111*b* to the upper face portion of LOCOS oxide layer 111*b*.

Owning to the above noted structural characteristics, the LOCOS offset transistors can achieve high withstand voltage capabilities, which detailed herein below in reference to FIG. 26.

FIG. 26 is a cross sectional view illustrating the LOCOS offset Nch transistor and a normal Nch transistor. As mentioned earlier, by the normal transistor is meant one neither the LOCOS offset transistor nor the transistor formed in either IP well or IN well.

Since the LOCOS offset Nch transistor and Nch transistor have each the same structure as the offset transistor 131 of FIG. 25 and the Nch transistor 117 of FIG. 23, respectively, the detailed description on their structure is herein abbreviated. In addition, while the conductivity type is herein assumed to be N-type, a similar description can be made on P-type devices, as well.

When the drain 117*d* in the LOCOS offset Nch transistor 117 is examined closely, the withstand voltage thereof is determined by the avalanche breakdown voltage of the PN junction between the normal P-well 109 and drain 117*d*. Since the drain 117*d* has a high impurity concentration and is directly in contact with the normal P-well 109 in the present case, its withstand voltage is obtained ranging from 10 to 15 V.

In contrast, the drain 131*d* in the LOCOS offset Nch transistor 131 is surrounded by the low concentration N-type diffusion layer 127, and the high concentration drain 131*d* is not in direct contact with the P-well 123. As a result, the avalanche breakdown voltage of the PN junction between the drain 131*d* and N-type diffusion layer 127 increases ranging from 30 to 40 V.

On the other hand, it is known, when the gate electrode is fixed at the GND potential, the withstand voltage of the PN junction directly under a gate electrode decreases, which is called the gate modulated withstand voltage.

As a result, when the gate electrode 117*g* is at the GND potential, the portion in the vicinity of the drain 117*d*, which is shown an encircled portion in FIG. 26, is subjected to the breakdown at a voltage as low as approximately 10 V.

In the LOCOS offset Nch transistor 131, in contrast, the LOCOS oxide layer 111*b* is formed under the gate electrode 131*g* on the side of the drain 131*d*, and accordingly the distance between the edge portion of the gate electrode 131*g* on the side of the drain 131*d* and the portion of PN junction formed between the P-well 123 and low concentration N-type diffusion layer 127 is increased.

As a result, the gate modulated withstand voltage for the drain 131*d* is increased ranging from 30 to 40 V.

Summarizing the above results, this increase in the withstand voltage in LOCOS offset Pch transistor is therefore achieved by the structural characteristics mentioned earlier, that is, (1) the drain surrounded by the low concentration N-type diffusion layer, and (2) the gate electrode climbing over the LOCOS oxide layer on the side of the drain.

FIGS. 27A through 27D are each cross sectional views generally illustrating process sequence for fabricating the semiconductor device of FIG. 25.

Referring to FIGS. 25 through 27D, the fabrication process steps will be described herein below.

(1) By photolithographic techniques, a photoresist pattern is formed on a P-substrate 101 for defining the region for forming an N-well. Using the photoresist pattern as a mask for ion implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 2 hours in gaseous nitrogen atmosphere, whereby the N-well 121 is formed. The photoresist pattern is subsequently removed.

Also by photolithographic techniques, another photoresist pattern is formed on the P-substrate 101 for defining the region for forming a P-well. Using the photoresist pattern as a mask for implantation, boron ions are implanted under the conditions of an acceleration energy of 30 keV and a dose of approximately $1 \times 10^{13}$ cm$^{-2}$. The implanted boron ions are then subjected to thermal diffusion at 1150° C. for 1 hour in gaseous nitrogen atmosphere, whereby the P-well 123 is formed. The photoresist pattern is subsequently removed (FIG. 27A).

(2) A photoresist pattern is formed also by photolithographic techniques on the P-substrate 101 for defining the region for forming a low concentration N-type diffusion layer having an opening on the portion of the P-well region. Using the photoresist pattern as a mask for ion implantation, phosphorus ions are implanted under the conditions of an acceleration energy of 100 keV and a dose of approximately $2 \times 10^{13}$ cm$^{-2}$. The photoresist pattern is subsequently removed.

Another photoresist pattern is formed also by photolithographic techniques on the P-substrate 101 for defining the region for forming a low concentration P-type diffusion layer having an opening on the portion of the N-well region. Using the photoresist pattern as a mask for ion implantation, boron ions are implanted under the conditions of an acceleration energy of 100 keV and a dose of approximately $5 \times 10^{13}$ cm$^{-2}$.

The boron ions implanted into N-well 121 and phosphorus ions implanted into the P-well 123 are then subjected to thermal diffusion at 1000° C. for 20 minutes in gaseous nitrogen atmosphere, whereby the low concentration N-type diffusion layer 127 and low concentration P-type diffusion layer 125 are formed in the P-well 123 and N-well 121, respectively. Thereafter, the photoresist pattern for defining the low concentration P-type diffusion layer is removed (FIG. 27B).

It is noted in this context that photolithographic process steps for each the low concentration N-type diffusion layer 127 and the low concentration P-type diffusion layer are separately required.

(3) By the LOCOS method, the LOCOS oxide layers 111, 111a and 111b are formed on the P-substrate 101 simultaneously. These LOCOS oxide layers are formed by first carrying out photolithographic process steps for defining the regions for forming LOCOS oxide layers, and subsequently subjecting these regions to wet oxidation steps at 1000° C. for 2 hours. The LOCOS oxide layers 111 are herein formed on respective device isolation regions, while the LOCOS oxide layers, 111a and 11b are formed on the surface of the low concentration P-type diffusion layer 125 and N-type diffusion layer 127, respectively (FIG. 27C).

(4) A layer of silicon oxide for forming gate oxide layers is formed on the surface of the structure on the P-substrate 101 to a thickness of 30 nm. Thereafter, a layer of polysilicon is deposited to a thickness of 300 nm on the entire surface of the P-substrate 101 at 600° C. by the low pressure CVD (chemical vapor deposition) method. After doping the polysilicon layer with phosphorus ions to reduce its resistively, a photoresist pattern is formed for defining gate electrodes by photolithographic techniques. Using the photoresist pattern as a mask, patterning steps of the polysilicon layer are carried out by anisotropic plasma etching techniques in gaseous hydrogen bromide, whereby gate electrodes 129g and 131g are formed (FIG. 27D). It may be is noted the layers of silicon oxide formed during the above process steps other than the gate oxide layers 129ox and 131ox are excluded in FIG. 27D for reasons of clarity.

(5) By implanting either boron ions or $BF_3$ into the N-well 121 and low concentration P-type diffusion layer 125 using the ion implantation techniques, a P-type source 129s and drain 131d are formed. Also, by implanting either phosphorus or arsenic ions into the P-well 123 and low concentration N-type diffusion layer 127, an N-type source 131s and drain 131d are formed. A LOCOS offset Pch transistor 129 and LOCOS offset Nch transistor 131 are thereby formed, respectively (FIG. 25).

The process steps were described herein above on the triple well and the LOCOS offset transistor in reference to FIGS. 23 through 24E and FIGS. 25 through 27D, respectively.

These devices are quite different from one another in function and operation, and have been fabricated separately on each individual chip. The trend of fabrication has changed recently, however, with increasing demands toward higher device capabilities, higher degree of integration, and the reduction in chip area, among others.

Namely, there has given rise to the demand for forming both triple well and LOCOS offset transistor on the same chip. This is typically exemplified by the formation on a single chip of both a negative voltage source with the triple well structure and a high withstand voltage circuit with the LOCOS offset transistor.

FIG. 28 is a cross-sectional view illustrating a known semiconductor device including a triple well, LOCOS offset transistor and CMOS logic circuit.

Referring to FIG. 28, there formed in a P-substrate 101 are a deep N-well 103, normal N-well 107 and P-well 123, being isolated from each other by LOCOS oxide layer 111. In addition, an IP well 105 is formed in the deep N-well 103.

Also formed are an Nch transistor 113 in the IP well 105, a normal Pch transistor 115 in the normal N-well 107, and normal Nch transistor 117 in the P well 109. The Nch transistor 113, normal Pch transistor 115 and normal Nch transistor 117 each have the same structure as shown in FIG. 23.

Additionally formed are a LOCOS offset Pch transistor 129 in the N-well 121 and LOCOS offset Nch transistor 131 in the P-well 123. The LOCOS offset Pch transistor 129 and LOCOS offset Nch transistor 131 each have the same structure as shown in FIG. 25.

Furthermore, the fabrication steps for the present semiconductor device are described as the combination of the steps for forming the triple well described earlier in reference to FIGS. 23 through 24E, and ones for forming the LOCOS offset Pch transistor described in reference to FIGS. 25 through 27D.

Furthermore, the fabrication steps for the present semiconductor device are described as the combination of the steps for forming the triple well described earlier in reference to FIGS. 23 through 24E, and ones for forming the LOCOS offset Pch transistor described in reference to FIGS. 25 through 27D.

FIGS. 29A through 29G are each cross sectional views generally illustrating process sequence for fabricating the semiconductor device of FIG. 28.

Referring to FIGS. 28 through 29G, the fabrication process steps will be described herein below.

(1) By photolithographic techniques, a photoresist pattern is formed on a P-substrate 101 for defining the region for forming a deep N-well 103. Using the photoresist pattern as a mask for ion implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 10 hours in gaseous nitrogen atmosphere, whereby the deep N-well 103 is formed in the region for forming Nch transistor 113. The photoresist pattern is subsequently removed (FIG. 29A).

(2) Also by photolithographic techniques, another photoresist pattern is formed on the P-substrate 101 for defining a normal N-well 107 and N-well 121. Using the photoresist pattern as a mask for ion implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 2 hours in gaseous nitrogen atmosphere, whereby the normal N-well 107 and N-well 121 are formed in the regions for forming a LOCOS offset Pch transistor 115 and a LOCOS offset Nch transistor 131, respectively. The photoresist pattern is subsequently removed (FIG. 29B).

(3) Still another photoresist pattern is formed also by photolithographic techniques on the P-substrate 101 for defining the regions for forming a normal P-well 109 and P-well 125. Using the photoresist pattern as a mask for implantation, boron ions are implanted under the conditions of an acceleration energy of 30 keV and a dose of approximately $1 \times 10^{13}$ cm$^{-2}$. The implanted boron ions are then subjected to thermal diffusion at 1150° C. for 1 hour in gaseous nitrogen atmosphere, whereby the normal P-well 109 and P-well 125 are formed in the regions for forming a normal Nch transistor 117 and the LOCOS offset Nch transistor 131, respectively. The photoresist pattern is subsequently removed (FIG. 29C).

(4) A photoresist pattern is formed also by photolithographic techniques on the P-substrate 101 for defining the region for forming an IP well having an opening on the portion of the region of the deep N-well 103. Using the photoresist pattern as a mask for ion implantation, boron ions are implanted under the conditions of an acceleration energy of 30 keV and a dose of approximately $3 \times 10^{13}$ cm$^{-2}$. The implanted boron ions are then subjected to thermal diffusion at 1150° C. for 1 hour in gaseous nitrogen atmosphere, whereby the IP well 105 is formed in the deep N-well 103. The photoresist pattern is subsequently removed (FIG. 29D).

(5) A photoresist pattern is formed by photolithographic techniques on the P-substrate 101 for defining the region for forming a low concentration N-type diffusion layer 127 having an opening on the portion of the region of the P-well 125. Using the photoresist pattern as a mask for ion implantation, phosphorus ions are implanted under the conditions of an acceleration energy of 100 keV and a dose of approximately $3 \times 10^{13}$ cm$^{-2}$.

Another photoresist pattern is formed by photolithographic techniques on the P-substrate 101 for defining the region for forming a low concentration P-type diffusion layer 123 having an opening on the portion of the region of the N-well 121. Using the photoresist pattern as a mask for ion implantation, boron ions are implanted under the conditions of an acceleration energy of 100 keV and a dose of approximately $3 \times 10^{13}$ cm$^{-2}$.

The boron ions implanted into N-well 121 and phosphorus ions implanted into the P-well 125 are then subjected to thermal diffusion at 1000° C. for 20 minutes in gaseous nitrogen atmosphere, whereby the low concentration P-type diffusion layer 123 and low concentration N-type diffusion layer 127 are formed in the N-well 121 and P-well 125, respectively. Thereafter, the photoresist pattern for defining the low concentration P-type diffusion layer 123 is removed (FIG. 29E).

Therefore, for forming the low concentration P-type diffusion layer 123 and low concentration N-type diffusion layer 127, there required are two photolithographic steps, the one for defining the region for forming the low concentration P-type diffusion layer 123 and the other for defining the region for forming the low concentration N-type diffusion layer 127; and additional two ion implantation steps.

(6) By the LOCOS method, the LOCOS oxide layers 111, 111a and 111b are formed on the P-substrate 101 simultaneously. These LOCOS oxide layers are formed by first carrying out photolithographic process steps for defining the LOCOS oxide layers including ones for device isolation, and subsequently subjecting these layers to wet oxidation steps at 1150° C. for 2 hours. The LOCOS oxide layers 111 are herein formed on respective device isolation regions, while the LOCOS oxide layers, 111a and 111b, are formed on the surfaces of low concentration P-type diffusion layer 123 and N-type diffusion layer 127, respectively (FIG. 29E).

(7) Thereafter, gate oxide layers 113ox, 115ox, 117ox, 129ox and 131ox are each formed on the P-substrate 101 to a thickness of 30 nm. Subsequently, a layer of polysilicon is deposited to a thickness of 300 nm on the entire surface of the P-substrate 101 at 600° C. by the low pressure CVD (chemical vapor deposition) method. After doping the polysilicon layer with phosphorus ions to reduce its resistivity, a photoresist pattern is formed for defining gate electrodes by photolithographic techniques. Using the photoresist pattern as a mask, patterning steps of the polysilicon layer are carried out by anisotropic plasma etching techniques in gaseous hydrogen bromide, whereby gate electrodes 113g, 115g, 117g, 129g and 131g are formed (FIG. 29G).

It may be noted the layers of silicon oxide formed during the above process steps other than the gate oxide layers 113ox, 115ox, 117ox, 129ox and 131ox are excluded in FIG. 29G for reasons of clarity.

(8) By implanting either phosphorus or arsenic ions into the IP-well 109, 125 and low concentration N-type diffusion layer 127, N-type sources 113s, 117s and 131s, and drains 113d, 117d and 131d are formed. Also, by implanting either boron ions or BF$_3$ into the N-well 121, normal N-well 107 and low concentration P-type diffusion layer 123 using the ion implantation techniques, P-type sources 115s and 129s, and drains 115d and 129d are formed. A LOCOS offset Pch transistor 129 and LOCOS offset Nch transistor 131 are thereby formed, respectively (FIG. 25).

As a result, the Nch transistor 113 in the triple well, the Pch transistor 115 and Nch transistor 117 for constituting a CMOS logic 119, the LOCOS offset Pch transistor 129, and LOCOS offset Nch transistor 131, are able to simultaneously be formed respectively (FIG. 28).

For forming the triple well and LOCOS offset Nch transistors simultaneously, therefore, a relatively large number of photolithographic process have been required previously.

On taking count of the photolithographic steps described herein above in reference to FIGS. 29A through 29G, these required steps are the first photolithography process step for forming the deep N-well 103; the second step for forming the N-well 121, the deep N-well 103; the third step for forming the P-well 125; the fourth step for forming the IP well 105; the fifth step for forming the low concentration N-type diffusion layer 127; the sixth step for forming the low concentration P-type diffusion layer 123; the seventh step for forming the LOCOS oxide layers 111, 111a and 111b; the eighth step for forming the gate electrodes 113g, 129g and 131g; the ninth step for forming the N-type sources 113s and 131s, and N-type drains 113d and 131d; and the tenth step for forming the P-type source 129s and P-type drain 129d, whereby the count needed is found as large as ten for photolithography process steps.

It is well known that the number of photolithographic process steps have direct effects on production costs, and it is desirable, therefore, the number is decreased as much as possible. In addition, since the product cycle is becoming shorter every year, and further reduced periods for product development are required accordingly, demands for the number of the steps are increasing from these aspects, as well.

Particularly in the present case where both triple well and LOCOS offset transistor are formed simultaneously, the number of the steps is relatively large, and the reduction in the number of the process steps is of considerable importance.

Although a disclosure is found concerning the simultaneous formation of a triple well and LOCOS offset transistor (Japanese Laid-Open Patent Application No. 2000-286346), no clear statement is found on the increase in production costs and periods caused by increased number of photolithographic process steps.

In addition, another increase in the number of the steps has been encountered previously. Namely, when the LOCOS offset Pch transistor and LOCOS offset Nch transistor are formed simultaneously, extra steps are needed for forming the P-type and N-type low concentration layers (123 and 127 in FIG. 28) to surround the P-type and N-type drain, respectively, compared with the case of forming the Pch and Nch transistors. This causes the increase in the number of the steps, to thereby result in a drawback such as the increase in production costs and periods.

SUMMARY

Accordingly, it is an object of the present disclosure to provide a semiconductor device incorporating LOCOS offset transistors, preferably fabricated by photolithographic and other process steps with reduced number of the steps, for suitable use in high withstand voltage device applications, and the methods for fabricating such devices, having most, if not all, of the advantages and features of similar employed device and methods, while eliminating many of their disadvantages.

The following description is a synopsis of selected features and attributes of the present disclosure. A more complete description thereof is found below in the section entitled "Description of the Preferred Embodiments"

A semiconductor device is provided comprising an offset Nch transistor and a normal N-well each formed in a P-substrate.

The former includes an N-type source, an N-type drain and a gate electrode, the N-type source and N-type drain each being formed spatially separated from one another in a P-well formed in the P-substrate, at least the drain having a high concentration N-type diffusion layer surrounded by a low concentration N-type diffusion layer of the concentration lower than the high concentration N-type diffusion layer, one edge of the gate electrode toward the drain being formed on a thick oxide layer; and the latter, normal N-well, is formed in the P-substrate to be used for forming therein a Pch MOS transistor; in which the low concentration N-type diffusion layer and normal N-well are formed simultaneously.

Since the offset Nch transistor and normal N-well are both provided on the same P-substrate, and the low concentration N-type diffusion layer included in offset Nch transistor and normal N-well are formed simultaneously at the same stage of process, photolithography process steps required for defining merely the portion of the low concentration N-type diffusion layer can be eliminated, whereby the number of required lithography process steps can be reduced.

According to another aspect disclosed herein as a second embodiment, another semiconductor device is provided comprising an offset Nch transistor and a normal N-well each formed in a P-substrate.

The former includes an N-type source, an N-type drain and a gate electrode, the N-type source and N-type drain each being formed spatially separated from one another, the source being formed in a P-well, the drain being formed adjacent to the P-well, at least the drain having a high concentration N-type diffusion layer surrounded by a low concentration N-type diffusion layer of the concentration lower than the high concentration N-type diffusion layer, one edge of the gate electrode toward the drain being formed on a thick oxide layer; and the latter, normal N-well, is formed in the P-type semiconductor substrate to be used for forming therein a Pch MOS transistor, in which the low concentration N-type diffusion layer and normal N-well are formed simultaneously.

Since the offset Nch transistor and normal N-well are both provided on the same P-substrate, and the low concentration N-type diffusion layer included in offset Nch transistor and normal N-well are formed simultaneously at the same stage of process, photolithography process steps required for defining merely the portion of the low concentration N-type diffusion layer can be eliminated, whereby the number of required lithography process steps can be reduced.

In addition, the P-well is formed during impurity doping steps using a thermal oxide layer, which is formed selectively on the surface of regions for forming the low concentration N-type diffusion layer and normal N-well, as a mask for doping impurities, in which the thermal oxide layer is formed previously using another mask for defining regions for forming the low concentration N-type diffusion layer and normal N-well.

As a result, photolithography process steps required for defining merely the portion of P-well can be eliminated, whereby the number of required lithography process steps can be reduced further.

Still in addition, the low concentration N-type diffusion layer and normal N-well are formed during impurity doping steps using a thermal oxide layer, which is formed selectively on the surface of the region for forming the P-well, as a mask for doping impurities, in which the thermal oxide layer is formed previously using another mask for defining the region for forming P-well.

As a result, photolithography process steps required for defining merely the portions of the low concentration N-type diffusion layer and normal N-well can be eliminated, whereby the number of required lithography process steps can be reduced further.

Although advantages of the present disclosure are not repeated one by one in the following description, improvements and concomitant advantages similar to those noted above will be offered by respective embodiments, which follow.

According to still another aspect disclosed herein as a third embodiment, a semiconductor device is provided comprising an offset Nch transistor and a triple well each formed in a P-substrate.

The former includes an N-type source, N-type drain and gate electrode, the N-type source and N-type drain each being formed spatially separated from one another, the source being formed in a P-well, the drain being formed adjacent to the P-well, at least the drain having a high concentration N-type diffusion layer surrounded by a low concentration N-type diffusion layer of the concentration lower than the high concentration N-type diffusion layer, one edge of the gate electrode toward the drain being formed on a thick oxide layer; and the latter, triple well, is formed in the P-substrate having a deep N-well and P-type IP well formed therein, in which the low concentration N-type diffusion layer and deep N-well are formed simultaneously at the same stage of process.

In addition, the P-well is formed during impurity doping steps using a thermal oxide layer, which is formed selectively on the surface of the regions for forming the low concentration N-type diffusion layer and deep N-well, as a mask for doping impurities, and the thermal oxide layer was previously formed using another mask for defining the regions for forming the low concentration N-type diffusion layer and deep N-well.

Still in addition, the low concentration N-type diffusion layer and deep N-well are formed during impurity doping steps using a thermal oxide layer, which is formed selectively on the surface of the region for forming the P-well, as a mask for doping impurities, and the thermal oxide layer was formed previously using another mask for defining the region for forming the P-well.

According to another aspect disclosed herein as a fourth embodiment, a semiconductor device is provided comprising an offset Pch transistor and a triple well each formed in a P-substrate.

The former includes a P-type source, a P-type drain and a gate electrode, the P-type source and P-type drain each being formed spatially separated from one another in an N-well formed in the P-substrate, at least the drain having a high concentration P-type diffusion layer surrounded by a low concentration P-type diffusion layer of the concentration lower than the high concentration P-type diffusion layer, one edge of the gate electrode toward the drain being formed on a thick oxide layer; and the latter, triple well, is formed in the P-substrate having a deep N-well and a P-type IP well formed therein, in which the low concentration P-type diffusion layer and IP well are formed simultaneously at the same stage of process, and which the N-well and deep N-well are formed simultaneously.

In addition, the semiconductor device further includes a normal N-well formed in the P-substrate to be used for forming therein a Pch MOS transistor, in which the N-well and normal N-well are formed simultaneously at a same stage of process.

According to another aspect disclosed herein as a fifth embodiment, a semiconductor device is provided comprising an offset Pch transistor and normal P-well each formed in a P-substrate.

The former includes a P-type source, a P-type drain and a gate electrode, the P-type source and P-type drain each being formed spatially separated from one another in an N-well formed in the P-substrate, at least the drain having a high concentration P-type diffusion layer surrounded by a low concentration P-type diffusion layer of the concentration lower than the high concentration P-type diffusion layer, one edge of the gate electrode toward the drain being formed on a thick oxide layer; and the latter, normal P-well, is formed in the P-substrate to be used for forming therein an Nch MOS transistor; in which the low concentration P-type diffusion layer and normal P-well are formed simultaneously at a same stage of process.

In addition, the semiconductor device further includes a triple well formed in the P-substrate having a deep N-well and a P-type IP well formed therein, in which the N-well and deep N-well are formed simultaneously at the same stage of process.

Still in addition, the semiconductor device further includes a normal N-well formed in the P-substrate to be used for forming therein a Pch MOS transistor, in which the N-well and normal N-well are formed simultaneously at a same stage of process.

According to another aspect disclosed herein as a sixth embodiment, a semiconductor device is provided comprising
(1) the offset Nch transistor and normal N-well, described earlier in the first embodiment, in which the low concentration N-type diffusion layer included in the offset Nch transistor and the normal N-well are formed simultaneously, and
(2) the offset Pch transistor and triple well, described earlier in the fourth embodiment, in which the P-well included in the offset Pch transistor and the normal P-well are formed simultaneously.

In the semiconductor device, in addition, the low concentration N-type diffusion layer, N-well and normal N-well are formed simultaneously.

According to another aspect disclosed herein as a seventh embodiment, a semiconductor device is provided comprising
(1) the offset Nch transistor and normal N-well, described earlier in the second embodiment, in which the low concentration N-type diffusion layer included in the offset Nch transistor and the normal N-well are formed simultaneously, and
(2) the an offset Pch transistor and normal P-well, described earlier in the fifth embodiment, in which the low concentration P-type diffusion layer included in the offset Pch transistor and the normal P-well are formed simultaneously.

In the semiconductor device, in addition, the low concentration N-type diffusion layer, N-well and normal N-well are formed simultaneously. Furthermore, the low concentration P-type diffusion layer, P-well and normal P-well are formed simultaneously.

According to another aspect disclosed herein as an eighth embodiment, a semiconductor device is provided comprising
(1) the offset Nch transistor and normal N-well, described earlier in the second embodiment, in which the low concentration N-type diffusion layer included in the offset Nch transistor and the normal N-well are formed simultaneously, and
(2) the offset Pch transistor, triple well and normal P-well for forming the Pch MOS transistor therein, described earlier in the fourth embodiment, in which the low concentration P-type diffusion layer included in the offset Pch transistor and the IP-well are formed simultaneously.

In the semiconductor device, in addition, the low concentration N-type diffusion layer, N-well and normal N-well are formed simultaneously. Furthermore, the P-well and normal P-well are formed simultaneously.

It is added throughout the embodiments that the thick oxide layer is preferably a LOCOS oxide layer, and that the semiconductor devices can be fabricated by adopting respective portions and elements each having the conductivity type opposite to that indicated herein above.

The present disclosure, features, and advantages thereof will be more readily apparent from the following detailed description and appended claims when taken with drawings.

BRIEF DESCRIPTION OF THE DRAWINGS

FIGS. 2A through 2F are each cross-sectional views illustrating process sequence for fabricating the semiconductor device of FIG. 1;

FIGS. 11A through 11H are each cross-sectional views illustrating process sequence for fabricating the semiconductor device of FIG. 10;

FIGS. 29A through 29G are each cross sectional views generally illustrating process sequence for fabricating the semiconductor device of FIG. 28.

DESCRIPTION OF THE PREFERRED EMBODIMENTS

In the detailed description which follows, specific examples of a semiconductor device incorporating a MOS transistor, and LOCOS offset transistor which include a drain having a high concentration N-type diffusion layer surrounded by a low concentration N-type diffusion layer, and a gate electrode with one edge thereof formed on a thick oxide layer.

It is understood, however, that the present disclosure is not limited to these embodiments, and it is appreciated that the device and the method disclosed herein may also be adaptable to any form of semiconductor devices. Other embodiments will be apparent to those skilled in the art upon reading the following description.

Figure 1:
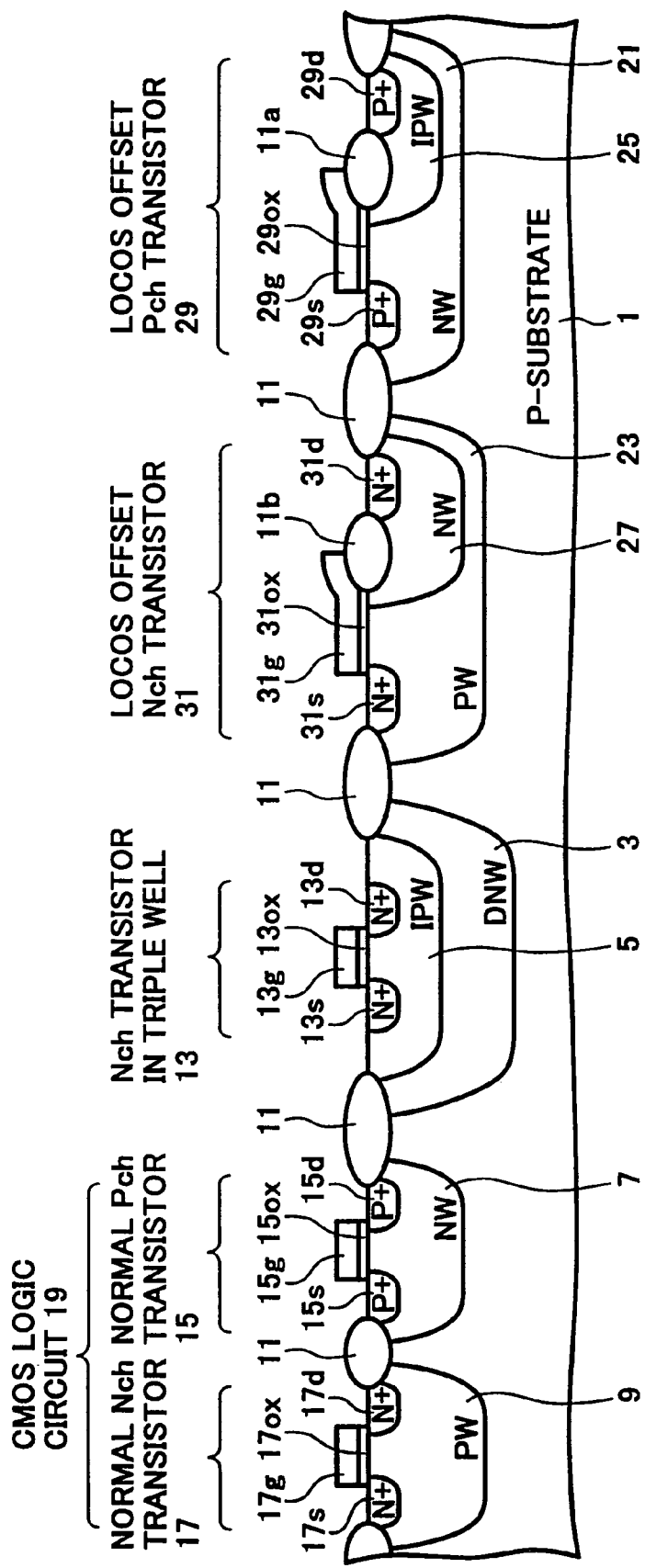
FIG. 1 is a cross-sectional view illustrating a semiconductor device according to a first example disclosed herein.

FIG. 1 is a cross-sectional view illustrating a semiconductor device according to a first example disclosed herein.

The present semiconductor device is formed in conformity with the sixth embodiment mentioned earlier in the summary section including several components such as offset Nch transistor, offset Pch transistor, normal N-well, normal P-well and triple well. The semiconductor device, therefore, consists of the components mentioned in the first embodiment (including the offset Nch transistor and normal N-well) and fourth embodiment (including the offset Pch transistor and triple well).

Referring to FIG. 1, a deep N-well (DNW) 3 is formed in a P-substrate 1. By further forming an IP well (IPW) 5 in the deep N-well 3 in a manner electrically isolated from the deep N-well, a triple well is formed.

Also formed in the substrate 1 are a normal N-well (NW) 7, normal P-well (PW) 9, N-well (NW) 21 and P-well (PW) 23. In addition, a LOCOS oxide layer 11 is formed on the substrate 1 by the LOCOS (local oxidation of silicon) method for isolating the deep N-well (DNW) 3, normal N-well (NW) 7, normal P-well (PW) 9, N-well (NW) 21 and P-well (PW) 23, from each other.

In the region for forming the IP well (IPW) 5, an Nch transistor 13 is formed consisting of a source (N+) 13s, a drain (N+) 13d and a gate electrode 13g, in which the source 13s and drain 13d are each formed of high concentration N-type diffusion layers spatially separated from one another, and which the gate electrode 13g of a polysilicon layer is formed over the IP well 5 between the source 13s and drain 13d incorporating an underlying gate oxide layer 13ox.

In addition, a normal Pch transistor 15 is formed in the normal N-well 7 consisting of a source (P+) 15s, a drain (P+) 15d and a gate electrode 15g, in which the source 15s and drain 15d are each formed of P-type diffusion layers spatially separated from one another, and which the gate electrode 15g of a polysilicon layer is formed over the N-well 7 between the source 15s and drain 15d incorporating an underlying gate oxide layer 15ox.

Further, in the region for forming the P well 9, a normal Nch transistor 17 is formed consisting of a source (N+) 17s, a drain (N+) 17d and a gate electrode 17g, in which the source 17s and drain 17d are each formed of high concentration N-type diffusion layers spatially separated from one another, and which the gate electrode 17g of a polysilicon layer is formed over the P-well 9 between the source 17s and drain 17d incorporating an underlying gate oxide layer 17ox.

A CMOS (complementary MOS) logical circuit 19 is then formed with the thus formed Pch transistor 15 and Nch transistor 17.

There formed in the N-well 21 are a source (P+) 29s of high concentration P-type diffusion layer and a low concentration P-type diffusion layer (IPW) 25 of a concentration lower than the high concentration P-type diffusion layer, being spatially separated from one another.

A drain (P+) 29d is formed of a high concentration P-type diffusion layer having a concentration higher than the low concentration P-type diffusion layer 25, in the low concentration P-type diffusion layer 25 and spatially separated from the edge portion of the low concentration P-type diffusion layer 25 toward the source 29s.

A drain of the LOCOS offset Pch transistor 29 is thus formed of the low concentration P-type diffusion layer 25 and drain 29d.

In addition, a LOCOS oxide layer 11a is formed on the surface of P-type diffusion layer 25 partially overlapped with the drain 29d and spatially separated from the edge portion of low concentration P-type diffusion layer 25 toward the source 29s. The LOCOS oxide layer 11a is herein formed simultaneously with the LOCOS oxide layer 11 at the same stage of forming process.

A gate electrode 29g of a polysilicon layer is formed on the thus prepared structure, extending from the edge portion of the source 29s on the side of the LOCOS oxide layer 11a through the upper face portion of LOCOS oxide layer 11a by way of the upper face portion of the N-well 21 between the source 29s and low concentration P-type diffusion layer 25.

The gate electrode 29g is provided over the source 29s, N-well 21 and low concentration P-type diffusion layer 25 incorporating an underlying gate oxide layer 29ox. Further, the gate electrode 29g is herein formed for the edge portion thereof toward the drain 29d to climb over the LOCOS oxide 11a, to thereby be spatially separated from drain 29d.

There formed in the N-well 23 are a source (N+) 31s of high concentration P-type diffusion layer and a low concentration N-type diffusion layer (NW) 27 of a concentration lower than the high concentration N-type diffusion layer, being spatially separated from one another.

A drain (N+) 31d is formed of a high concentration N-type diffusion layer having a concentration higher than the low concentration N-type diffusion layer 27, in the low concentration N-type diffusion layer 27 and spatially separated from the edge portion of the low concentration N-type diffusion layer 27 toward the source 31s.

A drain of the LOCOS offset Nch transistor 31 is thus formed of the drain 31d and low concentration N-type diffusion layer 27.

In addition, a LOCOS oxide layer 11b is formed on the surface of N-type diffusion layer 27 partially overlapped with the drain 31d and spatially separated from the edge portion of low concentration N-type diffusion layer 27 toward the source 31s. The LOCOS oxide layer 11b is herein formed simultaneously with the LOCOS oxide layers, 11 and 11a, at the same stage of forming process.

A gate electrode 31g of a polysilicon layer is formed on the thus prepared structure, extending from the edge portion of the source 31s on the side of the LOCOS oxide layer 11b through the upper face portion of LOCOS oxide layer 11b by way of the upper face portion of the P-well 23 between the source 31s and low concentration N-type diffusion layer 27.

The gate electrode 31g is provided over the source 31s, P-well 23 and low concentration N-type diffusion layer 27 incorporating an underlying gate oxide layer 31ox. Further, the gate electrode 31g is herein formed for the edge portion thereof toward the drain 31d to climb over the LOCOS oxide 11b, to thereby be spatially separated from drain 31d.

In the present example, the normal N-well 7, N-well 21 and low concentration N-type diffusion layer 27 are formed simultaneously by the same process steps of the photolithography and impurity diffusion. Also formed simultaneously by other groups of the same process steps of the photolithography and impurity diffusion are the normal P-well 9 and P-well 23; and the IP well (IPW) 5 and low concentration P-type diffusion layer 25, respectively.

The fabrication process steps implemented in the present example are illustrated herein below in reference to FIGS. 1 through 2F.

FIGS. 2A through 2F are each cross sectional views illustrating process sequence for fabricating the semiconductor device of Example 1 (FIG. 1).

(1) By photolithographic techniques, a photoresist pattern is formed on a P-substrate 1 for defining the region for providing a deep N-well 3 in the triple well, which includes a region for forming therein an Nch transistor 13.

Figure 2A:
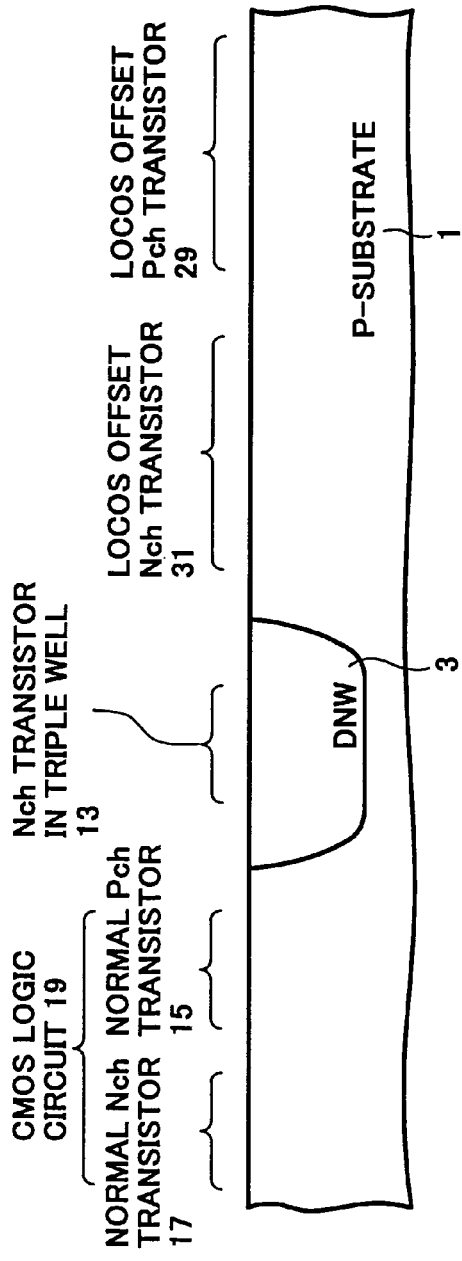

Using the photoresist pattern as a mask for ion implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 10 hours in gaseous nitrogen atmosphere, whereby the deep N-well 3 is formed. The photoresist pattern is subsequently removed (FIG. 2A).

(2) Also by photolithographic techniques, a photoresist pattern is formed on the P-substrate 1 for defining several regions such as one for providing the normal N-well 7, which includes a region for forming therein a Pch transistor 15; another for N-well 21, which includes a region for forming therein a LOCOS offset Pch transistor 29; and still another for a low concentration N-type diffusion layer 27, which includes a region for forming therein a LOCOS offset Nch transistor 31.

Figure 2B:
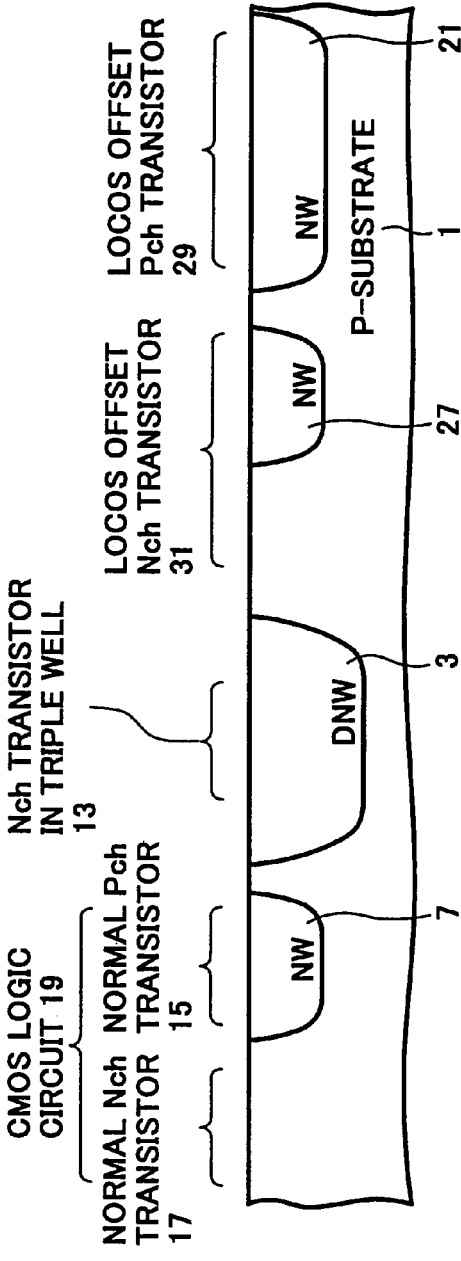

Using the photoresist pattern as a mask for ion implantation, phosphorus ions are implanted under the conditions of an acceleration energy of 160 keV and a dose of approximately $2 \times 10^{13}$ cm$^{-2}$. The implanted phosphorus ions are then subjected to thermal diffusion at 1150° C. for 2 hours in gaseous nitrogen atmosphere, whereby the normal N-well 7, N-well 21 and the low concentration N-type diffusion layer 27 are simultaneously formed. The photoresist pattern is subsequently removed (FIG. 2B).

(3) A photoresist pattern is formed also by photolithographic techniques on the P-substrate 1 for defining several regions such as one for providing the normal P-well 9, which includes a region for forming therein a normal Nch transistor 17; and another for P-well 23, which includes a region for forming therein a LOCOS offset Nch transistor 31.

Figure 2C:
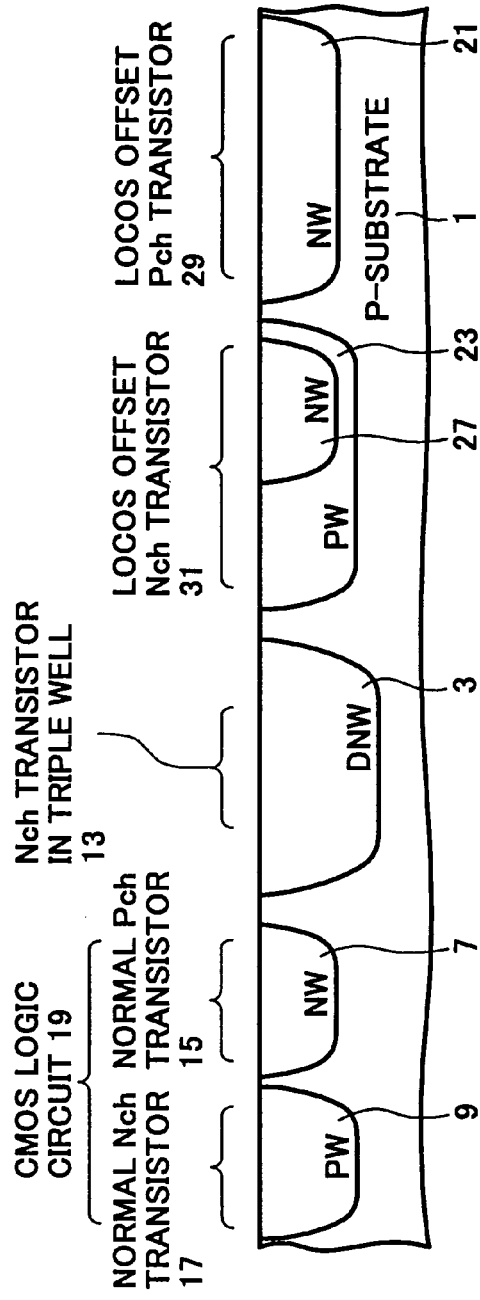

Using the photoresist pattern as a mask for ion implantation, boron ions are implanted under the conditions of an acceleration energy of 30 keV and a dose of approximately $1 \times 10^{13}$ cm$^{-2}$. The implanted boron ions are then subjected to thermal diffusion at 1150° C. for 1 hour in gaseous nitrogen atmosphere, whereby the normal P-well 9 and P-well 23 are simultaneously formed. The photoresist pattern is subsequently removed (FIG. 2C).

(4) A photoresist pattern is formed also by photolithographic techniques on the P-substrate 1 for defining several regions such as one for providing the IP well 5 in the triple well, which includes a region for forming therein an Nch transistor 13; and another for low concentration P-type diffusion layer 25, which includes a region for forming therein a LOCOS offset Pch transistor 29.

Figure 2D:
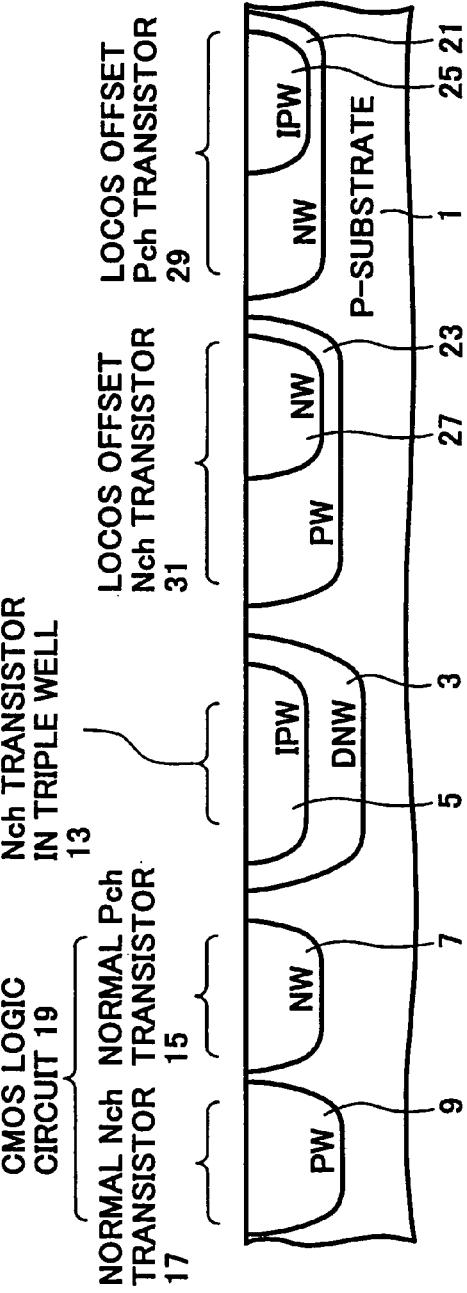

Using the photoresist pattern as a mask for ion implantation, boron ions are implanted under the conditions of an acceleration energy of 30 keV and a dose of approximately $3\times10^{13}$ cm$^{-2}$. The implanted boron ions are then subjected to thermal diffusion at 1150° C. for 1 hour in gaseous nitrogen atmosphere, whereby the IP well 5 and low concentration P-type diffusion layer 25 are simultaneously formed. The photoresist pattern is subsequently removed (FIG. 2D).

(5) By the LOCOS method, the LOCOS oxide layers 11, 11a and 11b are formed on the P-substrate 1 simultaneously at the same stage of forming process.

These LOCOS oxide layers are formed by first carrying out photolithographic process steps for defining the LOCOS oxide layers including ones for device isolation, and subsequently subjecting these layers to wet oxidation steps at 1150° C. for 2 hours.

Figure 2E:
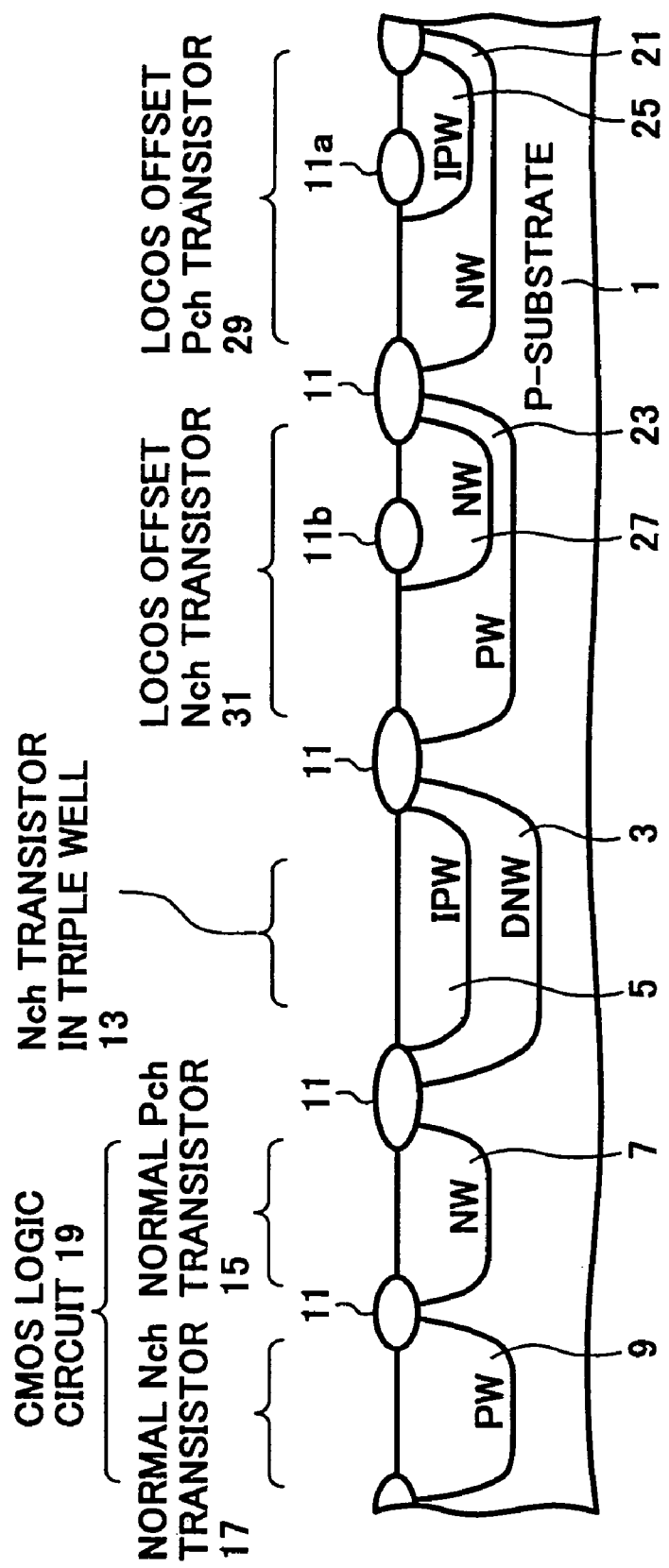

Also the LOCOS oxide layers 11 are herein formed on respective device isolation regions, while the LOCOS oxide layers, 11a and 11b, are formed on the surfaces of low concentration P-type diffusion layer 25 and N-type diffusion layer 27, respectively (FIG. 2E).

In addition, gate oxide layers 13ox, 15ox, 17ox, 29ox and 31ox are each formed on the P-substrate 1 to a thickness of 30 nm simultaneously at the same stage of forming process.

These gate oxide layers are formed by first depositing a layer of polysilicon to a thickness of 300 nm over the entire surface of the P-substrate 1 at 600° C. by the low pressure CVD method, doping the polysilicon layer with phosphorus ions to reduce its resistively, forming a photoresist pattern for defining the regions for providing the gate electrodes oxide layers by photolithographic techniques, and using the photoresist pattern as a mask, carrying out patterning steps of the polysilicon layer by anisotropic plasma etching techniques in gaseous hydrogen bromide. The gate electrodes 13g, 15g, 17g, 29g and 31g are thereby simultaneously formed (FIG. 2F).

In this context, it is noted the layers of silicon oxide formed during the above process steps other than the layers 13ox, 15ox, 17ox, 29ox and 31ox are excluded in FIG. 2F for reasons of clarity.

(7) By implanting either phosphorus or arsenic ions into the IP well 5, normal P-well 23 and low concentration N-type diffusion layer (NW) 27 using the techniques of photolithography and ion implantation, there formed simultaneously are source 13s and drain 13d of the Nch transistor 13 formed in triple well, source 17s and drain 17d of the normal Nch transistor 17, and source 31s and drain 31d of the LOCOS offset Nch transistor 31.

Furthermore, by implanting either boron ions or BF$_3$ into the normal N-well 7, N-well 21 and low concentration P-type diffusion layer 25 using the techniques of photolithography and ion implantation, there formed simultaneously are source 15s and drain 15d of the normal Pch transistor 15, and source 29s and drain 29d of the LOCOS offset Pch transistor 29.

As a result, the Nch transistor 13 in the triple well, the normal Pch transistor 15 and Nch transistor 17 for constituting a CMOS logic 19, the LOCOS offset Pch transistor 29, and LOCOS offset Nch transistor 31, are able to simultaneously be formed respectively in the same P-substrate 1 (FIG. 1).

On taking count of the photolithography process steps described herein above in reference to FIGS. 1 through 2F, it is found the count needed in the present example is as few as eight for photolithography process steps.

These steps are the first photolithography process step for forming the deep N-well 3; the second step for forming the normal N-well 7, N-well 21 and the low concentration N-type diffusion layer 27, the deep N-well 3; the third step for forming the normal P-well 9 and P-well 23; the fourth step for forming the IP well 5 and low concentration P-type diffusion layer 25; the fifth step for forming the LOCOS oxide layers 11, 11a and 11b; the sixth step for forming the gate electrodes 13g, 15g, 17g, 29g and 31g; the seventh step for forming the N-type sources 13s, 17s and 31s, and N-type drains 13d, 17d and 31d; and the eighth step for forming the P-type sources 15s and 29s, and P-type drains 15d and 29d.

As also shown in the present example in reference to FIG. 1, the low concentration N-type diffusion layer 27 of LOCOS offset Nch transistor 31 is formed simultaneously with the normal N-well 7 and N-well 21 (FIG. 2B) by the same photolithography and ion implantation steps.

Figure 29C:
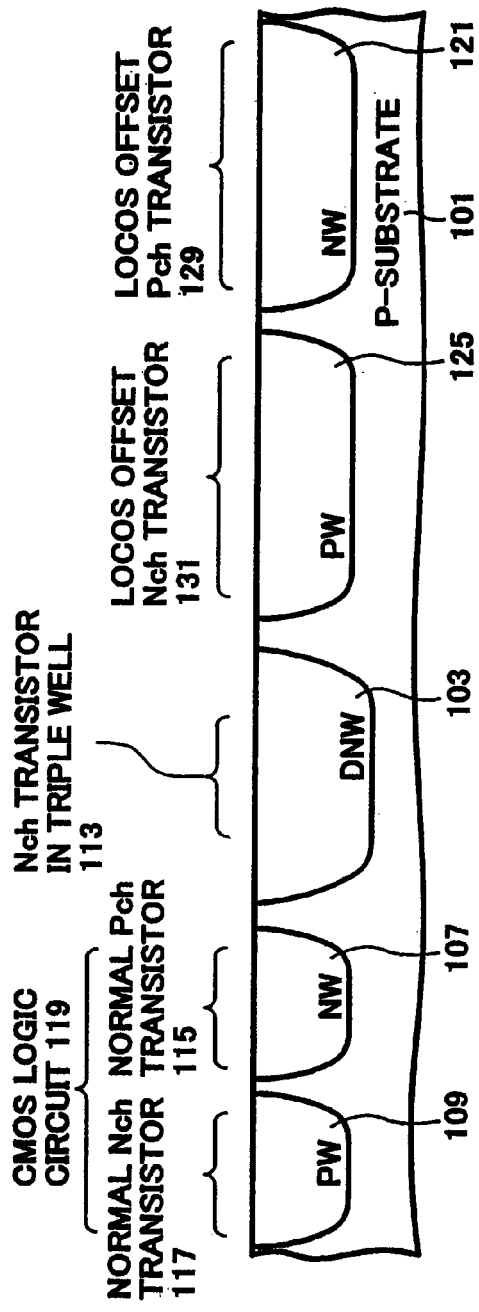
Figure 29D:
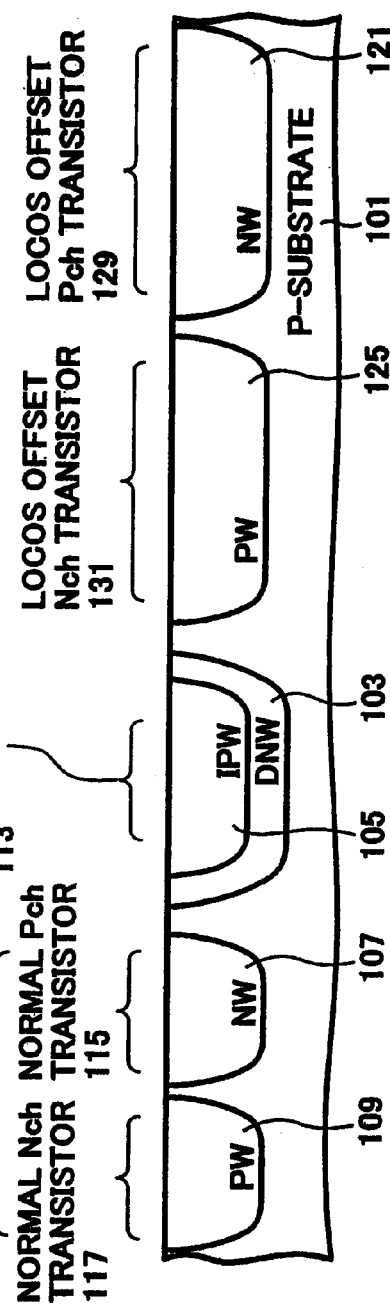
Figure 29E:
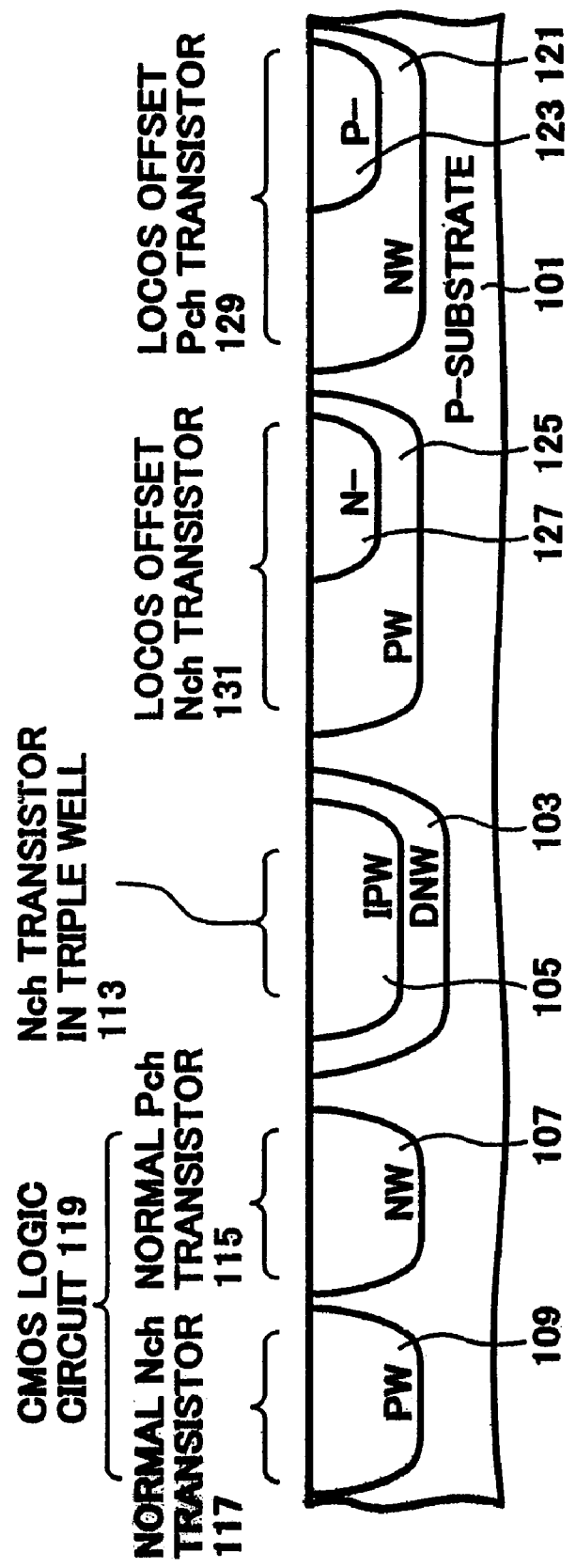
Figure 29F:
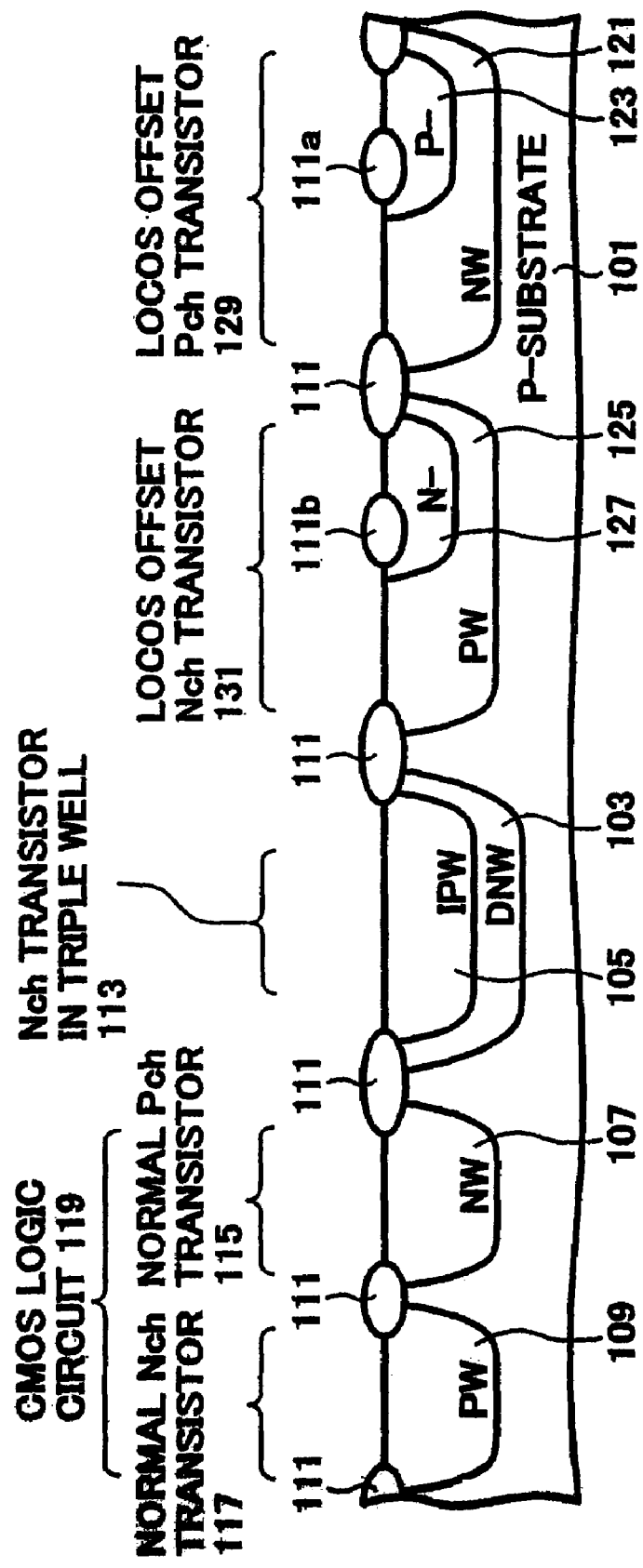
Figure 29G:
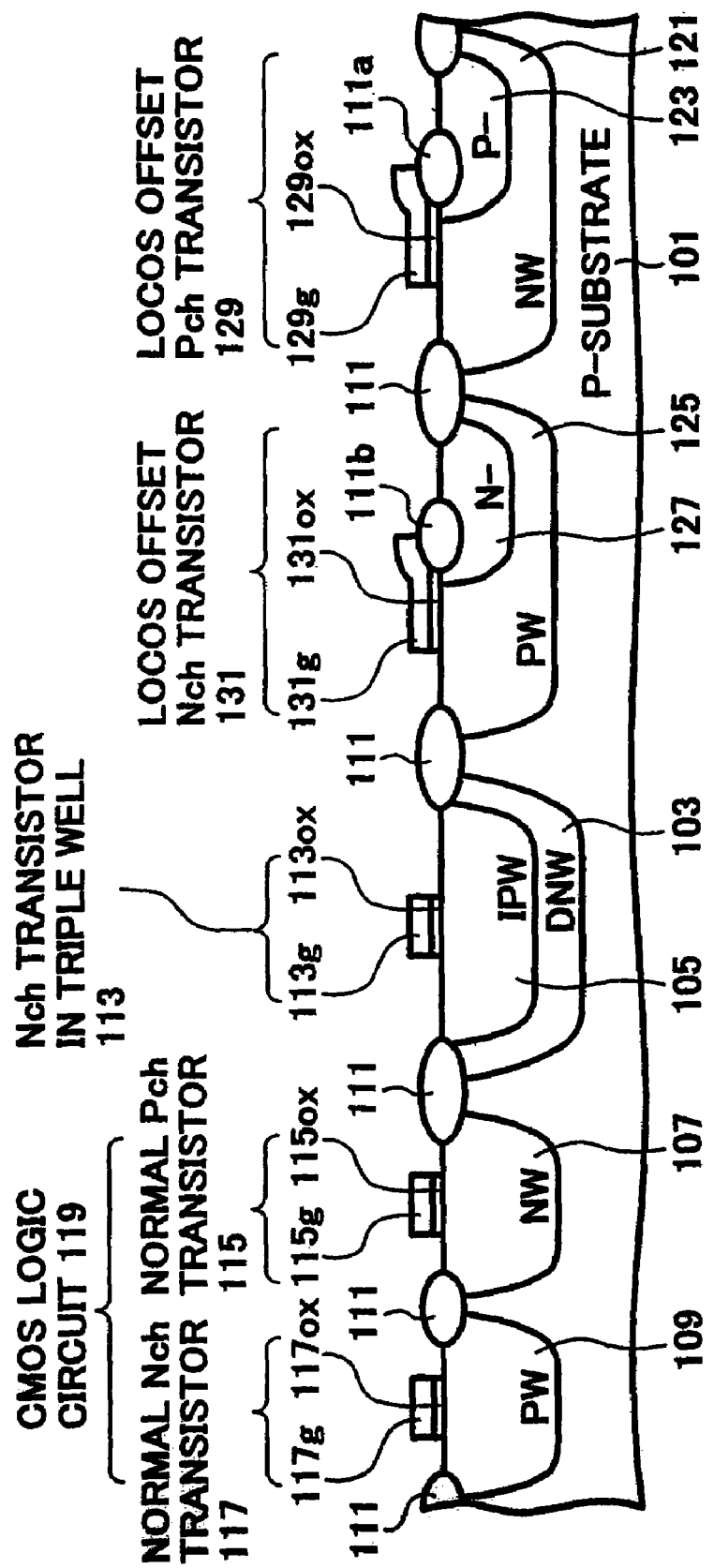

As a result, the photolithography and ion implantation steps required in previous fabrication methods (FIG. 29F) for forming merely the low concentration N-type diffusion layer 27 can be eliminated in the present method.

In addition, the low concentration P-type diffusion layer 25 of LOCOS offset Pch transistor 29 is formed simultaneously with the IP well 5 of the triple well (FIG. 2D) by the same photolithography and ion implantation steps.

As a result, the photolithography and ion implantation steps required in previous fabrication methods (FIG. 29F) for forming merely the low concentration P-type diffusion layer 25 can be eliminated in the present method.

Therefore, the present method disclosed herein is characterized specifically by forming the low concentration P-type diffusion layer for the drain of LOCOS offset Pch transistor is formed simultaneously with the IP well and other P-wells including the normal P-well by the same process steps, and the low concentration N-type diffusion layer for the drain of LOCOS offset Nch transistor is formed simultaneously with the deep N-well and other N-wells including the normal N-well by the same process steps.

Furthermore, in the present example, the P-well 23 in offset Nch transistor 31 is formed simultaneously with the normal P-well 9, and the N-well 21 in offset Pch transistor 29 is formed simultaneously with the normal N-well 7.

As a result, the photolithography process steps required for defining merely the portions of either the offset Nch transistor 31 or offset Pch transistor 29 can be eliminated, whereby the number of required lithography process steps can be reduced.

Figure 3:
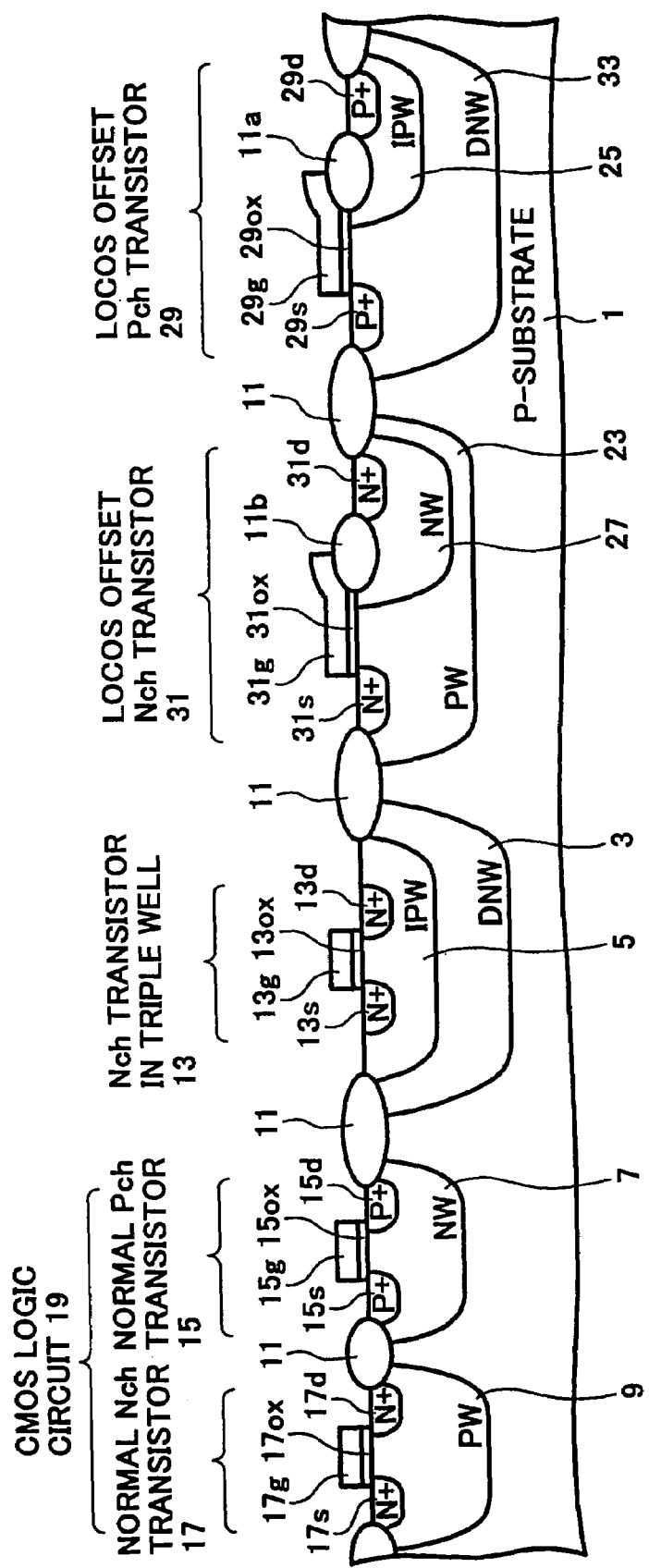
FIG. 3 is a cross-sectional view illustrating a semiconductor device according to a second example disclosed herein.

FIG. 3 is a cross-sectional view illustrating a semiconductor device according to a second example disclosed herein.

The present semiconductor device is formed in conformity with the seventh embodiment mentioned earlier in the summary section including several components such as offset Nch transistor, offset Pch transistor, normal N-well, normal P-well and triple well. This semiconductor device, therefore, consists of the components mentioned in the first embodiment (including the offset Nch transistor and normal N-well) and fourth embodiment (including the offset Pch transistor and triple well).

Like reference numerals in FIG. 3 designate identical or corresponding parts in FIG. 1 (Example 1), detailed description thereof is herein abbreviated.

In the region for forming a LOCOS offset Pch transistor 29, an N-well (DNW) 33 is formed in place of the N-well 21 (FIG. 1), in which the N-well is formed simultaneously with a deep N-well 3 formed at the same stage of process. Other portions illustrated in FIG. 3 are formed in a similar manner to those shown in FIG. 1.

In this second example, the low concentration N-type diffusion layer 27 in offset Nch transistor 31 is formed simultaneously with the normal N-well 7, and the P-well 23 is formed simultaneously with the normal P-well 9.

In addition, the low concentration P-type diffusion layer 25 in offset Pch transistor 29 is formed simultaneously with the IP well 5, and the N-well 3 simultaneously with the deep N-well 33.

As a result, the photolithography process steps required for defining merely the portions of either the offset Nch transistor 31 or offset Pch transistor 29 can be eliminated, whereby the number of required lithography process steps can be reduced.

Figure 4:
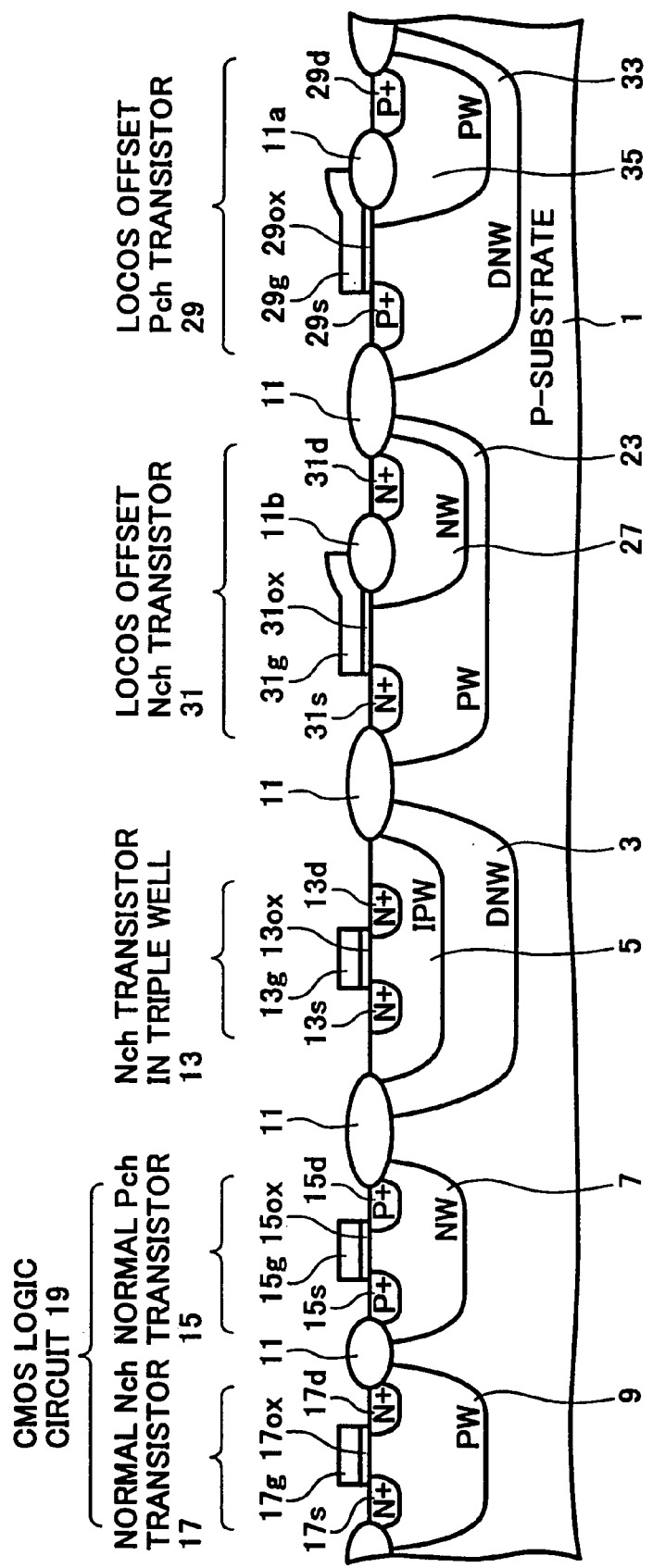
FIG. 4 is a cross-sectional view illustrating a semiconductor device according to a third example disclosed herein.

FIG. 4 is a cross-sectional view illustrating a semiconductor device according to a third example disclosed herein.

The present semiconductor device is formed in conformity with the eighth embodiment mentioned earlier including several components such as offset Nch transistor, offset Pch transistor, normal P-well, normal N-well and triple well. This semiconductor device, therefore, consists of the components mentioned in the first embodiment (including the offset Nch transistor and normal N-well) and fifth embodiment (including the offset Pch transistor and normal P-well).

Like reference numerals in FIG. 4 designate identical or corresponding parts in FIG. 3 (Example 2), detailed description thereof is herein abbreviated.

In a N-well 3 in the region for forming a LOCOS offset Pch transistor 29, a low concentration P-type diffusion layer (PW) 35 is formed in place of the low concentration P-type diffusion layer 25 (FIG. 3).

The low concentration. P-type diffusion layer 35 is formed simultaneously with a normal P-well 9 and P-well 23. Other portions illustrated in FIG. 4 are formed in a similar manner to those shown in FIG. 3.

In this third example, the low concentration N-type diffusion layer 27 in offset Nch transistor 31 is formed simultaneously with the normal N-well 7, and the P-well 23 is formed simultaneously with the normal P-well 9 and low concentration P-type diffusion layer 35.

In addition, the low concentration P-type diffusion layer 25 in offset Pch transistor 29 is formed simultaneously with the normal P-well 9 and P-well 23, and the N-well 33 simultaneously with the deep N-well 33.

As a result, the photolithography process steps required for defining merely the portions of either the offset Nch transistor 31 or offset Pch transistor 29 can be eliminated, whereby the number of required lithography process steps can be reduced.

Figure 5:
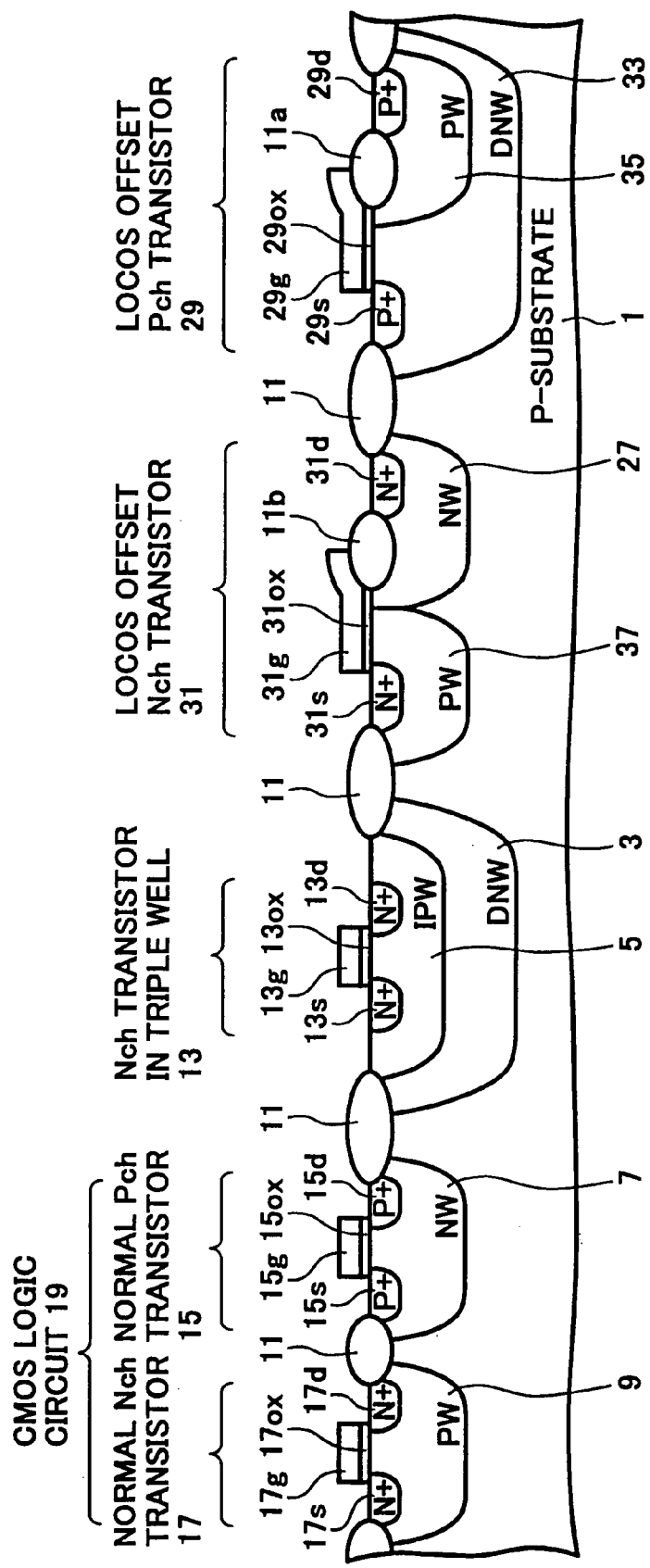
FIG. 5 is a cross-sectional view illustrating a semiconductor device according to a fourth example disclosed herein.

FIG. 5 is a cross-sectional view illustrating a semiconductor device according to a fourth example disclosed herein.

The present semiconductor device is formed in conformity with the ninth embodiment mentioned earlier including several components such as offset Nch transistor, offset Pch transistor, normal P-well, normal N-well and triple well. This semiconductor device, therefore, consists of the components mentioned in the second embodiment (including the offset Nch transistor and normal N-well) and fifth embodiment (including the offset Pch transistor and normal P-well).

Like reference numerals in FIG. 5 designate identical or corresponding parts in FIG. 3 (Example 3), detailed description thereof is herein abbreviated.

In the region for forming a LOCOS offset Nch transistor 31 in the P-type semiconductor substrate 1, a P-well (PW) 37 is formed in place of the P-well 23 (FIG. 4).

The P-well 37 is so formed as to surround the source 31s adjacent to low concentration N-type diffusion layer 27. In addition, the P-well 37 is formed simultaneously with a normal P-well 9 and low concentration P-type diffusion layer 35, and the low concentration N-type diffusion layer 27 is formed in the P-substrate 1. Other portions illustrated in FIG. 5 are formed in a similar manner to those shown in FIG. 4.

In this fourth example, the low concentration N-type diffusion layer 27 in offset Nch transistor 31 is formed simultaneously with the normal N-well 7, the P-well 37 simultaneously with the normal P-well 9 and low concentration P-type diffusion layer 35, the low concentration P-type diffusion layer 35 in offset Pch transistor 29 simultaneously with the normal P-well 9 and P-well 37, and the N-well 33 simultaneously with the deep N-well 3.

As a result, the photolithography process steps required for defining merely the portions of either the offset Nch transistor 31 or offset Pch transistor 29 can be eliminated, whereby the number of required lithography process steps can be reduced.

Figure 6:
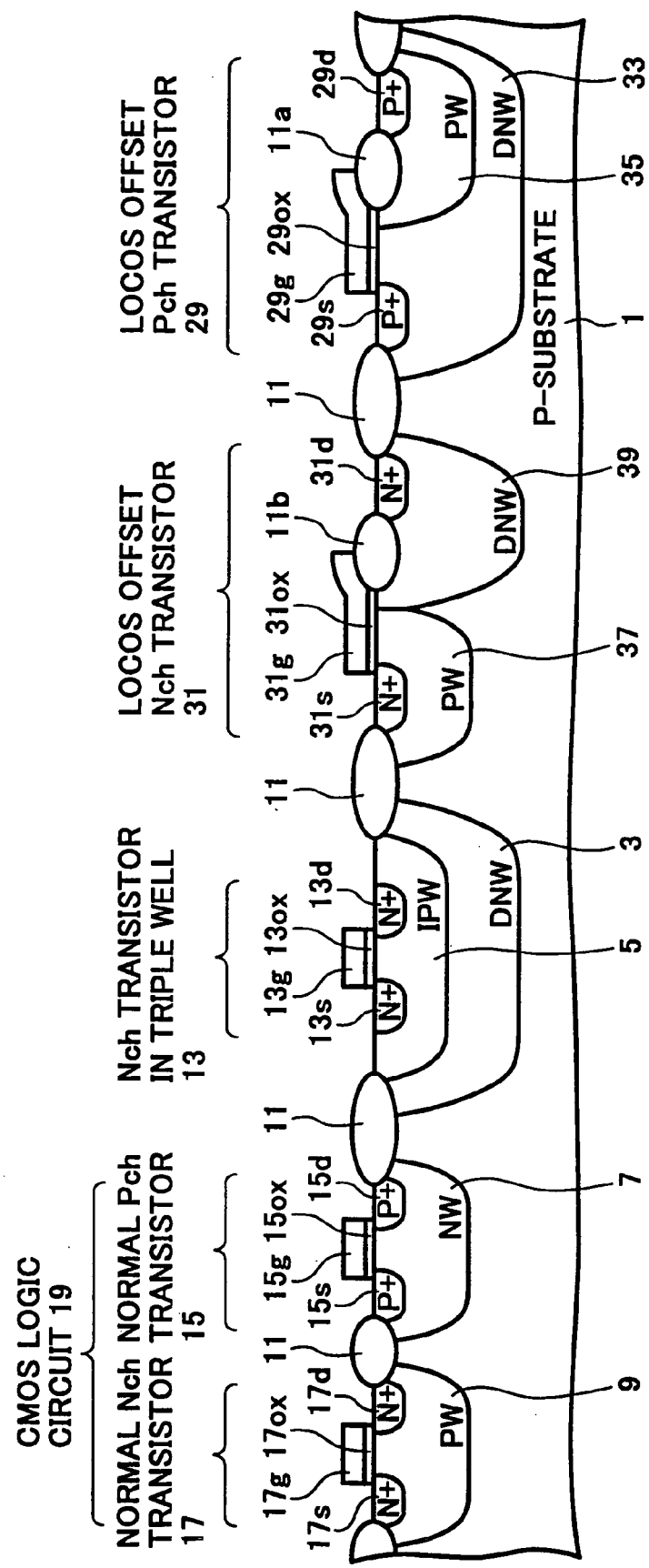
FIG. 6 is a cross-sectional view illustrating a semiconductor device according to a fifth example disclosed herein.

FIG. 6 is a cross-sectional view illustrating a semiconductor device according to a fifth example disclosed herein.

The present semiconductor device is formed in conformity with the tenth embodiment mentioned earlier including several components such as offset Nch transistor, offset Pch transistor, normal P-well, normal N-well and triple well. This semiconductor device, therefore, consists of the components mentioned in the third embodiment (including the offset Nch transistor and triple well) and fifth embodiment (including the offset Pch transistor and normal P-well).

Like reference numerals in FIG. 6 designate identical or corresponding parts in FIG. 5 (Example 4), detailed description thereof is herein abbreviated.

In the region for forming a LOCOS offset Nch transistor 31 in the P-substrate 1, a low concentration N-type diffusion layer (DNW) 39 is formed in place of low concentration N-type diffusion layer 27 (FIG. 5).

The low concentration N-type diffusion layer 39 is formed simultaneously with the deep N-well 3 and N-well 33. Other portions illustrated in FIG. 6 are formed in a similar manner to those shown in FIG. 5.

In this fifth example, the low concentration N-type diffusion layer 39 in offset Nch transistor 31 is formed simultaneously with the deep N-well 3 and N-well 33, the P-well 37 simultaneously with the normal P-well 9 and low concentration P-type diffusion layer 35, the low concentration P-type diffusion layer 35 in offset Pch transistor 29 simultaneously with the normal P-well 9 and P-well 37, and the N-well 33 simultaneously with the deep N-well 3 and low concentration N-type diffusion layer 39.

As a result, the photolithography process steps required for defining merely the portions of either the offset Nch transistor 31 or offset Pch transistor 29 can be eliminated, whereby the number of required lithography process steps can be reduced.

Figure 7:
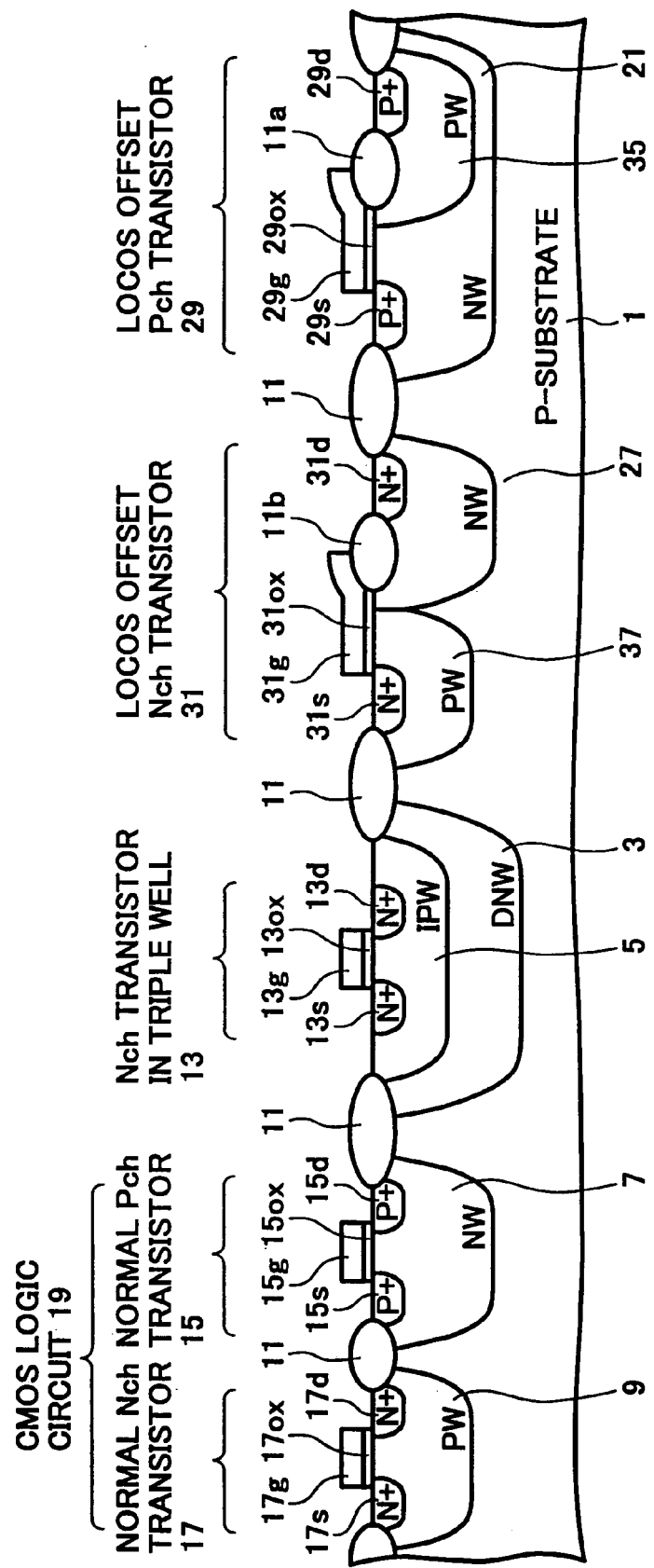
FIG. 7 is a cross-sectional view illustrating a semiconductor device according to a sixth example disclosed herein.

FIG. 7 is a cross-sectional view illustrating a semiconductor device according to a sixth example disclosed herein.

The present semiconductor device is formed in conformity with the eleventh embodiment mentioned earlier including several components such as offset Nch transistor, offset Pch transistor, normal P-well and normal N-well. This semiconductor device, therefore, consists of the components mentioned in the second embodiment (including the offset Nch transistor and triple well) and fifth embodiment (including the offset Pch transistor and normal P-well).

Like reference numerals in FIG. 7 designate identical or corresponding parts in FIGS. 1 and 5, detailed description thereof is herein abbreviated.

In the region for forming a LOCOS offset Pch transistor 29 in the P-substrate 1, an N-well (NW) 21 is formed in place of the N-well 33 (FIG. 5). The N-well 21 is formed simultaneously with a normal N-well 7 and low concentration N-type diffusion layer 27 at the same stage of process. Other portions illustrated in FIG. 7 are formed in a similar manner to those shown in FIG. 5.

In addition, the normal N-well 7, low concentration N-type diffusion layer 27 and N-well 21 are formed in the P-well substrate having a thickness larger than the normal P-well 9, low concentration P-type diffusion layer 35 and P-well 37 such that the low concentration P-type diffusion layer 35 is electrically isolated from the P-substrate in the LOCOS offset Pch transistor 29.

In this sixth example, the low concentration N-type diffusion layer 27 in offset Nch transistor 31 is formed simultaneously with the normal N-well 7 and N-well 21, the P-well 37 simultaneously with the normal P-well 9 and low concentration P-type diffusion layer 35, the low concentration P-type diffusion layer 35 in offset Pch transistor 29 simultaneously with the normal P-well 9 and P-well 37, and the N-well 21 simultaneously with the normal N-well 7 and low concentration N-type diffusion layer 27.

As a result, the photolithography process steps required for defining merely the portions of either the offset Nch transistor 31 or offset Pch transistor 29 can be eliminated, whereby the number of required lithography process steps can be reduced.

In addition, although the present sixth example as the eleventh embodiment disclosed herein is described as the semiconductor device including plural components such as the triple well consisting of the deep N-well 3 and IP well 5, and Nch transistor 13 formed in the triple well, this eleventh embodiment may alternatively be adapted to the semiconductor device without the triple well.

As the eleventh embodiment, for example, even without forming the deep N-well 3 and IP well 5 in the triple well simultaneously with the portions of either the offset Nch transistor 31 or offset Pch transistor 29 as illustrated in FIG. 7, it is feasible for the offset Nch transistor 31 and offset Pch transistor 29 to be formed without photolithography process steps for defining the portions of the offset Nch transistor 31 and offset Pch transistor 29.

Figure 8:
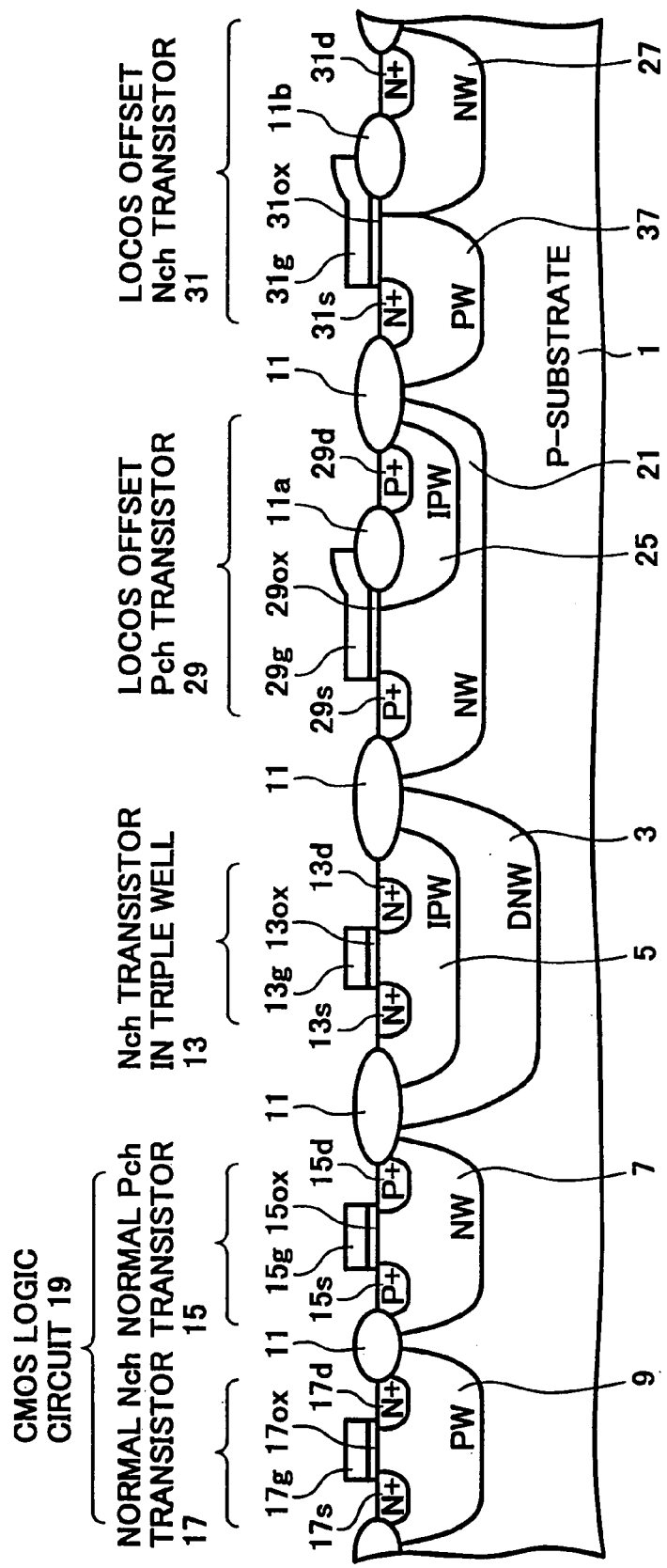
FIG. 8 is a cross-sectional view illustrating a semiconductor device according to a seventh example disclosed herein.

FIG. 8 is a cross-sectional view illustrating a semiconductor device according to a seventh example disclosed herein.

The present semiconductor device is formed in conformity with the twelfth embodiment mentioned earlier including several components such as offset Nch transistor, offset Pch transistor, normal P-well, normal N-well and triple well. This semiconductor device, therefore, consists of the components mentioned in the second embodiment (including the offset Nch transistor and normal N-well) and fourth embodiment (including the offset Pch transistor and triple well).

Like reference numerals in FIG. 8 designate identical or corresponding parts in FIGS. 1 and 5 (Example 4), detailed description thereof is herein abbreviated.

In the region for forming a LOCOS offset Nch transistor 31 in the P-substrate 1, a P-well (PW) 37 is formed in place of the P-well 23 (FIG. 1). The P-well 37 is so formed as to surround the source 31s adjacent to low concentration N-type diffusion layer 27. In addition, the P-well 37 is formed simultaneously with a normal P-well 9 at the same stage of process, and the low concentration N-type diffusion layer 27 is formed in the P-substrate 1. Other portions illustrated in FIG. 8 are formed in a similar manner to those shown in FIG. 1.

It may be noted herein concerning the P-well in the LOCOS offset Nch transistor 31. Since the P-substrate 1 is used, the P-well 37 which is formed adjacent to low concentration N-type diffusion layer 27, can be operative in almost similar manner electrically to the P-well 23 of FIG. 1, which is so formed as to surround the low concentration N-type diffusion layer 27.

In this seventh example, the low concentration N-type diffusion layer 27 in offset Nch transistor 31 is formed simultaneously with the normal N-well 7 and N-well 21, the P-well 37 simultaneously with the normal P-well 9, the low concentration P-type diffusion layer 25 in offset Pch transistor 29 simultaneously with the IP well 5, and the N-well 21 simultaneously with the normal N-well 7 and low concentration N-type diffusion layer 27.

As a result, the photolithography process steps required for defining merely the portions of either the offset Nch transistor 31 or offset Pch transistor 29 can be eliminated, whereby the number of required lithography process steps can be reduced.

Also in this seventh example, the P-well 37 and normal P-well 9 are formed during impurity doping steps preferably using a thermal oxide layer, formed selectively on the surface of the regions for defining the normal N-well 7, low concentration N-type diffusion layer 27 and deep N-well 3, as a mask for doping impurities.

The fabrication process steps implemented in the present example are illustrated herein below in reference to FIGS. 8 through 9H.

FIGS. 9A through 9H are cross sectional views illustrating process sequence for forming the semiconductor device of Example 7 (FIG. 8).

(1) A layer of silicon nitride is deposited on the surface area of a P-substrate 1. By photolithographic techniques, several openings are subsequently formed on the thus prepared silicon nitride layer at predetermined locations on the surface area, whereby a silicon nitride layer (mask) 41 is formed for defining the regions for forming the deep N-well 3 in the triple well.

Figure 9A:
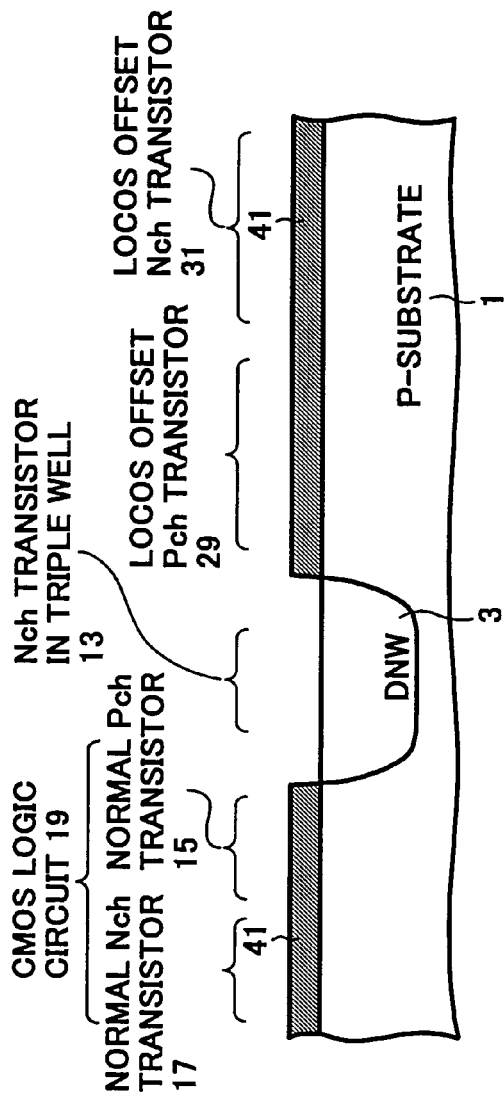
FIGS. 9A through 9H are each cross-sectional views illustrating process sequence for fabricating the semiconductor device of FIG. 8.

By ion implantation techniques using the silicon nitride layer 41 as a mask, phosphorus ions are implanted under the conditions of an acceleration energy of 160 keV and a dose of approximately $2 \times 10^{13}$ cm$^{-2}$ whereby the deep N-well 3 is formed (FIG. 9A).

(2) With the silicon nitride layer 41 retained, the structure is then subjected to wet oxidation steps at 1000° C. for 2 hours to thereby form a thermal oxide layer 43 to a thickness of approximately 200 nm on the surface of the deep N-well 3.

Figure 9B:
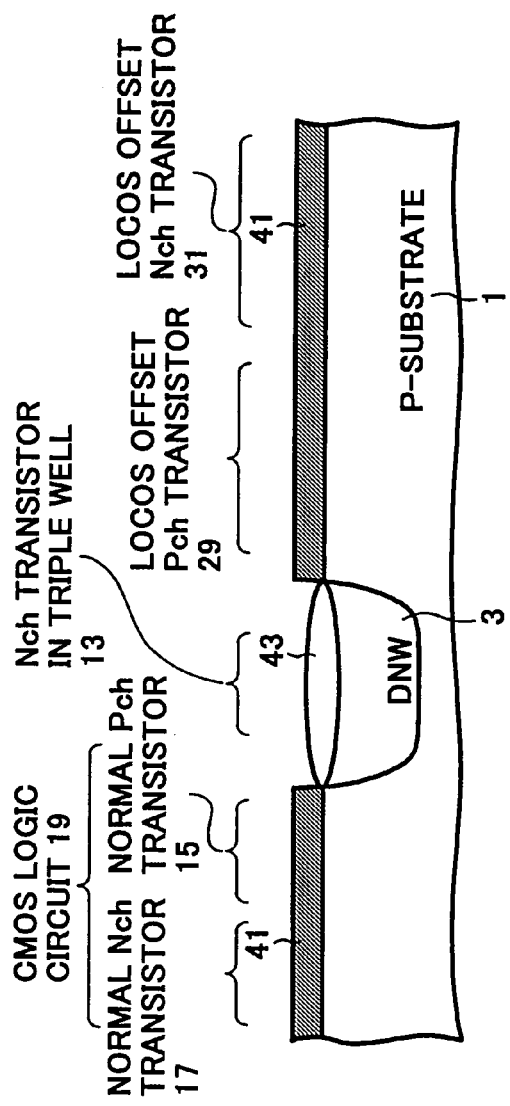

Thereafter, the layers are subjected to thermal treatment steps at 1150° C. for 10 hours in gaseous nitrogen atmosphere, whereby the phosphorus ions previously implanted in the deep N-well 3 are thermally diffused (FIG. 9B).

(3) Following the removal of the silicon nitride layer 41, another silicon nitride layer is deposited on the surface area of the P-substrate 1. By photolithographic techniques, this silicon nitride layer is subsequently provided with openings at predetermined locations on the surface area for defining a normal N-well 7, N-well 21 and low concentration N-type diffusion layer 27 and deep N-well 3, whereby another silicon nitride layer (mask) 45 is formed.

Figure 9C:
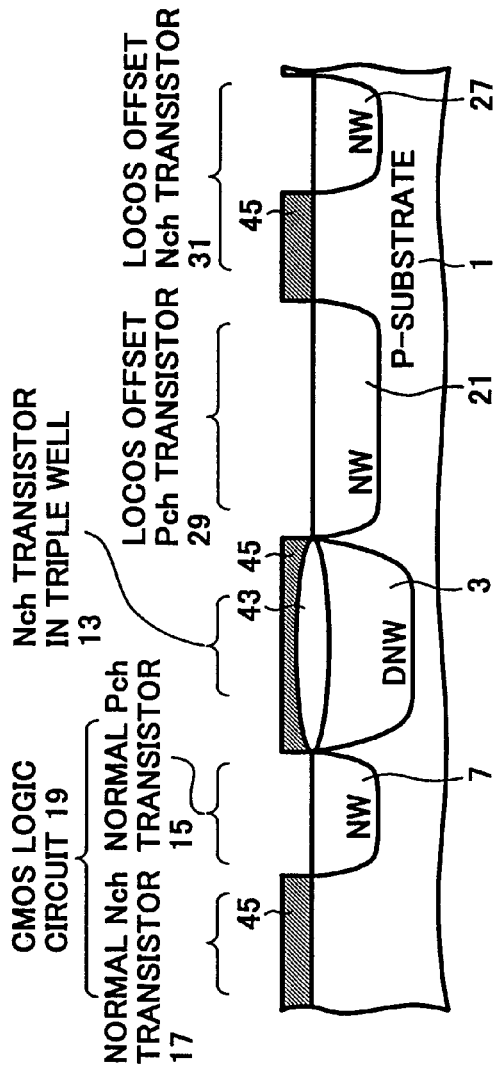

Also by ion implantation techniques using the silicon nitride layer 41 as a mask for ion implantation, phosphorus ions are implanted under the conditions of an acceleration energy of 160 keV and a dose of approximately $1 \times 10^{13}$ cm$^{-2}$ whereby the normal N-well 7, N-well 21 and low concentration N-type diffusion layer 27 are simultaneously formed (FIG. 9C).

(4) With the silicon nitride layer 45 retained, the structure is then subjected to wet oxidation steps at 1000° C. for 2 hours to thereby form a thermal oxide layer 47 to a thickness of approximately 200 nm on the surface of the normal N-well 7, N-well 21 and low concentration N-type diffusion layer 27.

Figure 9D:
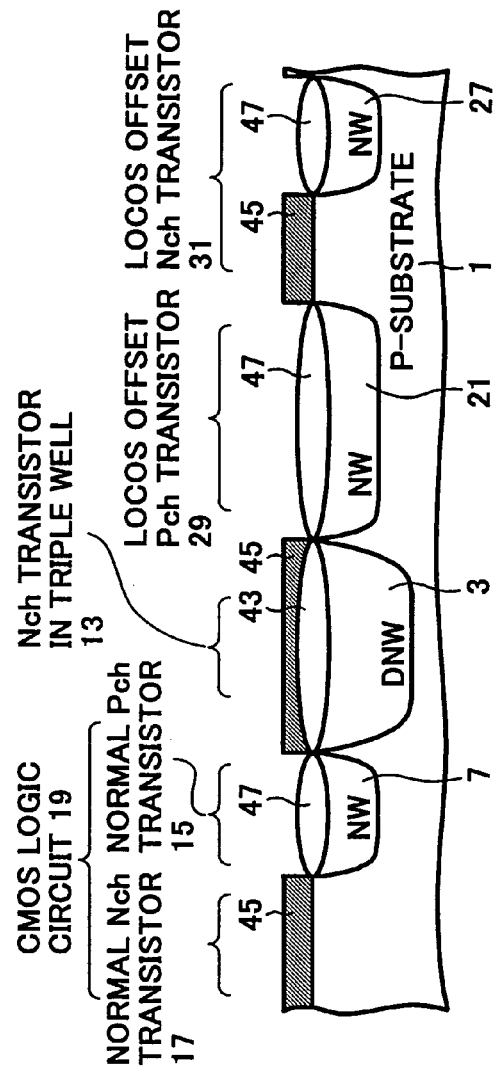

Thereafter, the layers are subjected to thermal treatment steps at 1150° C. for 10 hours in gaseous nitrogen atmosphere, whereby the phosphorus ions previously implanted in the normal N-well 7, N-well 21 and low concentration N-type diffusion layer 27 are thermally diffused (FIG. 9D).

(5) Following the removal of the silicon nitride layer 45, and by ion implantation techniques using the thermal oxide layers 43 and 47 as a mask for ion implantation, boron ions are implanted under the conditions of an acceleration energy of 30 keV and a dose of approximately $1 \times 10^3$ cm$^{-2}$. The implanted boron ions are then subjected to thermal diffusion at 1150° C. for 1 hour in gaseous nitrogen atmosphere, whereby the normal P-well 9 and P-well 37 are simultaneously formed.

Figure 9E:
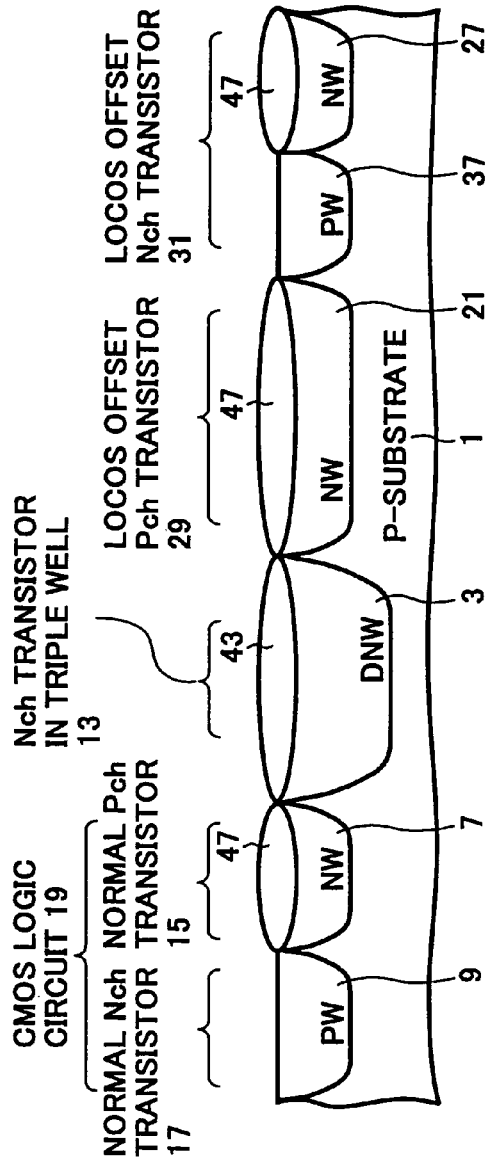

As described above, by using the thermal oxide layers 43 and 47 as the mask, the regions for forming the normal P-well 9 and P-well 37 is defined without photolithography steps. As a result, the number of required lithography process steps can further be reduced (FIG. 9E).

(6) Following the removal of the thermal oxide layers 43 and 47, a further photoresist pattern is formed on the P-substrate 1 by photolithographic techniques for defining the regions for forming the IP well 5 and low concentration P-type diffusion layer 25.

By ion implantation techniques using the photoresist pattern as a mask, boron ions are implanted under the conditions of an acceleration energy of 30 keV and a dose of approximately $3 \times 10^{13}$ cm$^{-2}$.

Figure 9F:
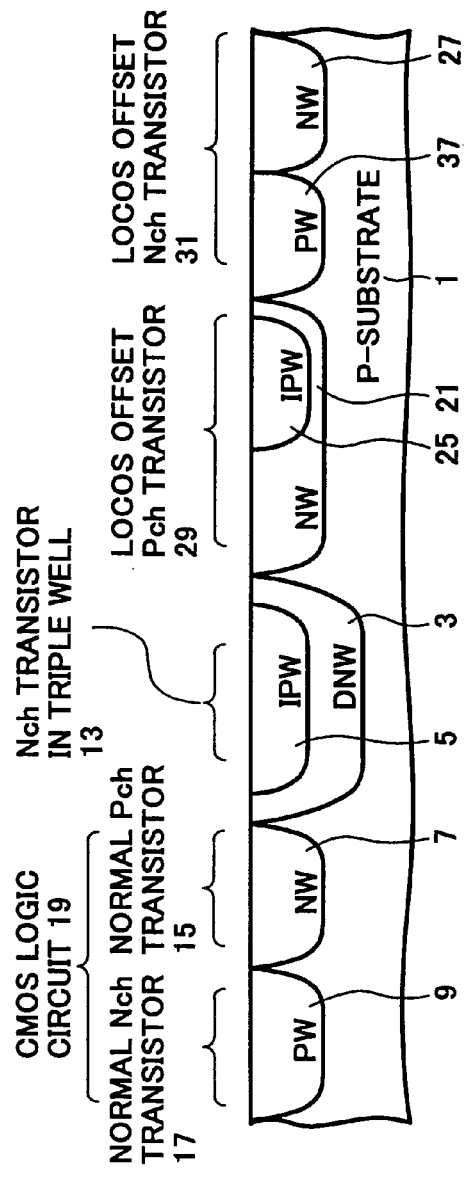

The thus prepared structure is then subjected to heat treatment steps at 1150° C. for 1 hour in gaseous nitrogen atmosphere, whereby the boron ions are thermally diffused and the IP well 5 and low concentration P-type diffusion layer 25 are formed simultaneously. Thereafter, the photoresist pattern is removed (FIG. 9F).

Figure 9G:
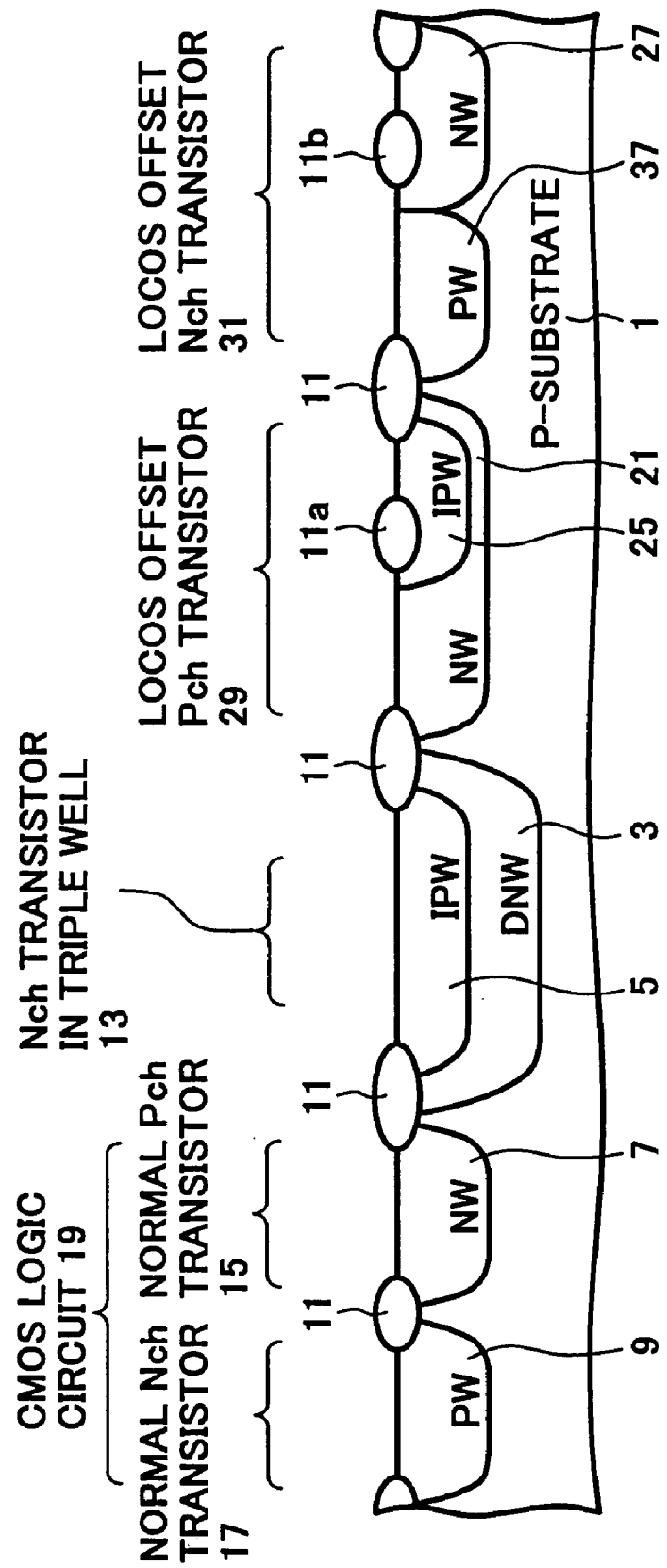

(7) By the LOCOS method, the LOCOS oxide layers 11, 11*a* and 11*b* are formed on the P-substrate 1 simultaneously at the same stage of forming process. These LOCOS oxide layers are formed by first carrying out photolithographic process steps for defining the LOCOS oxide layers including ones for device isolation, and subsequently subjecting these layers to wet oxidation steps at 1000° C. for 2 hours (FIG. 9G).

Figure 9H:
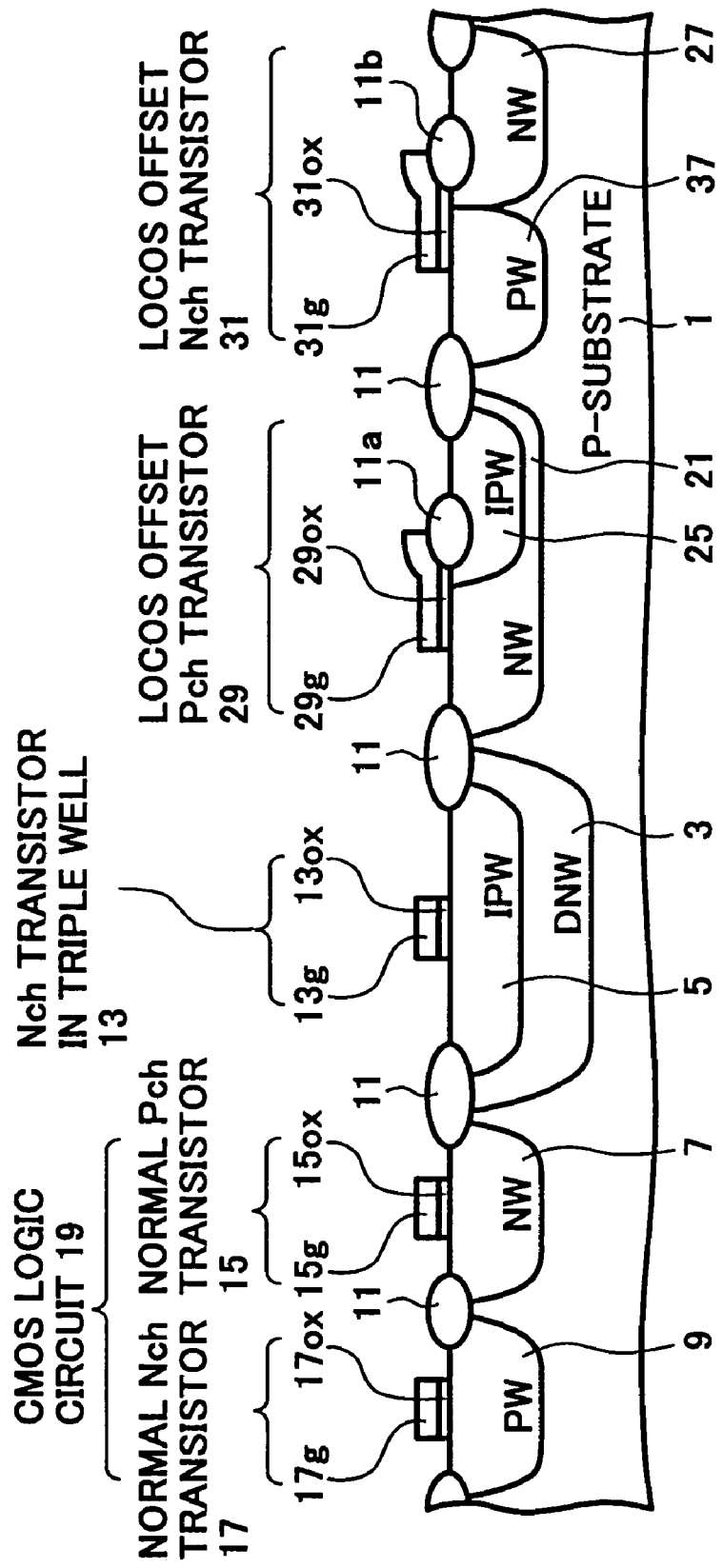

(8) In addition, gate oxide layers 13*ox*, 15*ox*, 17*ox*, 29*ox* and 31*ox*; and gate electrodes 13*g*, 15*g*, 17*g*, 29*g* and 31*g*, are formed in a manner similar to that described earlier in the paragraph (6) in reference to FIG. 2F for illustrating Example 1 (FIG. 9H).

It is noted the layers of silicon oxide formed during the above process steps other than the layers 13*ox*, 15*ox*, 17*ox*, 29*ox* and 31*ox* are excluded in FIG. 9H for reasons of clarity.

(9) Further, there formed simultaneously, in a manner similar to that described earlier in the paragraph (7) in reference to FIG. 1 for illustrating Example 1, are source 13*s* and drain 13*d* of the Nch transistor 13 formed in triple well, source 17*s* and drain 17*d* of the normal Nch transistor 17, and source 31*s* and drain 31*d* of the LOCOS offset Nch transistor 31.

Still further, there formed simultaneously are source 15*s* and drain 15*d* of the normal Pch transistor 15, and source 29*s* and drain 29*d* of the LOCOS offset Pch transistor 29.

As a result, the Nch transistor 13 in the triple well, the normal Pch transistor 15 and Nch transistor 17 for constituting a CMOS logic 19, the LOCOS offset Pch transistor 29 and LOCOS offset Nch transistor 31, are able to simultaneously be formed respectively in the same P-substrate 1 (FIG. 8).

According to the seventh example, therefore, the P-well 37 and the low concentration N-type diffusion layer 27 as the drain are formed adjacent to one another in the LOCOS offset Nch transistor 31.

As a result, the regions for forming the P-well 37 and normal P-well can be defined without photolithography process steps otherwise required for defining these portions, whereby the number of required lithography process steps can further be reduced.

Although the fabrication process steps in the present seventh example for forming the P-well 37 and normal P-well 9 are described primarily on those during ion implanting steps using the several masks of thermal oxide layer in use for ion implantation such as, for example, the one being the thermal oxide layer 43 which is selectively formed using the silicon nitride layer 41 used for defining the region for the deep N-well 3, and the other the thermal oxide layer 47 which is selectively formed using the silicon nitride layer 45 used for defining the region for the normal N-well 7, N-well 21 and low concentration N-type diffusion layer 27, it is needless to add that the steps shown in this example may alternatively be implemented in modified forms.

The normal N-well 7, N-well 21 and low concentration N-type diffusion layer 27 in Example 7 may alternatively be formed during impurity doping steps using a thermal oxide layer as a mask, which is selectively formed on the surface of regions for forming the P-well 37 and normal P-well 9, and a further thermal oxide layer, which is selectively formed on the surface of the region for deep N-well 3.

As a result, the regions for forming the normal N-well 7, N-well 21 and low concentration N-type diffusion layer 27 can be defined without photolithography process steps otherwise required for defining these portions, whereby the number of required lithography process steps can further be reduced.

Furthermore, the deep N-well 3 in Example 7 may still alternatively be formed during impurity doping steps using a thermal oxide layer as a mask, which is selectively formed on the surface of regions for forming the P-well 37 and normal P-well 9, and a further thermal oxide layer, which is selectively formed on the surface of the region for the normal N-well 7, N-well 21 and low concentration N-type diffusion layer 27.

As a result, the regions for forming the deep N-well 3 can be defined without photolithography process steps otherwise required for defining the portion, whereby the number of required lithography process steps can further be reduced.

Figure 10:
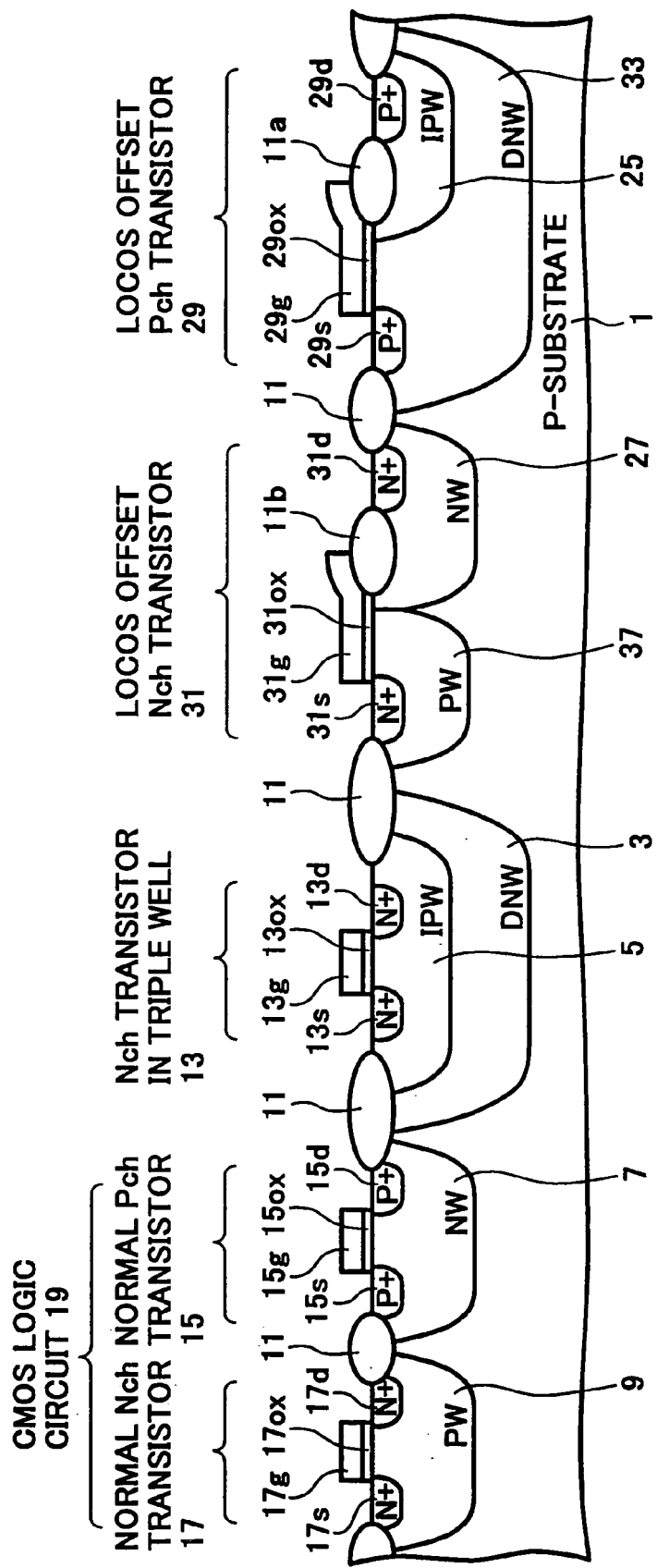
FIG. 10 is a cross-sectional view illustrating a semiconductor device according to an eighth example disclosed herein.

FIG. 10 is a cross-sectional view illustrating a semiconductor device according to an eighth Example disclosed herein.

The present semiconductor device is formed in conformity with the thirteenth embodiment mentioned earlier including several components such as offset Nch transistor, offset Pch transistor, normal P-well, normal N-well and triple well. This semiconductor device, therefore, consists of the components mentioned in the second embodiment (including the offset Nch transistor and normal N-well) and fourth embodiment (including the offset Pch transistor and triple well).

Like reference numerals in FIG. 10 designate identical or corresponding parts in FIG. 8 (Example 7), detailed description thereof is herein abbreviated.

In the region for forming a LOCOS offset Pch transistor 29 in the P-semiconductor substrate 1, an N-well (DNW) 33 is formed in place of the N-well 21 (FIG. 1). The N-well 33 is formed simultaneously with a deep N-well 3 at the same stage of process. Other portions illustrated in FIG. 10 are formed in a similar manner to those shown in FIG. 8.

In this eighth example, the low concentration N-type diffusion layer 27 in offset Nch transistor 31 is formed simultaneously with the normal N-well 7, the P-well 37 simultaneously with the normal P-well 9, the low concentration P-type diffusion layer 25 in offset Pch transistor 29 simultaneously with the IP well 5, and the N-well 33 simultaneously with the deep N-well 3.

As a result, the photolithography process steps required for defining merely the portions of either the offset Nch transistor 31 or offset Nch transistor 29 can be eliminated, whereby the number of required lithography process steps can be reduced.

Also in this eighth example, the P-well 37 and normal P-well 9 are formed during impurity doping steps preferably using a thermal oxide layer, formed selectively on the surface of regions for defining the deep N-well 3, normal N-well 7, low concentration N-type diffusion layer 27 and N-well 33, as a mask for doping impurities.

The fabrication process steps implemented in the present example are illustrated herein below in reference to FIGS. 10 through 11H.

FIGS. 11A through 11H are cross sectional views illustrating process sequence for forming the semiconductor device of Example 8 (FIG. 10).

(1) A layer of silicon nitride is deposited on the surface area of a P-substrate 1. By photolithographic techniques, several openings are subsequently formed on the thus prepared silicon nitride layer at predetermined locations on the surface area, whereby a silicon nitride layer (mask) 49 is formed for defining the regions for forming the deep N-well 3 in the triple well and the N-well 33 in LOCOS offset Pch transistor 29.

By ion implantation techniques using the silicon nitride layer 49 as a mask, phosphorus ions are implanted under the conditions of an acceleration energy of 160 keV and a dose of approximately $2\times10^{13}$ cm$^{-2}$ whereby the deep N-well 3 and N-well 33 are formed (FIG. 11A).

(2) With the silicon nitride layer 49 retained, the structure is then subjected to wet oxidation steps at 1000° C. for 2 hours to thereby form a thermal oxide layer 51 to a thickness of approximately 200 nm on the surface of the deep N-well 3 and N-well 33.

Thereafter, the layers are subjected to thermal treatment steps at 1150° C. for 10 hours in gaseous nitrogen atmosphere, whereby the phosphorus ions previously implanted in the deep N-well 3 and N-well 33 are thermally diffused (FIG. 11B).

(3) Following the removal of the silicon nitride layer 49, another silicon nitride layer is deposited on the surface area of the P-substrate 1.

By photolithographic techniques, this silicon nitride layer is subsequently provided with openings at predetermined locations on the surface area for defining a normal N-well 7 and low concentration N-type diffusion layer 27, whereby another silicon nitride layer (mask) 53 is formed.

Figure 11C:
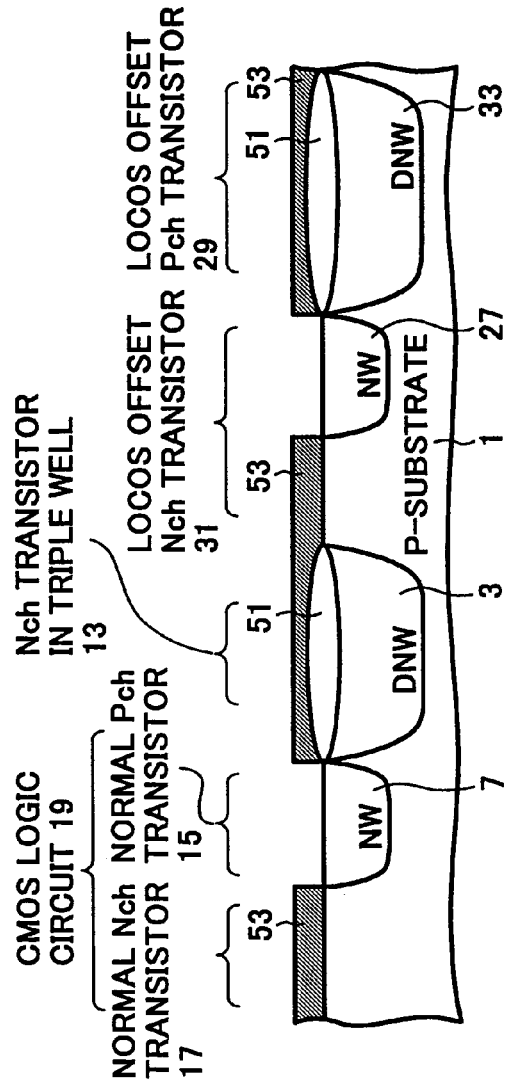

By ion implantation techniques using the silicon nitride layer 53 as a mask for ion implantation, phosphorus ions are implanted under the conditions of an acceleration energy of 160 keV and a dose of approximately $1\times10^{13}$ cm$^{-2}$, whereby the normal N-well 7 and low concentration N-type diffusion layer 27 are simultaneously formed (FIG. 11C).

(4) With the silicon nitride layer 53 retained, the structure is then subjected to wet oxidation steps at 1000° C. for 2 hours to thereby form a thermal oxide layer 55 to a thickness of approximately 200 nm on the surface of the normal N-well 7 and low concentration N-type diffusion layer 27.

Figure 11D:
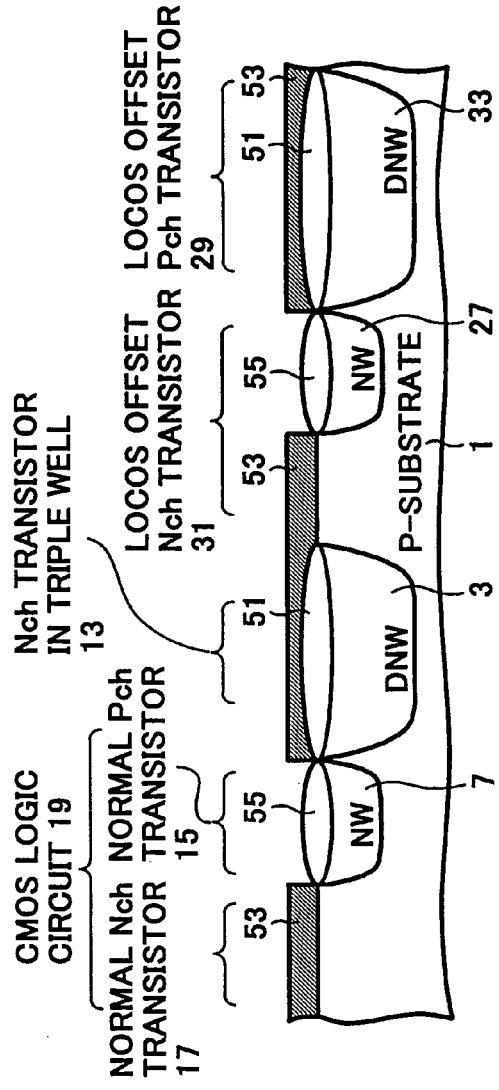

Thereafter, the layers are subjected to thermal treatment steps at 1150° C. for 10 hours in gaseous nitrogen atmosphere, whereby the phosphorus ions previously implanted in the normal N-well 7 and low concentration N-type diffusion layer 27 are thermally diffused (FIG. 11D).

(5) Following the removal of the silicon nitride layer 53, and by ion implantation techniques using the thermal oxide layers 51 and 55 as a mask for ion implantation, boron ions are implanted under the conditions of an acceleration energy of 30 keV and a dose of approximately $1\times10^{13}$ cm$^{-2}$. The implanted boron ions are then subjected to thermal diffusion at 1150° C. for 1 hour in gaseous nitrogen atmosphere, whereby the normal P-well 9 and P-well 37 are simultaneously formed.

Figure 11E:
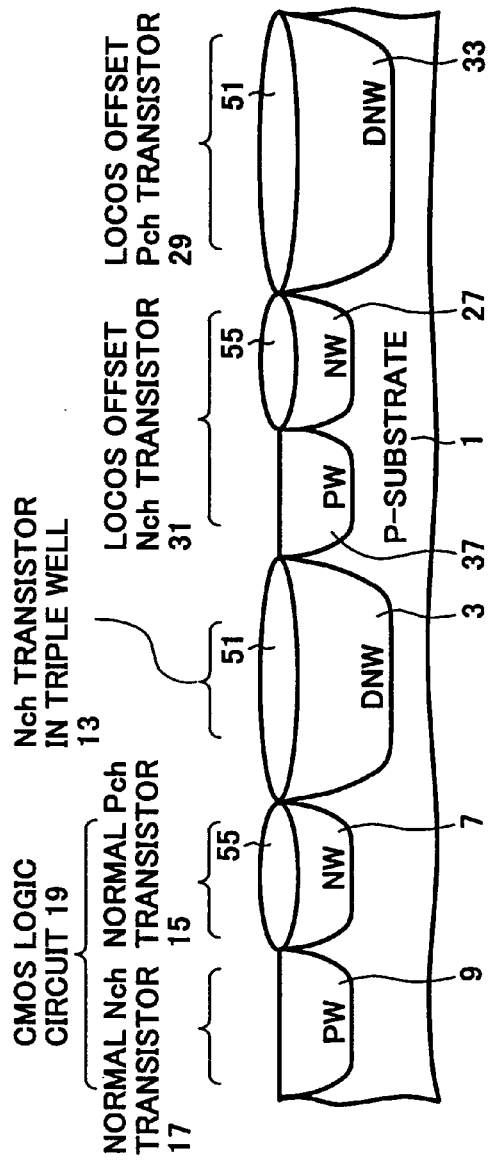
Figure 11F:
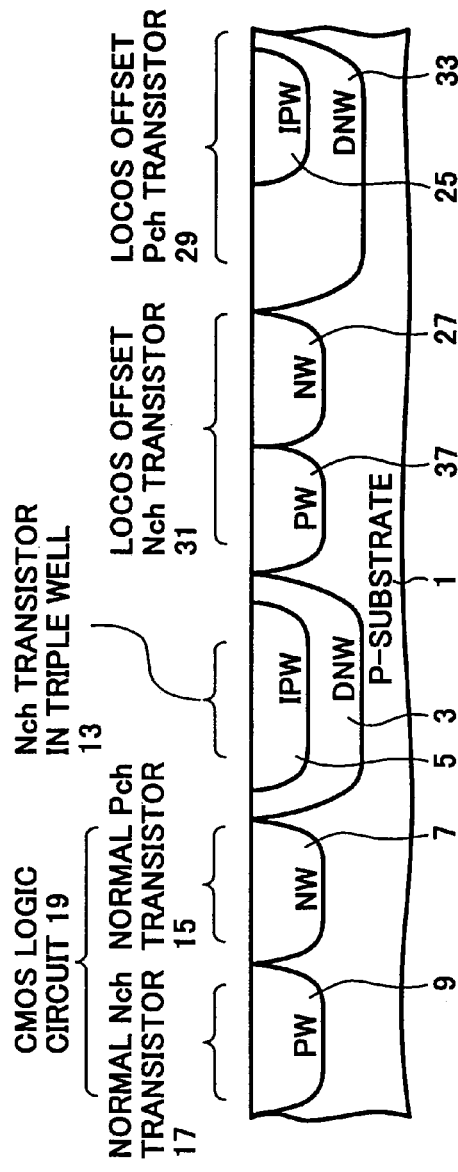

As described above, by using the thermal oxide layers 51 and 55 as the mask, the regions for forming the normal P-well 9 and P-well 37 are defined without photolithography steps. As a result, the number of required lithography process steps can further be reduced (FIG. 11E).

(6) Following the removal of the thermal oxide layers 51 and 55, a further photoresist pattern is formed on the P-substrate 1 by photolithographic techniques for defining the regions for forming the IP well 5 and low concentration P-type diffusion layer 25.

By ion implantation techniques using the photoresist pattern as a mask, boron ions are implanted under the conditions of an acceleration energy of 30 keV and a dose of approximately $3\times10^{13}$ cm$^{-2}$.

The thus prepared structure is then subjected to heat treatment steps at 1150° C. for 1 hour in gaseous nitrogen atmosphere, whereby the boron ions are thermally diffused and the IP well 5 and low concentration P-type diffusion layer 25 are formed simultaneously. Thereafter, the photoresist pattern is removed (FIG. 1F).

(7) By the LOCOS method, the LOCOS oxide layers 11, 11a and 11b are formed on the P-substrate 1 simultaneously at the same stage of forming process.

Figure 11G:
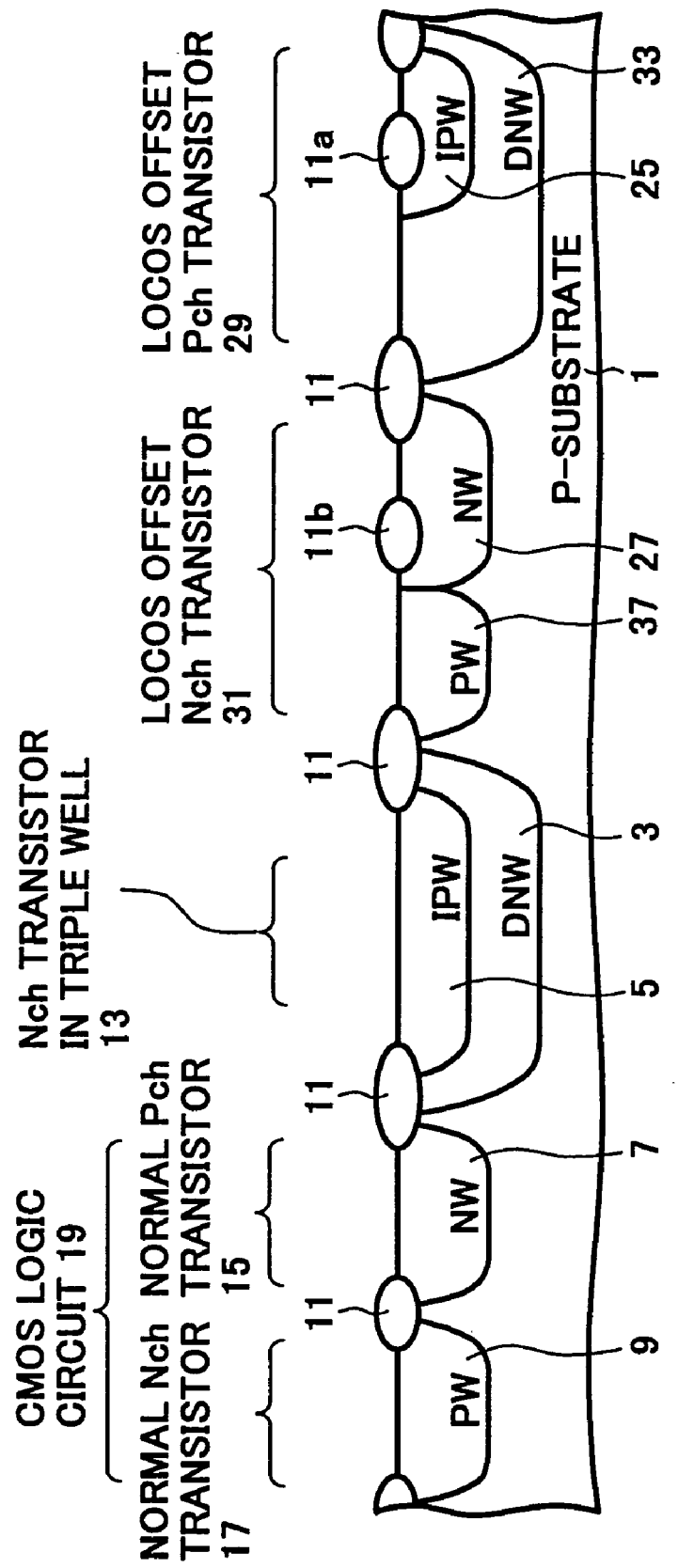

These LOCOS oxide layers are formed by first carrying out photolithographic process steps for defining the LOCOS oxide layers including ones for device isolation, and subsequently subjecting these layers to wet oxidation steps at 1000° C. for 2 hours (FIG. 11G).

(8) In addition, gate oxide layers 13ox, 15ox, 17ox, 29ox and 31ox; and gate electrodes 13g, 15g, 17g, 29g and 31g, are formed in a manner similar to that described earlier in the paragraph (6) in reference to FIG. 2F for illustrating Example 1 (FIG. 11H). It is noted the layers of silicon oxide formed during the above process steps other than the layers 13ox, 15ox, 17ox, 29ox and 31ox are excluded in FIG. 11H for reasons of clarity.

(9) Further, there formed simultaneously, in a manner similar to that described earlier in the paragraph (7) in reference to FIG. 1 for illustrating Example 1, are source 13s and drain 13d of the Nch transistor 13 formed in triple well, source 17s and drain 17d of the normal Nch transistor 17, and source 31s and drain 31d of the LOCOS offset Nch transistor 31.

Still further, there formed simultaneously are source 15s and drain 15d of the normal Pch transistor 15, and source 29s and drain 29d of the LOCOS offset Pch transistor 29.

As a result, the Nch transistor 13 in the triple well, the normal Pch transistor 15 and Nch transistor 17 for constituting a CMOS logic 19, the LOCOS offset Pch transistor 29 and LOCOS offset Nch transistor 31, are able to simultaneously be formed respectively in the same P-substrate 1 (FIG. 10).

According to the eighth example, therefore, the P-well 37 and the low concentration N-type diffusion layer 27 as the drain are formed adjacent to one another in the LOCOS offset Nch transistor 31.

As a result, the regions for forming the P-well 37 and normal P-well 9 can be defined without photolithography process steps otherwise required for defining these portions, whereby the number of required lithography process steps can further be reduced.

Although the fabrication process steps in the present eighth example for forming the P-well 37 and normal P-well 9 are described primarily on those during ion implanting steps using the several masks of thermal oxide layer in use for ion implantation such as, for example, thermal oxide layer 51 which is selectively formed using the silicon nitride layer 43 used for defining the region for the deep N-well 3 and N-well 33, and thermal oxide layer 55 which is selectively formed using the silicon nitride layer 53 used for defining the region for the normal N-well 7 and low concentration N-type diffusion layer 27, it is needless to add that the steps shown in this example may alternatively be implemented in modified forms.

The normal N-well 7 and low concentration N-type diffusion layer 27 in Example 8 may alternatively be formed during impurity doping steps using a thermal oxide layer as a mask, which is selectively formed on the surface of regions for forming the P-well 37 and normal P-well 9, and a further thermal oxide layer, which is selectively formed on the surface of the region for deep N-well 3 and N-well 33.

As a result, the regions for forming the normal N-well 7 and low concentration N-type diffusion layer 27 can be defined without photolithography process steps otherwise required for defining these portions, whereby the number of required lithography process steps can further be reduced.

Furthermore, the deep N-well 3 and N-well 33 in Example 7 may still alternatively be formed during impurity doping steps using a thermal oxide layer as a mask, which is selectively formed on the surface of regions for forming the P-well 37 and normal P-well 9, and a further thermal oxide layer, which is selectively formed on the surface of the region for the normal N-well 7, N-well 21 and low concentration N-type diffusion layer 27.

As a result, the regions for forming the deep N-well 3 and N-well 33 can be defined without photolithography process steps otherwise required for defining the portion, whereby the number of required lithography process steps can further be reduced.

Subsequently, several electrical measurements were carried out to evaluate the thus fabricated semiconductor devices. Characteristic waveforms obtained from the measurements will be detailed herein below, particularly on the components such as, for example, the LOCOS offset Pch transistor 29 and LOCOS offset Nch transistor 31 of Example 8. In comparison, additional measurements were also made on conventional Pch transistor 15 and Nch transistor 17.

In the first place, on the LOCOS offset Nch transistor 31 of Example 8, the structure and the results obtained from the measurements will be described.

Figure 12A:
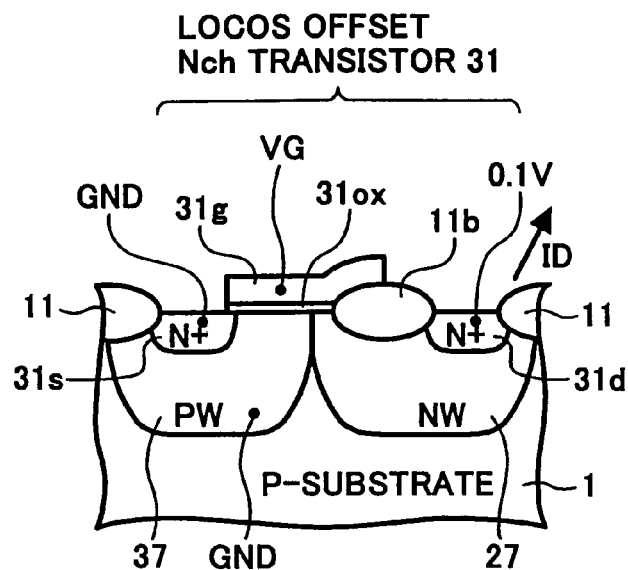
FIG. 12A is a cross sectional view illustrating the LOCOS offset Nch transistor of Example 8.
Figure 12B:
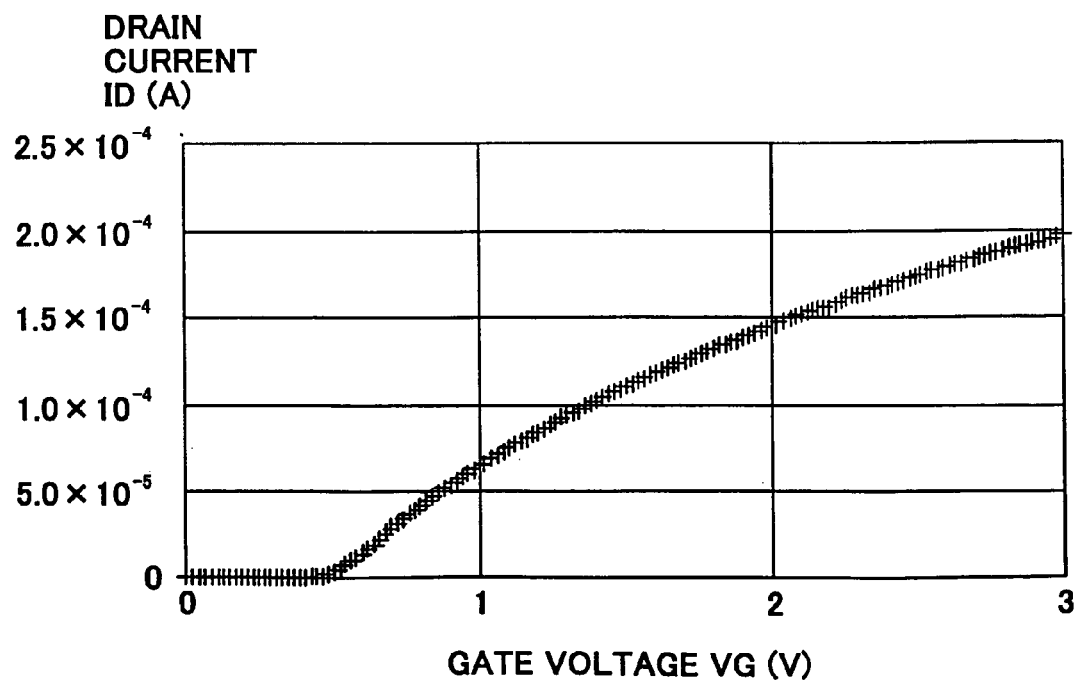
FIG. 12B plots the drain current $I_D$ (A, ampere), vertically, versus the gate voltage $V_G$ (V, volt), horizontally, for the LOCOS offset Nch transistor of Example 8.

FIG. 12A is a cross sectional view illustrating the LOCOS offset Nch transistor 31 of Example 8, and FIG. 12B plots the drain current $I_D$ (A, ampere), vertically, versus the gate voltage $V_G$ (V, volt), horizontally, for the transistor 31.

Figure 13A:
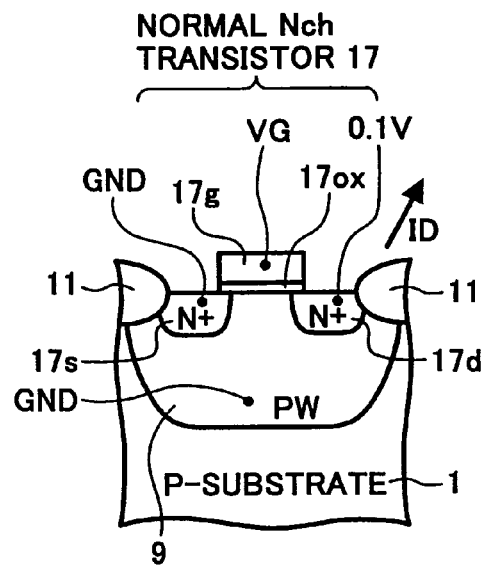
FIG. 13A is a cross sectional view of the normal Nch transistor of Example 8.
Figure 13B:
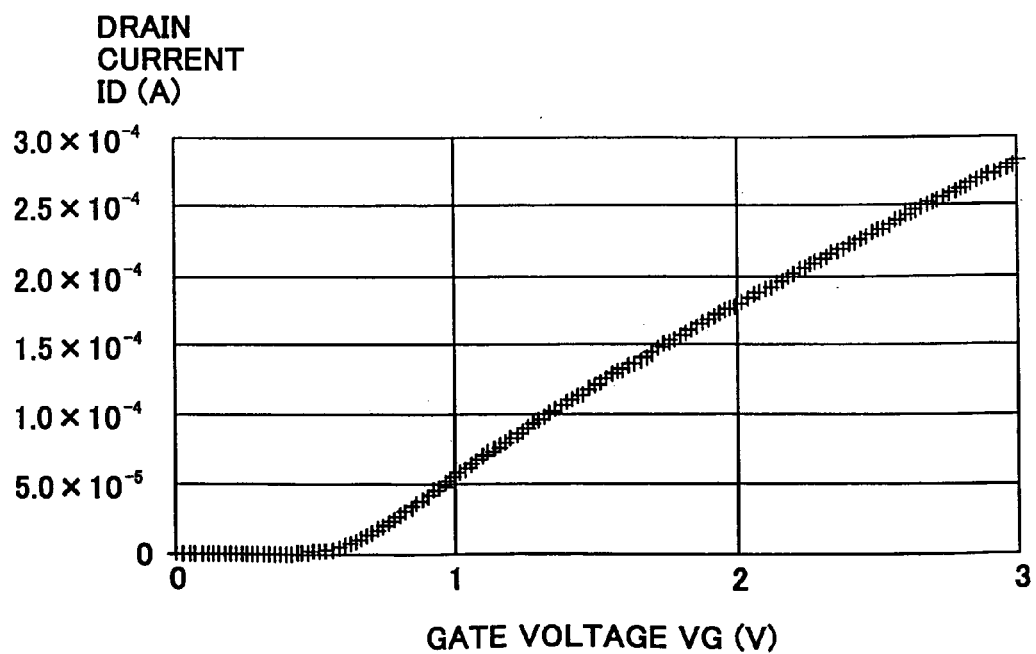
FIG. 13B plots the drain current $I_D$ (A, ampere), vertically, versus the gate voltage $V_G$ (V, volt), horizontally, for the normal Nch transistor of Example 8.

In comparison, the structure and the results from similar measurements are also shown, in which FIG. 13A is a cross sectional view of the normal Nch transistor 17 of Example 8, and FIG. 13B plots the drain current $I_D$ (A, ampere), vertically, versus the gate voltage $V_G$ (V, volt), horizontally, for the transistor 17.

During the measurements, the voltage applied to both the drain 31d of LOCOS offset Nch transistor 31 and drain 17d of Nch transistor 17 was fixed at 0.1 V, and the source 31s and P-well 37, and source 17s and normal P-well 9, were kept at the ground potential. Under these conditions, the change in the drain current ID with the applied gate voltage $V_G$ was measured.

From the results shown in FIGS. 13B and 13B, it is indicated that each the LOCOS offset Nch transistor 31 and Nch transistor 17 functions normally and has the approximately same threshold voltage of 0.5 V.

Figure 14A:
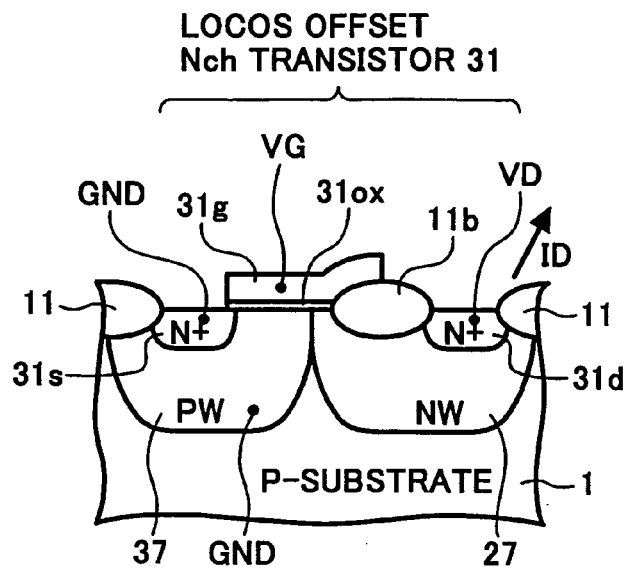
FIG. 14A is a cross sectional view illustrating the LOCOS offset Nch transistor of Example 8.
Figure 14B:
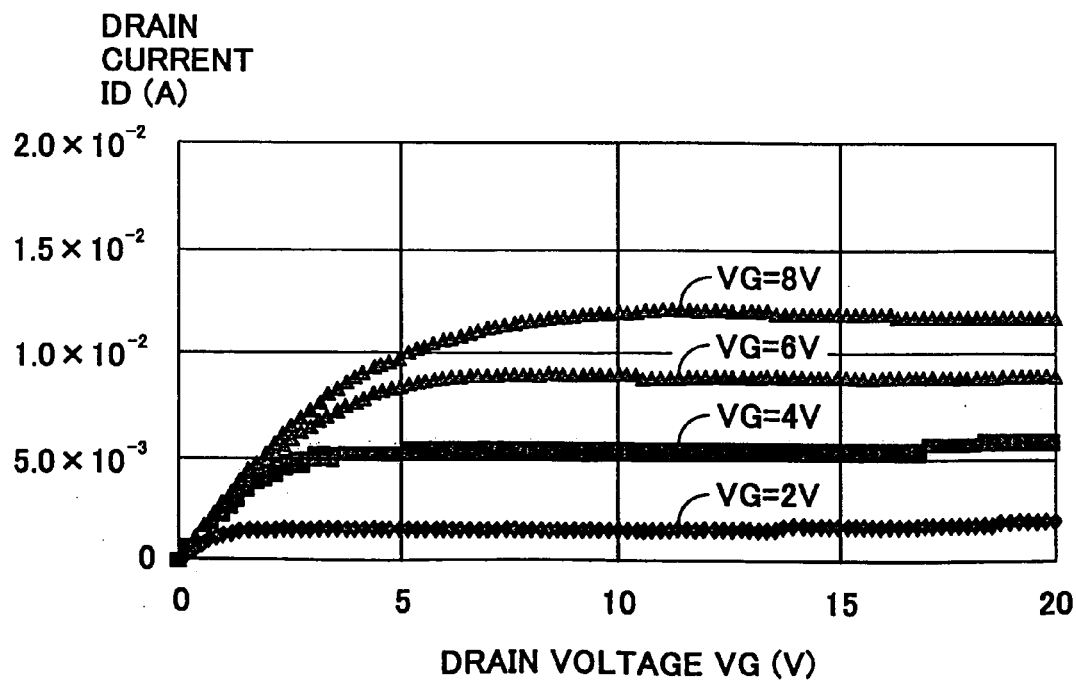
FIG. 14B plots the drain current $I_D$ (A, ampere), vertically, versus the drain voltage $V_D$ (V, volt), horizontally, for the LOCOS offset Nch transistor of Example 8.

FIG. 14A is a cross sectional view illustrating the LOCOS offset Nch transistor 31 of Example 8, and FIG. 14B plots the drain current $I_D$ (A, ampere), vertically, versus the drain voltage $V_D$ (V, volt), horizontally, for the transistor 31.

Figure 15A:
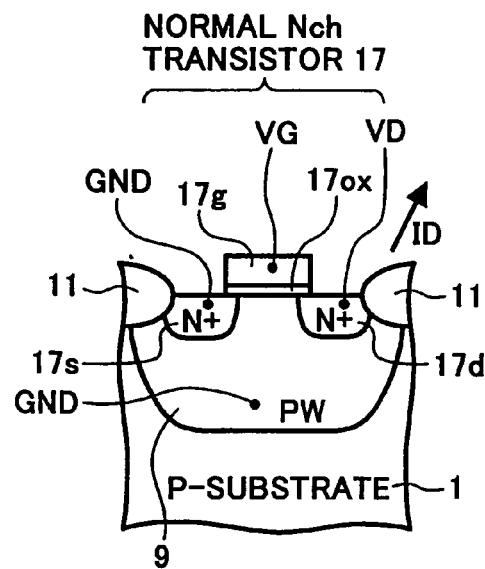
FIG. 15A is a cross sectional view of the normal Nch transistor of Example 8.
Figure 15B:
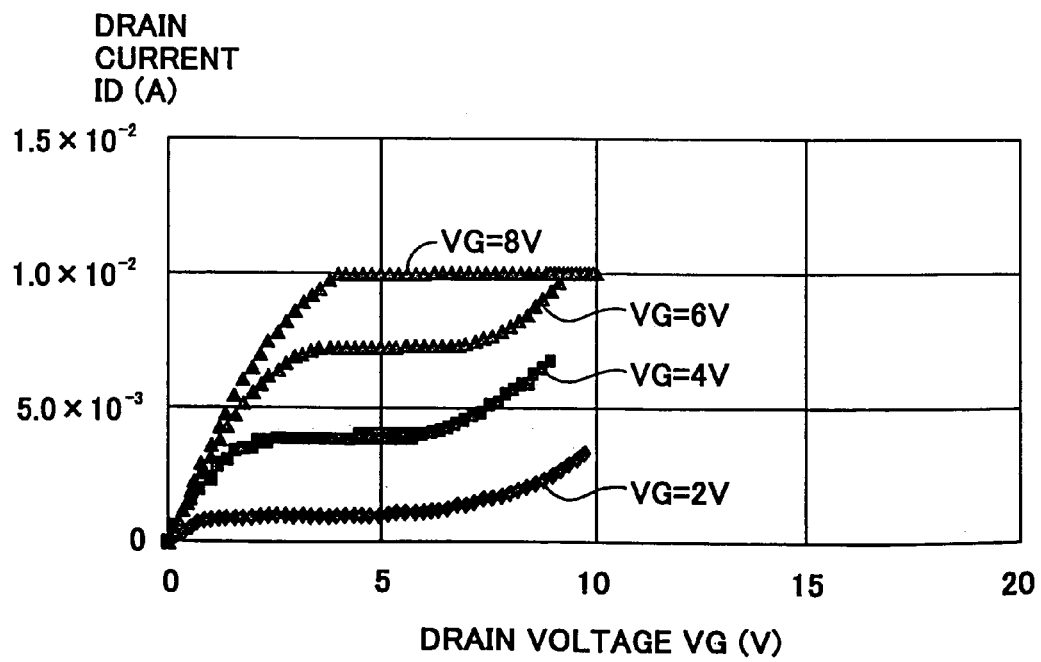
FIG. 15B plots the drain current $I_D$ (A, ampere), vertically, versus the drain voltage $V_D$ (V, volt), horizontally, for the normal Nch transistor of Example 8.

In comparison, the structure and the results from similar measurements are also shown, in which FIG. 15A is a cross sectional view of the normal Nch transistor 17 of Example 8, and FIG. 15B plots the drain current $I_D$ (A, ampere), vertically, versus the drain voltage $V_G$ (V, volt), horizontally, for the transistor 17.

During the measurements, the voltage applied to both the gate electrode 17g of LOCOS offset Nch transistor 31 and gate electrode 17g of Nch transistor 17 was fixed at 2 V, 4 V, 6 V and 8 V, and the source 31s and P-well 37, and source 17s and normal P-well 9, were kept at the ground potential. Under these conditions, the change in the drain current ID with the applied drain voltage $V_D$ was measured, whereby maximum voltage values applied to either the drain 31d or drain 17d can be determined.

From the results shown in FIG. 15B, it is shown that the breakdown indicated by large current flows take place for the applied drain values exceeding 10 V for the normal Nch transistor 17. In contrast, for the LOCOS offset Nch transistor 31 as shown in FIG. 14B, normal operations were found with sufficient margin even at the applied drain voltage of 20 V.

In the next place, on the LOCOS offset Pch transistor 29 of Example 8, the structure and the results obtained from the measurements will be described.

Figure 16A:
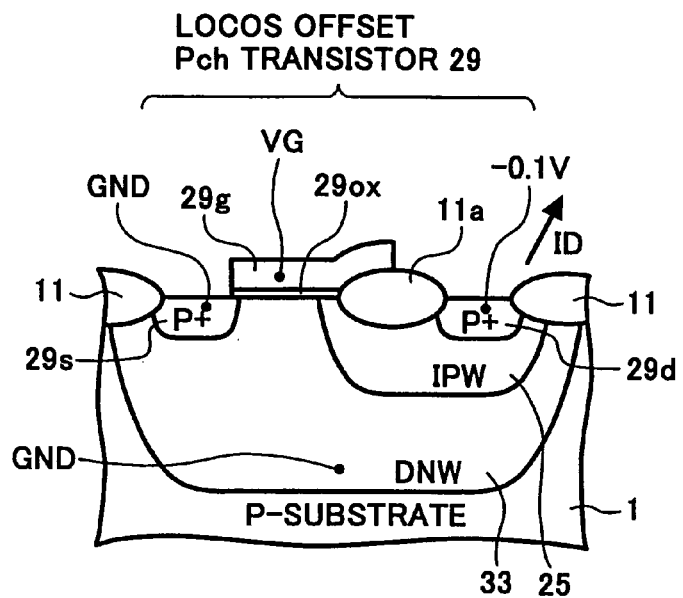
FIG. 16A is a cross sectional view illustrating the LOCOS offset Pch transistor of Example 8.
Figure 16B:
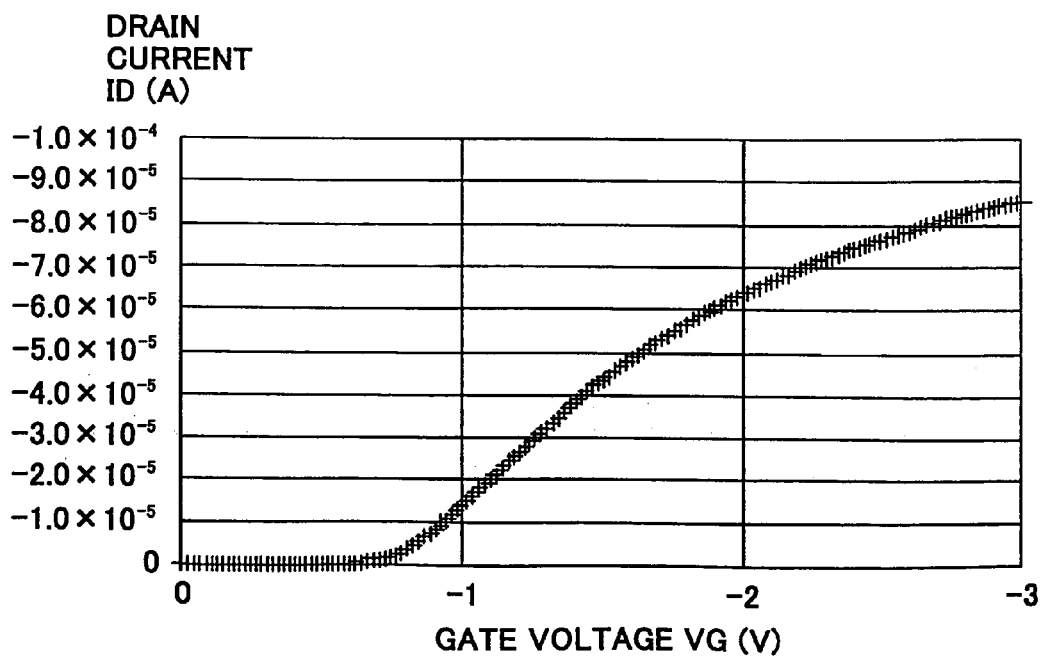
FIG. 16B plots the drain current $I_D$ (A, ampere), vertically, versus the gate voltage $V_G$ (V, volt), horizontally, for the LOCOS offset Nch transistor of Example 8.

FIG. 16A is a cross sectional view illustrating the LOCOS offset Pch transistor 29 of Example 8, and FIG. 16B plots the drain current $I_D$ (A, ampere), vertically, versus the gate voltage $V_G$ (V, volt), horizontally, for the transistor 29.

Figure 17A:
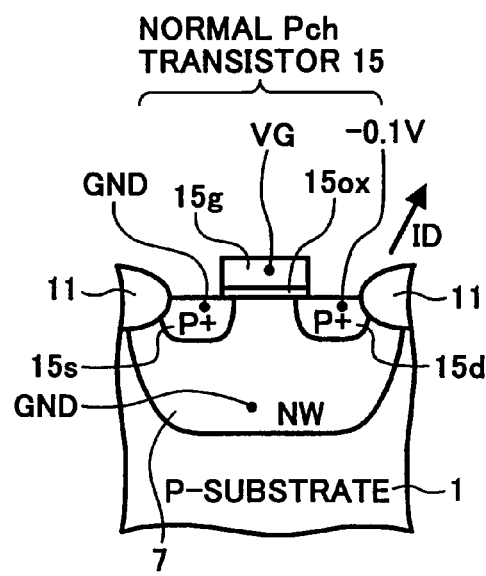
FIG. 17A is a cross sectional view of the normal Pch transistor of Example 8.
Figure 17B:
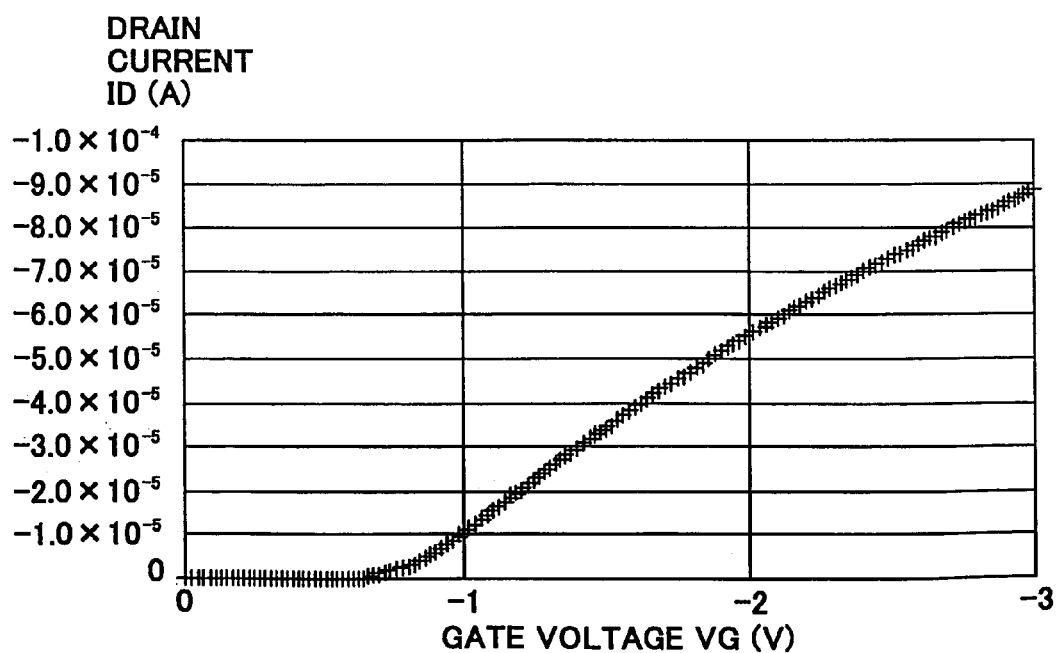
FIG. 17B plots the drain current $I_D$ (A, ampere), vertically, versus the gate voltage $V_G$ (V, volt), horizontally, for the normal Nch transistor of Example 8.

In comparison, the structure and the results from similar measurements are also shown, in which FIG. 17A is a cross sectional view of the normal Pch transistor 15 of Example 8, and FIG. 17B plots the drain current $I_D$ (A, ampere), vertically, versus the gate voltage $V_G$ (V, volt), horizontally, for the transistor 15.

During the measurements, the voltage applied to both the drain 29d of LOCOS offset Pch transistor 29 and drain 15d of Pch transistor 15 was fixed at 0.1 V, and the source 29s and deep N-well 33, and source 15s and normal N-well 7, were kept at the ground potential. Under these conditions, the change in the drain current ID with the applied gate voltage $V_G$ was measured.

From the results shown in FIGS. 16B and 17B, it is indicated that each the LOCOS offset Pch transistor 29 and Nch transistor 15 functions normally and has the approximately same threshold voltage of −0.8 V.

Figure 18A:
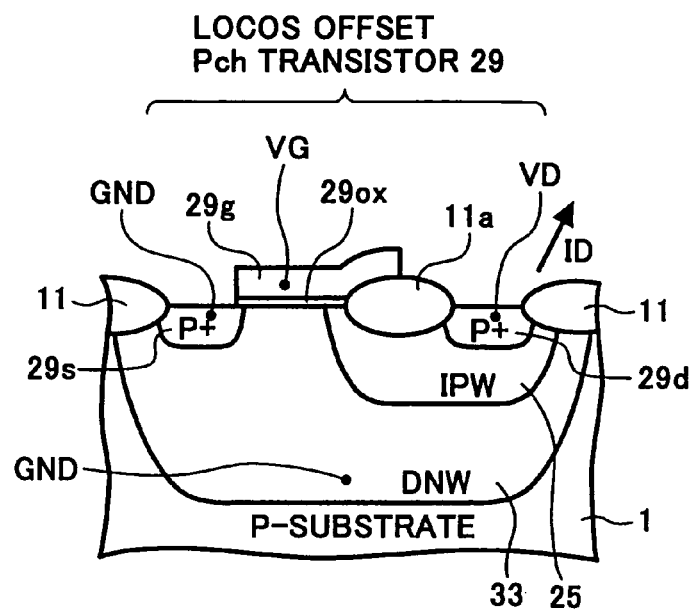
FIG. 18A is a cross sectional view illustrating the LOCOS offset Pch transistor of Example 8.
Figure 18B:
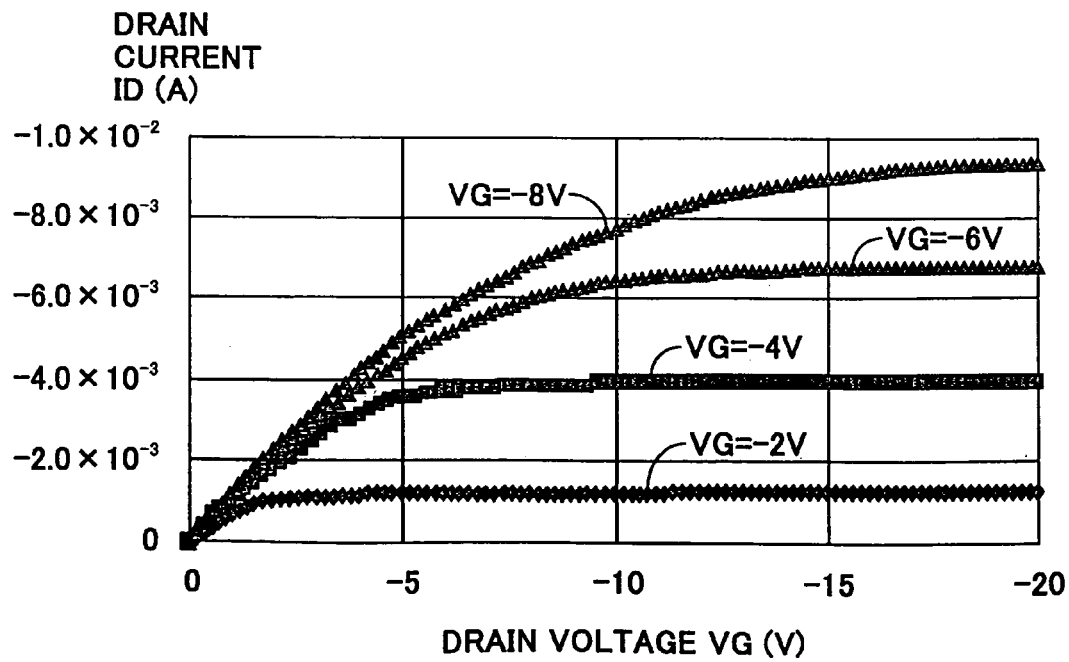
FIG. 18B plots the drain current $I_D$ (A, ampere), vertically, versus the drain voltage $V_D$ (V, volt), horizontally, for the LOCOS offset Pch transistor of Example 8.

FIG. 18A is a cross sectional view illustrating the LOCOS offset Pch transistor 29 of Example 8, and FIG. 18B plots the drain current $I_D$ (A, ampere), vertically, versus the drain voltage $V_D$ (V, volt), horizontally, for the transistor 29.

Figure 19A:
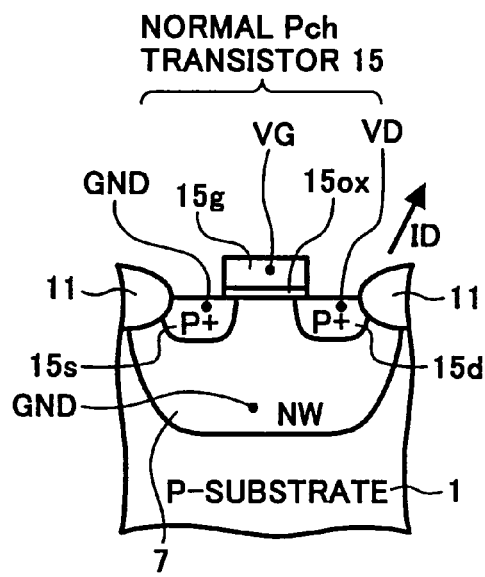
FIG. 19A is a cross sectional view of the normal Pch transistor of Example 8.
Figure 19B:
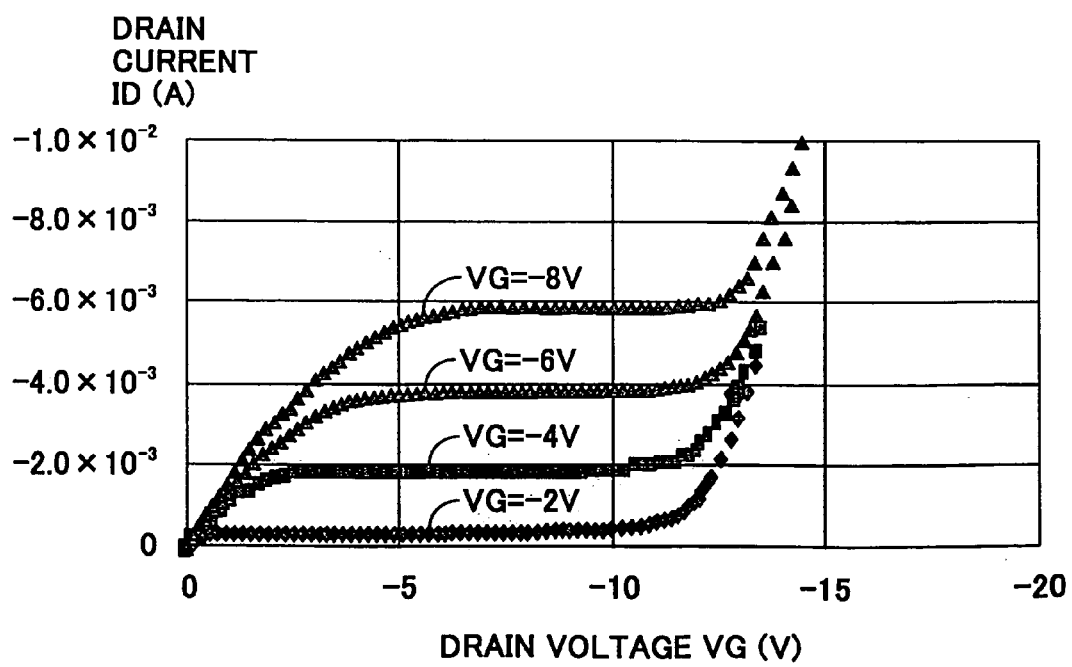
FIG. 19B plots the drain current $I_D$ (A, ampere), vertically, versus the drain voltage $V_D$ (V, volt), horizontally, for the normal Pch transistor of Example 8.

In comparison, the structure and the results from similar measurements are also shown, in which FIG. 19A is a cross sectional view of the normal Pch transistor 15 of Example 8, and FIG. 19B plots the drain current $I_D$ (A, ampere), vertically, versus the drain voltage $V_G$ (V, volt), horizontally, for the transistor 15.

During the measurements, the voltage applied to both the gate electrode 29g of LOCOS offset Pch transistor 29 and gate electrode 15g of Pch transistor 15 was fixed at −2 V, −4 V, −6 V and −8 V, and the source 29s and deep N-well 33, and source 15s and normal N-well 7, were kept at the ground potential. Under these conditions, the change in the drain current ID with the applied drain voltage $V_D$ was measured, whereby maximum voltage values applied to either the drain 29d or drain 15d can be determined.

From the results shown in FIG. 19B, it is shown that large current flows take place for the applied drain values lower than −12 V for the normal Pch transistor 15, thereby indicating the failure in controlling the current by the applied gate voltage $V_D$. In contrast, for the LOCOS offset Pch transistor 29 as shown in FIG. 18B, normal operations were found with sufficient-margin even at the applied drain voltage of −20 V.

Figure 20:
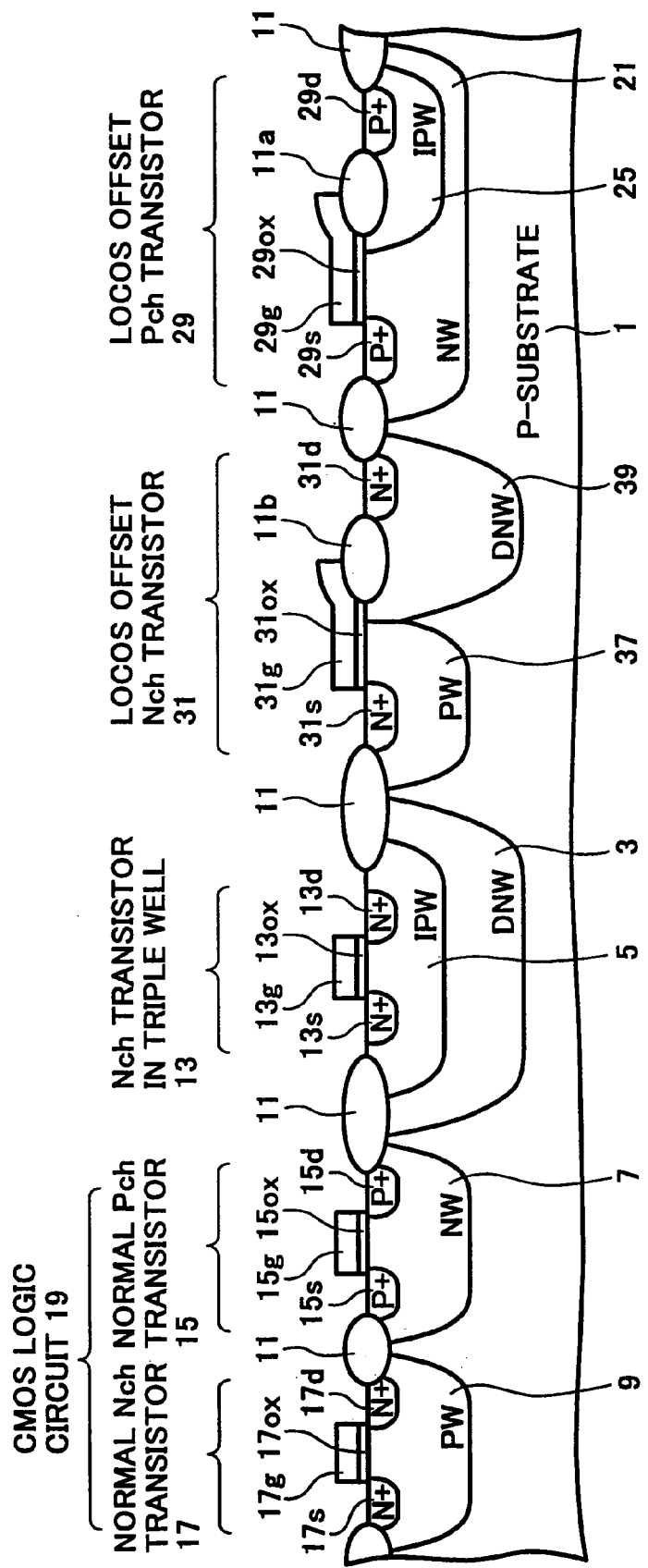
FIG. 20 is a cross-sectional view illustrating a semiconductor device according to a ninth example disclosed herein.

FIG. 20 is a cross-sectional view illustrating a semiconductor device according to a ninth example disclosed herein.

The present semiconductor device is formed in conformity with the fourteenth embodiment mentioned earlier including several components such as offset Nch transistor, offset Pch transistor, normal P-well, normal N-well and triple well. This semiconductor device, therefore, consists of the components mentioned in the third embodiment (including the offset Nch transistor and triple well) and fourth embodiment (including the offset Pch transistor and triple well).

Like reference numerals in FIG. 20 designate identical or corresponding parts in FIG. 6 (Example 5) and FIG. 8 (Example 7), detailed description thereof is herein abbreviated.

In the region for forming a LOCOS offset Nch transistor 31 in the P-substrate 1, a low concentration N-type diffusion layer (DNW) 39 is formed in place of low concentration N-type diffusion layer 27 (FIG. 5).

Figure 22:
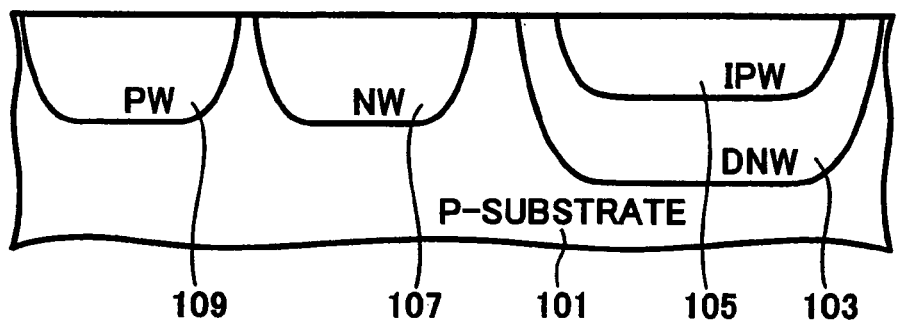
FIG. 22 is a cross-sectional view illustrating the well structure of a known semiconductor device including a triple well.
Figure 23:
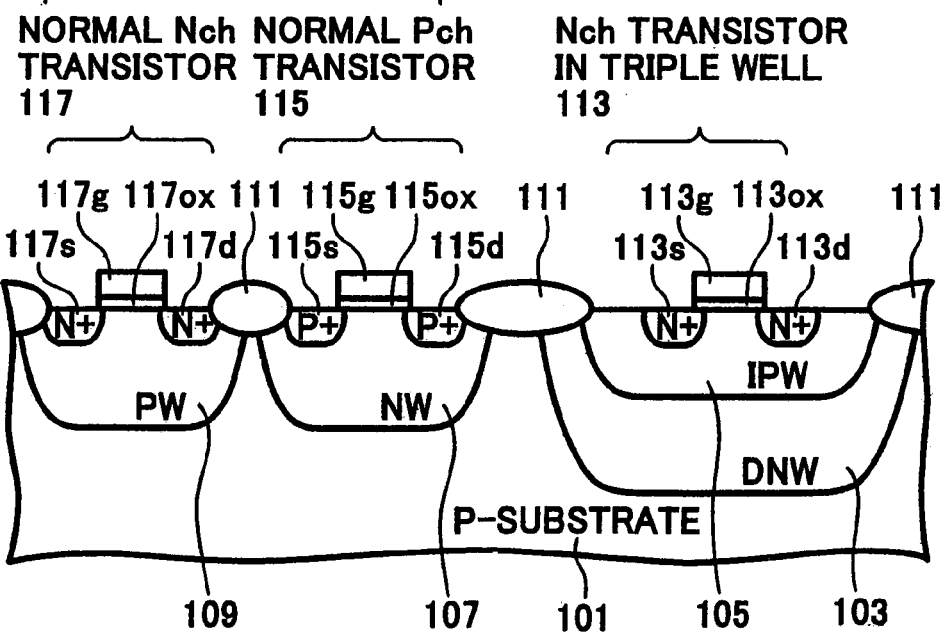
FIG. 23 is a cross-sectional view illustrating the known semiconductor device including transistors formed the well structure of FIG. 22.
Figure 24A:
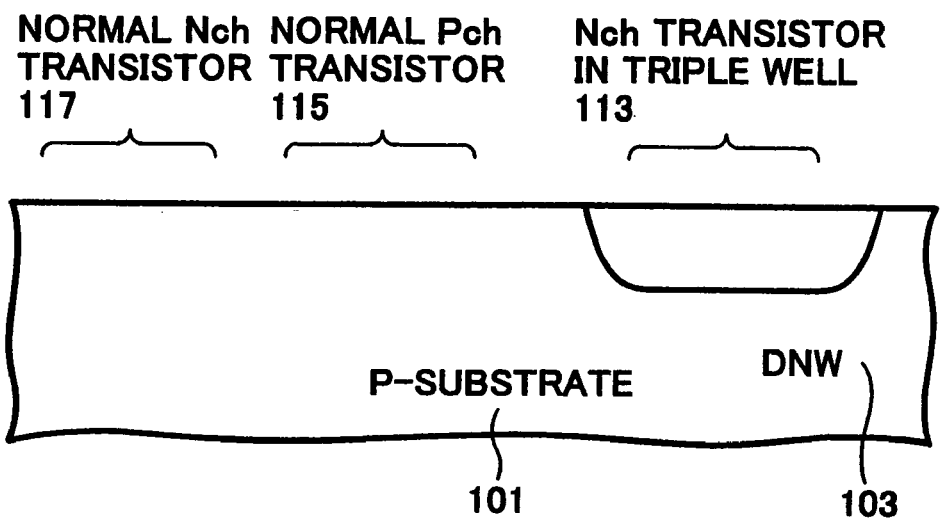
FIGS. 24A through 24E are each cross-sectional views illustrating process sequence for fabricating the semiconductor device of FIG. 23.
Figure 24B:
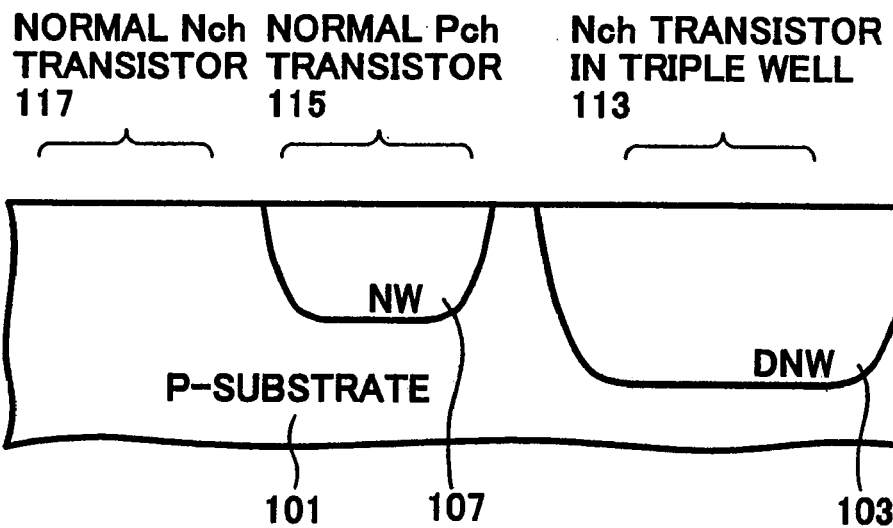
Figure 24C:
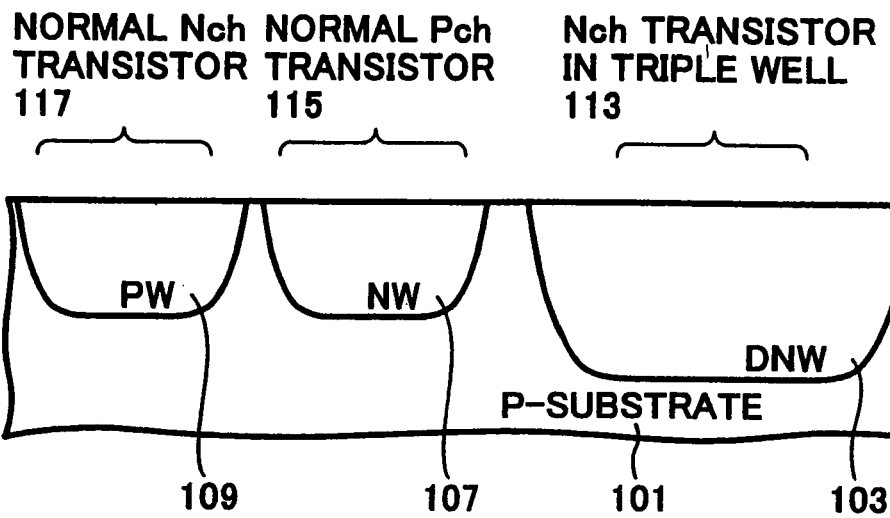
Figure 24D:
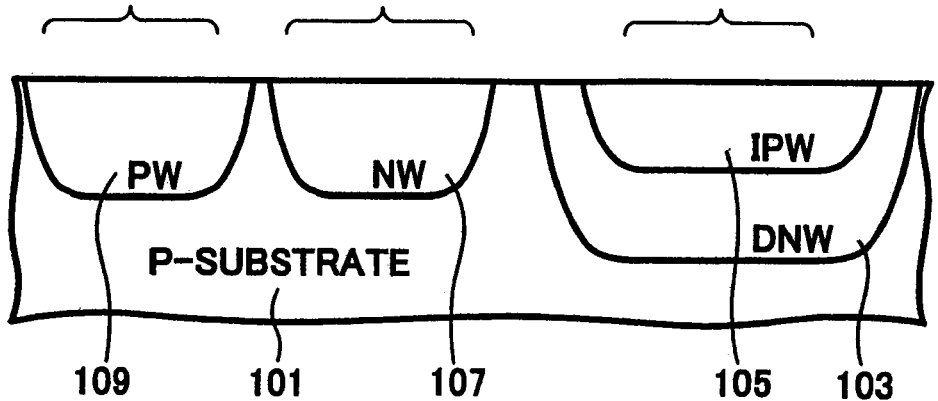
Figure 24E:
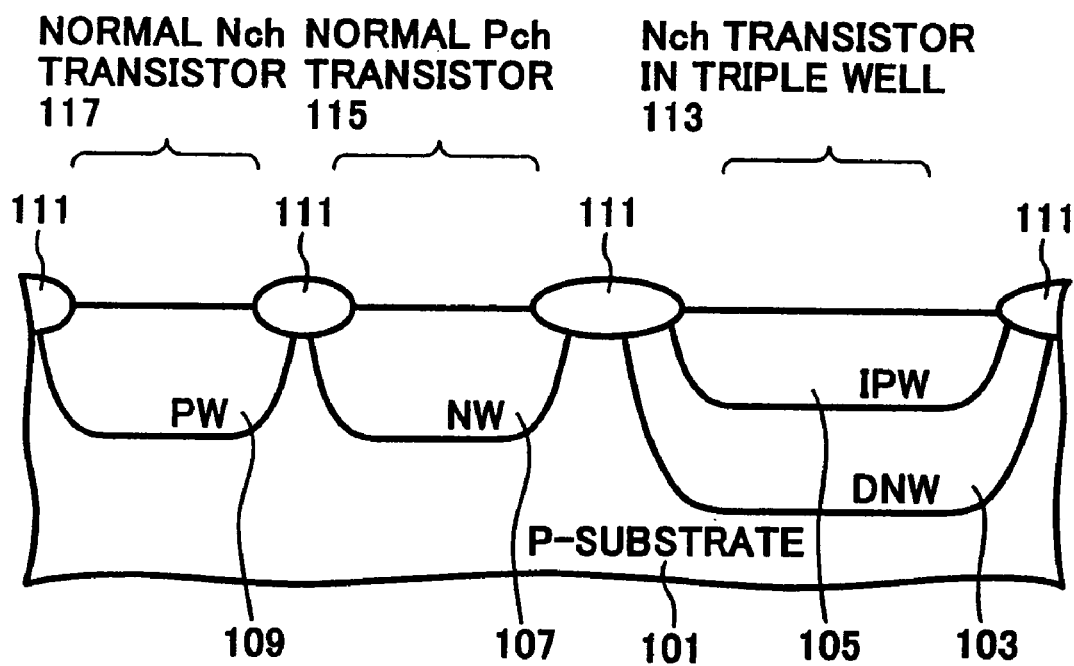
Figure 25:
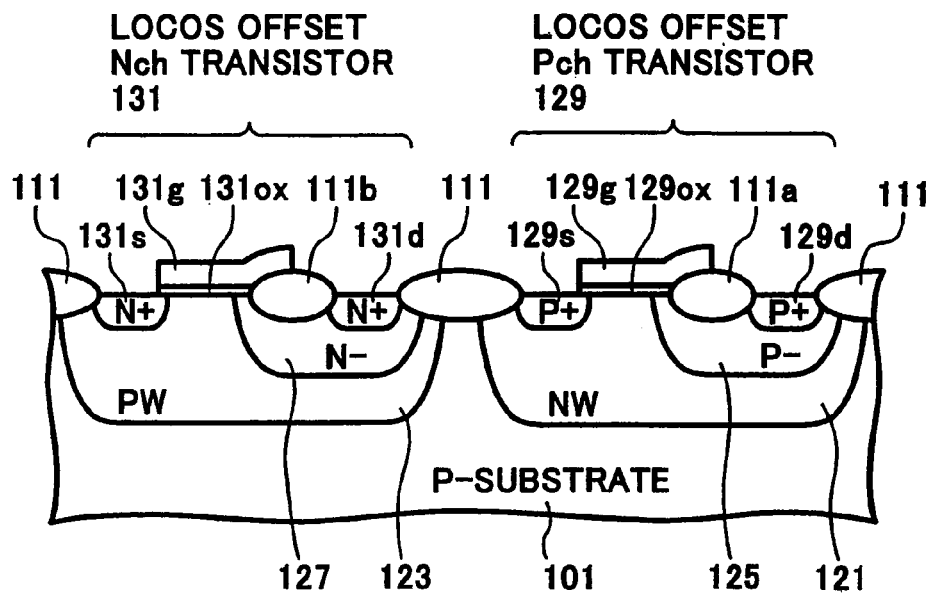
FIG. 25 is a cross-sectional view illustrating the combination of known LOCOS offset transistors.
Figure 26:
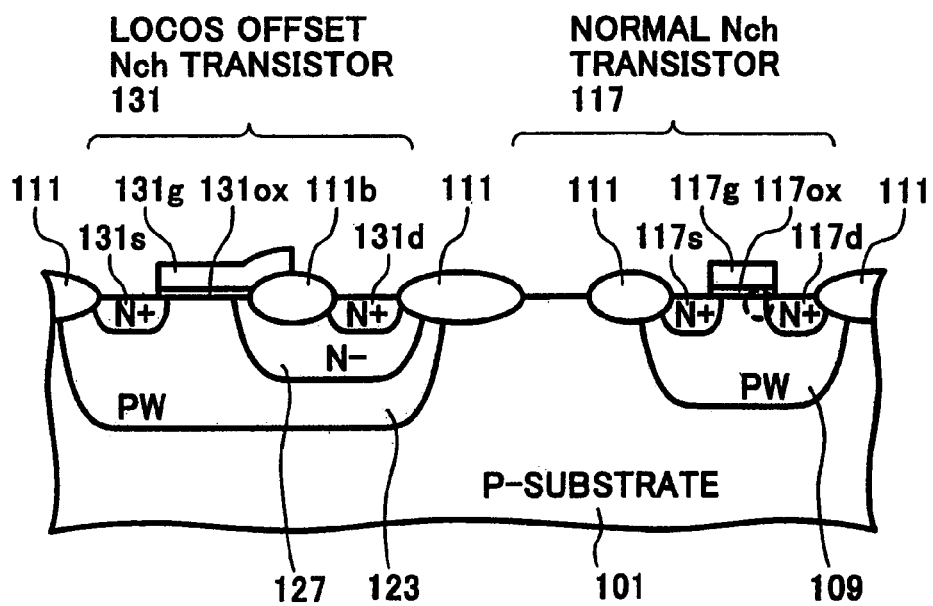
FIG. 26 is a cross sectional view illustrating the LOCOS offset Nch transistor and a normal Nch transistor.
Figure 27A:
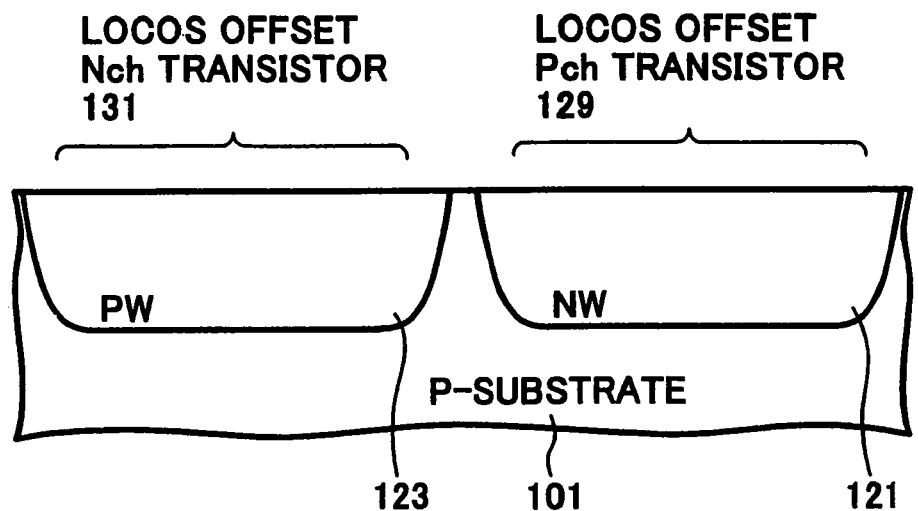
FIGS. 27A through 27D are each cross sectional views illustrating process sequence for fabricating the semiconductor device of FIG. 25.
Figure 27B:
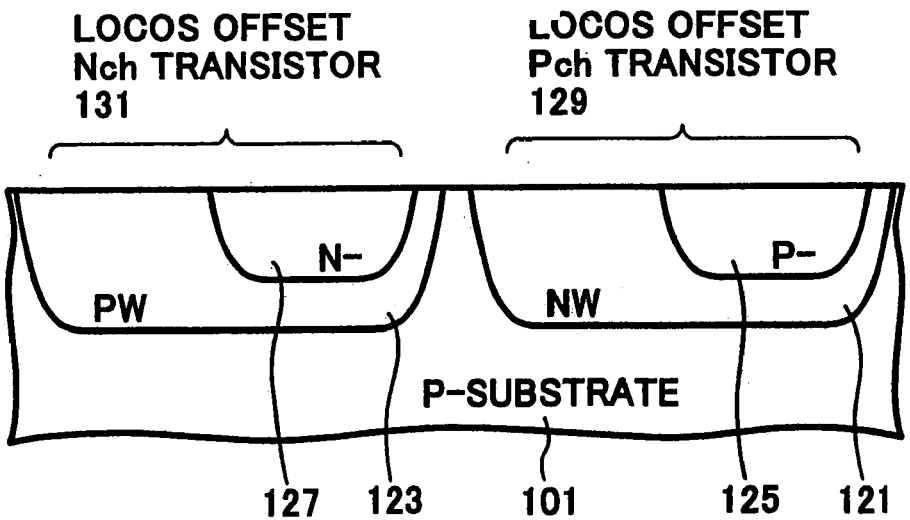
Figure 27C:
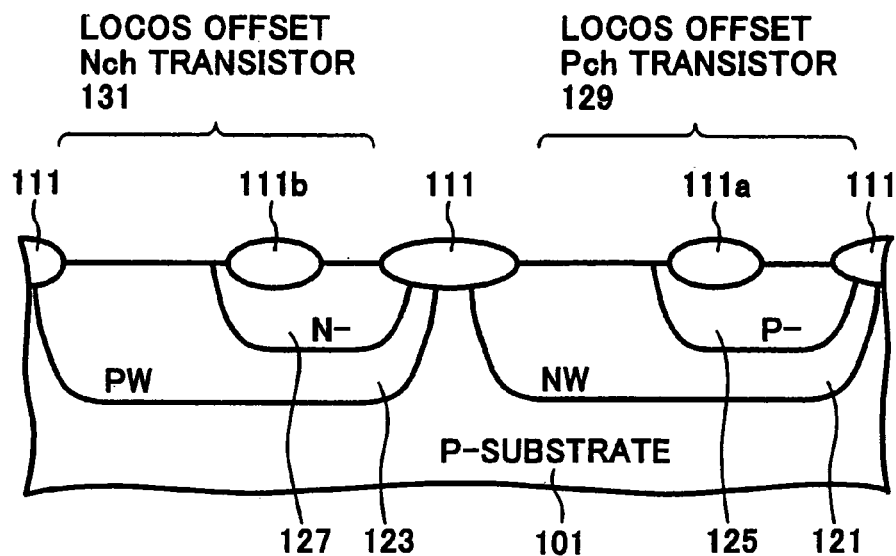
Figure 27D:
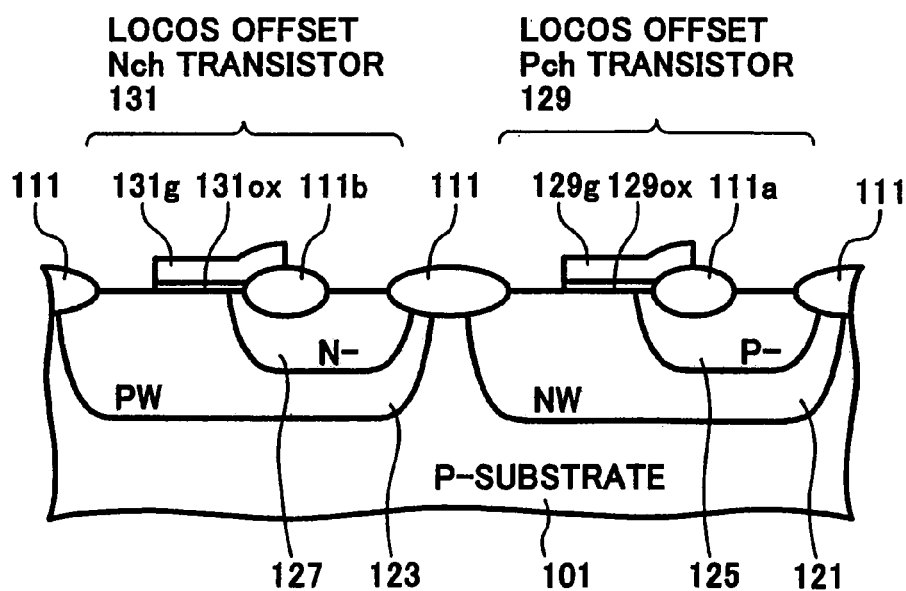
Figure 28:
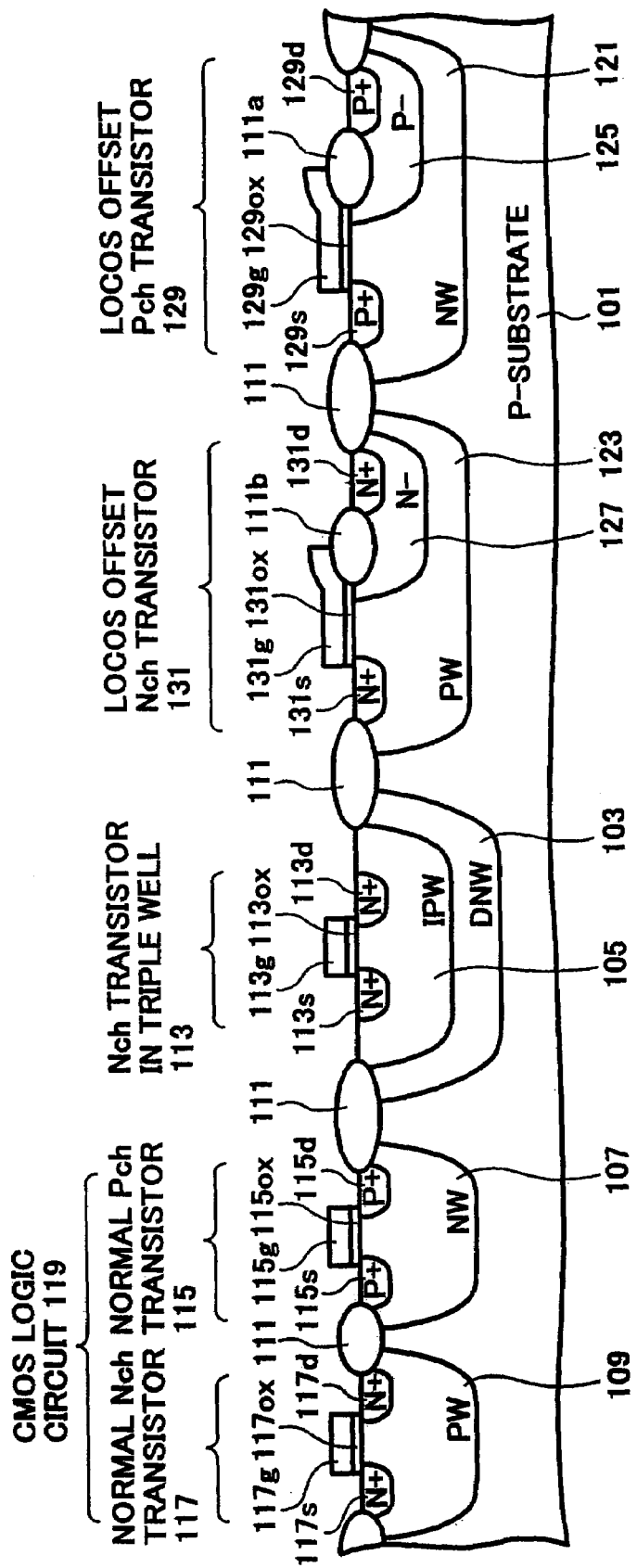
FIG. 28 is a cross-sectional view illustrating a known semiconductor device including a triple well, LOCOS offset transistor and CMOS logic circuit.

The low concentration N-type diffusion layer 39 is formed simultaneously with the deep N-well 3 and N-well 33. Other portions illustrated in FIG. 22 are formed in a similar manner to that shown in FIG. 8 (Example 7).

In this ninth example, the low concentration N-type diffusion layer 39 in offset Nch transistor 31 is formed simultaneously with the deep N-well 3, the P-well 37 simultaneously with the normal P-well 9, the low concentration P-type diffusion layer 25 in offset Pch transistor 29 simultaneously with the IP-well 5, and the N-well 21 simultaneously with the normal N-well 7.

As a result, the photolithography process steps required for defining merely the portions of either the offset Nch transistor 31 or offset Pch transistor 29 can be eliminated, whereby the number of required lithography process steps can be reduced.

In this ninth example, the P-well 37 and normal P-well 9 are formed during impurity doping steps preferably using a thermal oxide layer, formed selectively on the surface of regions for defining the deep N-well 3 and low concentration N-type diffusion layer 27, and a further thermal oxide layer, formed selectively on the surface of regions for defining the normal N-well 7 and N-well 21, as a mask for doping impurities.

As a result, the regions for forming the P-well 37 and normal P-well 9 can be defined without photolithography process steps otherwise required for defining these portions, whereby the number of required lithography process steps can further be reduced.

In addition, the P-well 37 and normal P-well 9 can be formed by process steps similar to those described earlier in Example 7 in reference to FIGS. 8 through 9H and Example 8 in reference to FIGS. 10 thought 11H.

Further, the deep N-well 3 and low concentration N-type diffusion layer 39 in Example 9 may alternatively be formed during impurity doping steps using a thermal oxide layer as a mask, formed selectively on the surface of regions for forming the P-well 37 and normal P-well 9, and a further thermal oxide layer, formed selectively on the surface of the region for the normal N-well 7 and N-well 21.

As a result, the regions for forming the deep N-well 3 and low concentration N-type diffusion layer 39 can be defined without photolithography process steps otherwise required for defining the portion, whereby the number of required lithography process steps can further be reduced.

Still further, the normal N-well 7 and normal N-well 21 in Example 9 may alternatively be formed during impurity doping steps using a thermal oxide layer, formed selectively on the surface of regions for forming the P-well 37 and normal P-well 9, and a further thermal oxide layer, formed selectively on the surface of the regions for forming deep N-well 3 and low concentration N-type diffusion layer 39, as a mask for doping impurities.

As a result, the regions for forming the normal N-well 7 and normal N-well 21 can be defined without photolithography process steps otherwise required for defining these portions, whereby the number of required lithography process steps can further be reduced.

Figure 21:
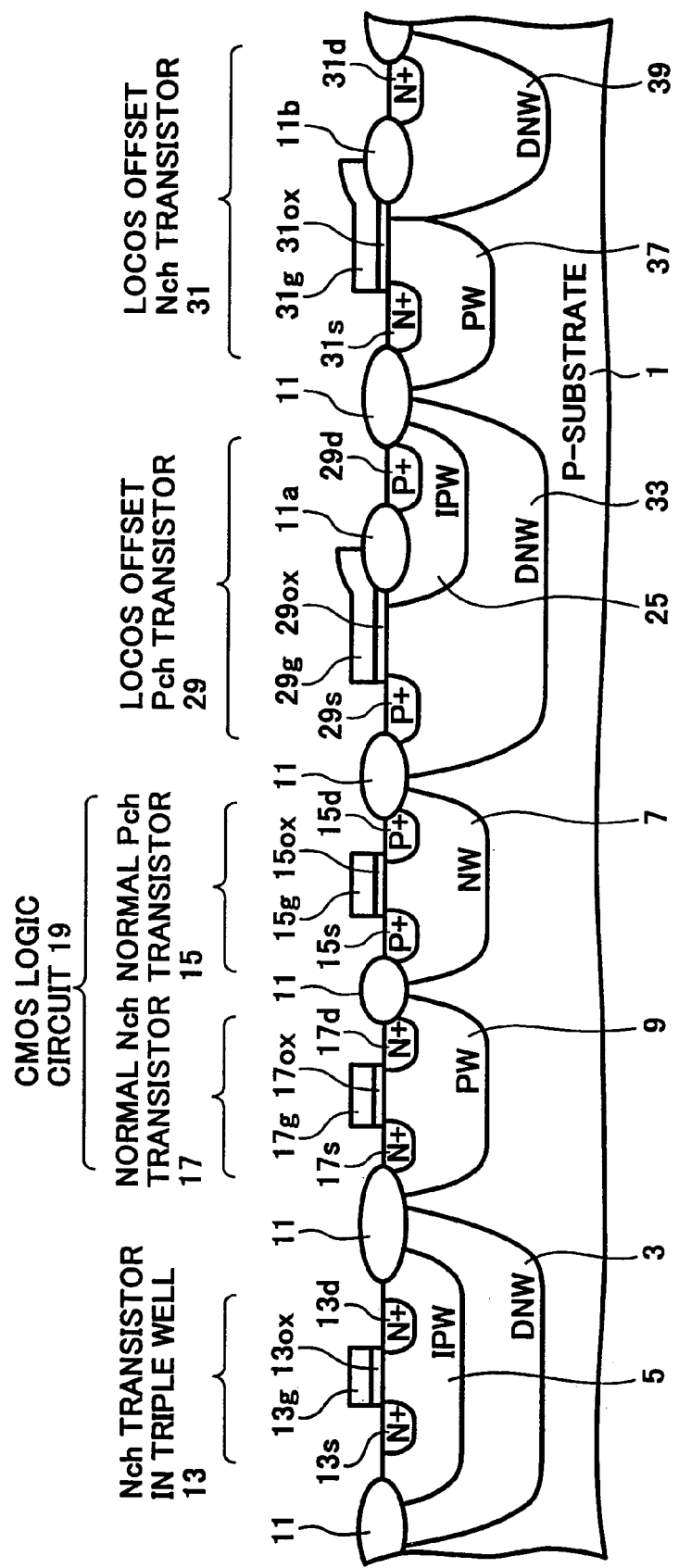
FIG. 21 is a cross-sectional view illustrating a semiconductor device according to a tenth example disclosed herein.

FIG. 21 is a cross-sectional view illustrating a semiconductor device according to a tenth example disclosed herein.

The present semiconductor device is formed in conformity with the fifteenth embodiment mentioned earlier including several components such as offset Nch transistor, offset Pch transistor, normal P-well, normal N-well and triple well. This semiconductor device, therefore, consists of the components mentioned in the third embodiment (including the offset Nch transistor and triple well) and fourth embodiment (including the offset Pch transistor and triple well).

Like reference numerals in FIG. 21 designate identical or corresponding parts in FIG. 10 (Example 8) and FIG. 20 (Example 9), detailed description thereof is herein abbreviated.

In the region for forming a LOCOS offset Nch transistor 31 in the P-substrate 1, a low concentration N-type diffusion layer (DNW) 39 is formed in place of low concentration N-type diffusion layer 27 (FIG. 10).

The low concentration N-type diffusion layer 39 is formed simultaneously with the deep N-well 3 and N-well 33. Other portions illustrated in FIG. 22 are formed in a similar manner to that shown in FIG. 10 (Example 8).

In this tenth example, the low concentration N-type diffusion layer 39 in offset Nch transistor 31 is formed simultaneously with the deep N-well 3 and N-well 33, the P-well 37 simultaneously with the normal P-well 9, the low concentration P-type diffusion layer 25 in offset Pch transistor 29 simultaneously with the IP-well 5, and the N-well 33 simultaneously with the deep N-well 3 and low concentration N-type diffusion layer 39.

As a result, the photolithography process steps required for defining merely the portions of either the offset Nch transistor 31 or offset Pch transistor 29 can be eliminated, whereby the number of required lithography process steps can be reduced.

In this tenth example, the P-well 37 and normal P-well 9 are formed during impurity doping steps preferably using a thermal oxide layer, formed selectively on the surface of regions for defining the deep N-well 3, N-well 33 and low concentration N-type diffusion layer 39, and a further thermal oxide layer, formed selectively on the surface of regions for defining the normal N-well 7, as a mask for doping impurities.

As a result, the regions for forming the P-well 37 and normal P-well 9 can be defined without photolithography process steps otherwise required for defining these portions, whereby the number of required lithography process steps can further be reduced.

In addition, the P-well 37 and normal P-well 9 can be formed by process steps similar to those described earlier in Example 7 in reference to FIGS. 8 through 9H and Example 8 in reference to FIGS. 10 thought 11H.

Further, the deep N-well 3, N-well 33 and low concentration N-type diffusion layer 39 in Example 10 may alternatively be formed during impurity doping steps using a thermal oxide layer, formed selectively on the surface of regions for forming the P-well 37 and normal P-well 9, and a further thermal oxide layer, formed selectively on the surface of the region for the normal N-well 7, as a mask for doping impurities.

As a result, the regions for forming the deep N-well 3, N-well 33 and low concentration N-type diffusion layer 39 can be defined without photolithography process steps otherwise required for defining the portion, whereby the number of required lithography process steps can further be reduced.

Still further, the normal N-well 7 in Example 10 may alternatively be formed during impurity doping steps using a thermal oxide layer, formed selectively on the surface of regions for forming the P-well 37 and normal P-well 9, and a further thermal oxide layer, formed selectively on the surface of the regions for forming deep N-well 3, N-well 33 and low concentration N-type diffusion layer 39, as a mask for doping impurities.

As a result, the regions for forming the normal N-well 7 can be defined without photolithography process steps otherwise required for defining these portions, whereby the number of required lithography process steps can further be reduced.

According to the several improvements disclosed herein, therefore, the fabrication of LOCOS transistors becomes feasible with the reduced number of photolithographic process steps, whereby production costs and unit price for the device can be decreased.

In addition, further decrease in production period resulted from the reduced number of the process steps can facilitate speedy product development for the present semiconductor devices.

Furthermore, in the case when the low concentration N-type diffusion layer as the drain, 27 or 39, is formed adjacent to the P-well 37 incorporating the source 31s of offset Nch transistor 31 as illustrated in FIGS. 8, 10, 20 and 21, the regions for forming the P-well 37 and normal P-well 9, for example, can be defined without photolithography process steps otherwise required for defining these portions.

As a result, production costs can be decreased further, and unit price for the device decreases concomitantly. This decreases further production period, thereby facilitating speedy product development for the semiconductor devices.

While the present disclosure has been described in connection with the above examples, it will be understood it is not intended to limit the invention to these examples. On the contrary, it is intended to cover numerous changes and modification.

For example, LOCOS oxide layers 11a, 11b are used in forming the LOCOS offset Pch transistor 29 and Nch transistor 31. However, the thick oxide layer in use for providing a gate electrode spatially separated from a high concentration drain diffusion layer is not limited only to the LOCOS oxide layers, but may also include oxide layers formed by other methods. It is noted herein that such thick oxide layers are formed preferably having a thickness of at least 100 nm.

While the P-substrate is used in these examples, an N-substrate may be used after incorporating the elements and components included in the devices each having the conductivity type opposite to those given in the above Examples.

In addition, it will be understood specific descriptions made, for example, on the materials and thickness for the elements and components are made for purposes of clarity, but not for limiting the contents of the present disclosure.

For example, silicon nitride layers 41, 45, 49 and 53 which are used as the masks for implanting impurity ions during process steps in reference to FIGS. 2A through 9H (Example 7) and FIGS. 10 through 11H (Example 8). However, the layers of other materials such as the silicon nitride in combination of silicon oxide may alternatively be used as the mask as long as the capability is satisfactory.

Furthermore, while phosphorous or boron ions are used during fabrication process for the ion implantation into the P-substrate, other impurities may alternatively be used such as arsenic, $BF_3$ and similar species. In addition, the conditions for the ion implantation are specified on the ion energy and dose in Examples, other conditions such as, for example, the angle of incidence for the implantation is not specified for the present purposes.

The semiconductor device fabrication and process steps set forth in the present description may therefore be implemented using suitable host computers and terminals incorporating appropriate processors programmed according to the teachings disclosed herein, as will be appreciated to those skilled in the relevant arts.

Therefore, the present disclosure also includes a computer-based product which may be hosted on a storage medium and include instructions which can be used to program a processor to perform a process in accordance with the present disclosure. The storage medium can include, but is not limited to, any type of disk including floppy disks, optical disks, CD-ROMS, magneto-optical disks, ROMs, RAMs, EPROMs, EEPROMS, flash memory, magnetic or optical cards, or any type of media suitable for storing electronic instructions.

It is apparent from the above description including the examples, the semiconductor devices and methods disclosed herein have several advantages over similar devices and methods previously known.

For example, the offset Nch transistor and normal N-well are both provided on the same P-substrate in the semiconductor device disclosed herein, and the low concentration N-type diffusion layer included in offset Nch transistor and normal N-well are formed simultaneously at the same stage of process. As a result, photolithography process steps required for defining merely the portion of the low concentration N-type diffusion layer can be eliminated, whereby the number of required lithography process steps can be reduced.

In addition, in a further semiconductor device disclosed herein, the offset Nch transistor, triple well having a deep N-well and P-type IP well formed therein are each formed in a P-substrate.

The P-well included in the semiconductor device is formed during impurity doping steps using a thermal oxide layer, which is formed selectively on the surface of the regions for forming the low concentration N-type diffusion layer and deep N-well, as a mask for doping impurities, and the thermal oxide layer was previously formed using another mask for defining the regions for forming the low concentration N-type diffusion layer and deep N-well.

As a result, photolithography process steps required for defining merely the portions of the low concentration N-type diffusion layer and normal N-well can be eliminated, whereby the number of required lithography process steps can be reduced further.

Still in addition, the offset Pch transistor and normal P-well are both provided on the same P-substrate, and the low concentration P-type diffusion layer included in offset Pch transistor and normal P-well are formed simultaneously at the same stage of process. As a result, photolithography process steps required for defining merely the portion of the low concentration N-type diffusion layer can be eliminated, whereby the number of required lithography process steps can be reduced.

Although advantages of the present disclosure are not repeated one by one, improvements and concomitant advantages similar to those noted above are offered by respective embodiments described herein above.

Furthermore, it is added throughout the embodiments disclosed that the thick oxide layer is preferably a LOCOS oxide layer, and that the semiconductor devices can be fabricated by adopting respective portions and elements each having the conductivity type opposite to that indicated herein above. These also facilitate to reduce further the number of required lithography process steps.

Obviously, additional modifications and variations of the present invention are possible in light of the above teachings. It is therefore to be understood that within the scope of the appended claims, the invention may be practiced otherwise than as specifically described herein.

What is claimed as new and desired to be protected by Letters Patent of the United States is:

1. A method of forming a semiconductor device, comprising:
   providing a semiconductor substrate of a first conductivity type;
   forming an offset second conductivity type channel transistor comprising a source and a drain each having a second conductivity type opposite to said first conductivity type, and a gate electrode, said source and said drain each being formed spatially separated from one another,
   said source being formed in a first conductivity type well, said drain being formed laterally adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer; and
   forming a normal second conductivity type well formed in said first conductivity type semiconductor substrate to be used for forming therein a first conductivity type channel MOS transistor; wherein:
   said low concentration second conductivity type diffusion layer and said normal second conductivity type well are formed simultaneously at a same process stage.

2. The method according to claim 1, wherein:
   said first conductivity type well is formed during impurity doping steps using a thermal oxide layer, formed selectively on a surface of regions for forming said low concentration second conductivity type diffusion layer and said normal second conductivity type well, as a mask for doping impurities, said thermal oxide layer being formed previously using another mask for defining regions for forming said low concentration second conductivity type diffusion layer and said normal second conductivity type well.

3. The method according to claim 1, wherein:
   said low concentration second conductivity type diffusion layer and said normal second conductivity type well are formed during impurity doping steps using a thermal oxide layer, formed selectively on a surface of a region for forming said first conductivity type well, as a mask for doping impurities, said thermal oxide layer being formed previously using another mask for defining said region for forming said first conductivity type well.

4. The method according to claim 1, further comprising:
   forming a normal first conductivity type well formed in said first conductivity type semiconductor substrate to be used for forming therein a second conductivity type channel MOS transistor; wherein:
   said first conductivity type well and said normal first conductivity type well are formed simultaneously at a same process stage.

5. The method according to claim 1, wherein said thick oxide layer is a LOCOS oxide layer.

6. A method of forming a semiconductor device, comprising:
   providing a first conductivity type semiconductor substrate;

forming an offset second conductivity type transistor comprising a source and a drain each having a second conductivity type opposite to said first conductivity type, and a gate electrode, said source and said drain each being formed spatially separated from one another, said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer; and forming a triple well formed in said first conductivity type semiconductor substrate having a deep second conductivity type well and a first conductivity type IP well formed therein; wherein:

said low concentration second conductivity type diffusion layer and said deep second conductivity type well are formed simultaneously at a same process stage.

7. The method according to claim 6, wherein:

said first conductivity type well is formed during impurity doping steps using a thermal oxide layer, formed selectively on a surface of regions for forming said low concentration second conductivity type diffusion layer and said deep second conductivity type well, as a mask for doping impurities, said thermal oxide layer being formed previously using another mask for defining regions for forming said low concentration second conductivity type diffusion layer and said deep second conductivity type well.

8. The method according to claim 6, wherein:

said low concentration second conductivity type diffusion layer and said deep second conductivity type well are formed during impurity doping steps using a thermal oxide layer, formed selectively on a surface of a region for forming said first conductivity type well, as a mask for doping impurities, said thermal oxide layer being formed previously using another mask for defining said region for forming said first conductivity type well.

9. The method according to claim 6, further comprising:

forming a normal first conductivity type well formed in said first conductivity type semiconductor substrate to be used for forming therein a second conductivity type channel MOS transistor; wherein:

said first conductivity type well and said normal first conductivity type well are formed simultaneously at a same process stage.

10. The method according to claim 6, wherein said thick oxide layer is a LOCOS oxide layer.

11. A method of forming a semiconductor device, comprising:

providing a first conductivity type semiconductor substrate;

forming an offset first conductivity type channel transistor comprising a source and a drain each having a first conductivity type, and a gate electrode, said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer; and forming a triple well formed in said first conductivity type semiconductor substrate having a deep second conductivity type well and a first conductivity type IP well formed therein; wherein:

said low concentration first conductivity type diffusion layer and said IP well are formed simultaneously at a same process stage.

12. The method according to claim 11, wherein:

said second conductivity type well and said deep second conductivity type well are formed simultaneously at a same process stage.

13. The method according to claim 11, further comprising:

forming a normal second conductivity type well formed in said first conductivity type semiconductor substrate to be used for forming therein a first conductivity type channel MOS transistor, wherein:

said second conductivity type well and said normal second conductivity type well are formed simultaneously at a same process stage.

14. The method according to claim 11, wherein said thick oxide layer is a LOCOS oxide layer.

15. A method of forming a semiconductor device, comprising:

providing a first conductivity type semiconductor substrate;

forming an offset first conductivity type channel transistor comprising a first conductivity type source, a first conductivity type drain and a gate electrode, said first conductivity type source and said first conductivity type drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a normal first conductivity type well formed in said first conductivity type semiconductor substrate to be used for forming therein a second conductivity type channel MOS transistor, wherein said low concentration first conductivity type diffusion layer and said normal first conductivity type well are formed simultaneously at a same process stage; and forming a triple well formed in said first conductivity type semiconductor substrate having a deep second conductivity type well and a first conductivity type IP well formed therein; wherein:

said second conductivity type well and said deep second conductivity type well are formed simultaneously at a same process stage.

16. The method according to claim 15, further comprising:

forming a normal second conductivity type well formed in said first conductivity type semiconductor substrate to be used for forming therein a first conductivity type channel MOS transistor, wherein:

said second conductivity type well and said normal second conductivity type well are formed simultaneously at a same process stage.

17. The method according to claim 15, wherein said thick oxide layer is a LOCOS oxide layer.

18. A method of forming a semiconductor device, comprising:

providing a semiconductor substrate of a first conductivity type;

forming an offset second conductivity type channel transistor comprising a source and a drain each having a second conductivity type opposite to said first conductivity type, and a gate electrode, said source and said drain being formed spatially separated from one another in a first conductivity type well formed in said semiconductor substrate, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a normal second conductivity type well formed in said semiconductor substrate to be used for forming therein a first conductivity type channel MOS transistor; wherein:

said low concentration second conductivity type diffusion layer and said normal second conductivity type well are formed simultaneously at a same process stage;

forming an offset first conductivity type channel transistor comprising a source and a drain each having a first conductivity type, and a gate electrode, said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration first conductivity type diffusion layer and said IP well are formed simultaneously at a same process stage;

forming a normal first conductivity type well formed in said first conductivity type semiconductor substrate to be used for forming therein a second conductivity type channel MOS transistor; wherein:

said low concentration second conductivity type diffusion layer, said second conductivity type well and said normal second conductivity type well are formed simultaneously at a same process stage, and wherein:

said first conductivity type well and said normal first conductivity type well are formed simultaneously at a same process stage.

19. The method according to claim 18, wherein said thick oxide layer is a LOCOS oxide layer.

20. A method of forming a semiconductor device, comprising:

providing a semiconductor substrate of a first conductivity type;

forming an offset second conductivity type channel transistor comprising a source and a drain each having a second conductivity type opposite to said first conductivity type, and a gate electrode, said source and said drain being formed spatially separated from one another in a first conductivity type well formed in said semiconductor substrate, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a normal second conductivity type well formed in said semiconductor substrate to be used for forming therein a first conductivity type channel MOS transistor; wherein:

said low concentration second conductivity type diffusion layer and said normal second conductivity type well are formed simultaneously at a same process stage;

forming an offset first conductivity type channel transistor comprising a source and a drain each having a first conductivity type, and a gate electrode, said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration first conductivity type diffusion layer and said IP well are formed simultaneously at a same process stage, and said second conductivity type well and said deep second conductivity type well being formed simultaneously at a same process stage;

forming a normal first conductivity type well formed in said first conductivity type semiconductor substrate to be used for forming therein a second conductivity type channel MOS transistor; wherein:

said low concentration second conductivity type diffusion layer, said second conductivity type well and said normal second conductivity type well are formed simultaneously at a same process stage, and wherein:

said first conductivity type well and said normal first conductivity type well are formed simultaneously at a same process stage.

21. The method according to claim 20, wherein said thick oxide layer is a LOCOS oxide layer.

22. A method of forming a semiconductor device, comprising:

providing a semiconductor substrate of a first conductivity type;

forming an offset second conductivity type channel transistor comprising a source and a drain each having a second conductivity type opposite to said first conductivity type, and a gate electrode, said source and said drain being formed spatially separated from one another in a first conductivity type well formed in said semiconductor substrate, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a normal second conductivity type well formed in said semiconductor substrate to be used for forming therein a first conductivity type channel MOS transistor; wherein:

said low concentration second conductivity type diffusion layer and said normal second conductivity type well are formed simultaneously at a same process stage;

forming an offset first conductivity type channel transistor comprising a first conductivity type source, a first conductivity type drain and a gate electrode, said first conductivity type source and said first conductivity type drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a normal first conductivity type well formed in said first conductivity type semiconductor substrate to be used for forming therein a second conductivity type channel MOS transistor; wherein:

said low concentration first conductivity type diffusion layer and said normal first conductivity type well are formed simultaneously at a same process stage; and forming a triple well formed in said first conductivity type semiconductor substrate having a deep second conductivity type well and a first conductivity type IP well formed therein; wherein:

said second conductivity type well and said deep second conductivity type well are formed simultaneously at a same process stage.

23. The method according to claim 22, wherein said thick oxide layer is a LOCOS oxide layer.

24. A method of forming a semiconductor device, comprising:

providing a semiconductor substrate of a first conductivity type;

forming an offset second conductivity type channel transistor comprising a source and a drain each having a second conductivity type opposite to said first conductivity type, and a gate electrode, said source and said drain each being formed spatially separated from one another, said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a normal second conductivity type well formed in said first conductivity type semiconductor substrate to be used for forming therein a first conductivity type channel MOS transistor; wherein:

said low concentration second conductivity type diffusion layer and said normal second conductivity type well are formed simultaneously at a same process stage;

forming an offset first conductivity type channel transistor comprising a first conductivity type source, a first conductivity type drain and a gate electrode, said first conductivity type source and said first conductivity type drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a normal first conductivity type well formed in said first conductivity type semiconductor substrate to be used for forming therein a second conductivity type channel MOS transistor; wherein:

said low concentration first conductivity type diffusion layer and said normal first conductivity type well are formed simultaneously at a same process stage; and forming a triple well formed in said first conductivity type semiconductor substrate having a deep second conductivity type well and a first conductivity type IP well formed therein; wherein:

said second conductivity type well and said deep second conductivity type well are formed simultaneously at a same process stage.

25. The method according to claim 24, wherein said thick oxide layer is a LOCOS oxide layer.

26. A method of forming a semiconductor device, comprising:

providing a first conductivity type semiconductor substrate;

forming an offset second conductivity type transistor comprising a source and a drain each having a second conductivity type opposite to said first conductivity type, and a gate electrode, said source and said drain each being formed spatially separated from one another, said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration second conductivity type diffusion layer and said deep second conductivity type well are formed simultaneously at a same process stage;

forming an offset first conductivity type channel transistor comprising a first conductivity type source, a first conductivity type drain and a gate electrode, said first conductivity type source and said first conductivity type drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a normal first conductivity type well formed in said first conductivity type semiconductor substrate to be used for forming therein a second conductivity type channel MOS transistor; wherein:

said low concentration first conductivity type diffusion layer and said normal first conductivity type well are formed simultaneously at a same process stage; and forming a triple well formed in said first conductivity type semiconductor substrate having a deep second conductivity type well and a first conductivity type IP well formed therein; wherein:

said second conductivity type well and said deep second conductivity type well are formed simultaneously at a same process stage.

27. The method according to claim 26, wherein said thick oxide layer is a LOCOS oxide layer.

28. A method of forming a semiconductor device, comprising:

forming a semiconductor substrate of a first conductivity type;

forming an offset second conductivity type channel transistor comprising a source and a drain each having a second conductivity type opposite to said first conductivity type, and a gate electrode, said source and said drain each being formed spatially separated from one another, said source being formed in a first conductivity type well, said drain being formed laterally adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a normal second conductivity type well formed in said first conductivity type semiconductor substrate to be used for forming therein a first conductivity type channel MOS transistor; wherein:

said low concentration second conductivity type diffusion layer and said normal second conductivity type well are formed simultaneously at a same process stage;

forming an offset first conductivity type channel transistor comprising a first conductivity type source, a first conductivity type drain and a gate electrode, said first conductivity type source and said first conductivity type drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a normal first conductivity type well formed in said first conductivity type semiconductor substrate to be used for forming therein a second conductivity type channel MOS transistor; and wherein:

said low concentration first conductivity type diffusion layer and said normal first conductivity type well are formed simultaneously at a same process stage.

29. The method according to claim 28, wherein said thick oxide layer is a LOCOS oxide layer.

30. A method of forming a semiconductor device, comprising:

providing a semiconductor substrate of a first conductivity type;

forming an offset second conductivity type channel transistor comprising a source and a drain each having a second conductivity type opposite to said first conductivity type, and a gate electrode, said source and said drain each being formed spatially separated from one another, said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a normal second conductivity type well formed in said first conductivity type semiconductor substrate to be used for forming therein a first conductivity type channel MOS transistor; wherein:

said low concentration second conductivity type diffusion layer and said normal second conductivity type well are formed simultaneously at a same process stage;

forming an offset first conductivity type channel transistor comprising a source and a drain each having a first conductivity type, and a gate electrode, said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration first conductivity type diffusion layer and said IP well are formed simultaneously at a same process stage;

forming a normal first conductivity type well formed in said first conductivity type semiconductor substrate to be used for forming therein an second conductivity type channel MOS transistor; wherein:

said low concentration second conductivity type diffusion layer, said second conductivity type well and said normal second conductivity type well are formed simultaneously at a same process stage, and wherein:

said first conductivity type well and said normal first conductivity type well are formed simultaneously at a same process stage.

31. The method according to claim 30, wherein:
said first conductivity type well and said normal first conductivity type well are formed during impurity doping steps using a thermal oxide layer, formed selectively on a surface of regions for forming said second conductivity type well, said normal second conductivity type well, said low concentration second conductivity type diffusion layer and said deep second conductivity type well, as a mask for doping impurities, said thermal oxide layer being formed previously using another mask for defining regions for forming said second conductivity type well, said normal second conductivity type well, said low concentration second conductivity type diffusion layer and said deep second conductivity type well.

32. The method according to claim 30, wherein said thick oxide layer is a LOCOS oxide layer.

33. A method of forming a semiconductor device, comprising:
providing a semiconductor substrate of a first conductivity type;
forming an offset second conductivity type channel transistor comprising a source and a drain each having a second conductivity type opposite to said first conductivity type, and a gate electrode, said source and said drain each being formed spatially separated from one another,
said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;
forming a normal second conductivity type well formed in said first conductivity type semiconductor substrate to be used for forming therein a first conductivity type channel MOS transistor; wherein:
said low concentration second conductivity type diffusion layer and said normal second conductivity type well are formed simultaneously at a same process stage;
forming an offset first conductivity type channel transistor comprising a source and a drain each having a first conductivity type, and a gate electrode,
said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;
forming a triple well formed in said first conductivity type semiconductor substrate having a deep second conductivity type well and a first conductivity type IP well formed therein; wherein:
said low concentration first conductivity type diffusion layer and said IP well are formed simultaneously at a same process stage and said second conductivity type well and said deep second conductivity type well are formed simultaneously at a same process stage; and forming a normal first conductivity type well formed in said first conductivity type semiconductor substrate to be used for forming therein an second conductivity type channel MOS transistor; wherein:
said first conductivity type well and said normal first conductivity type well are formed simultaneously at a same process stage.

34. The method according to claim 33, wherein:
said first conductivity type well and said normal first conductivity type well are formed during impurity doping steps using a thermal oxide layer, formed selectively on a surface of regions for forming said second conductivity type well, said normal second conductivity type well, said low concentration second conductivity type diffusion layer and said deep second conductivity type well, as a mask for doping impurities, said thermal oxide layer being formed previously using another mask for defining regions for forming said second conductivity type well, said normal second conductivity type well, said low concentration second conductivity type diffusion layer and said deep second conductivity type well.

35. The method according to claim 33, wherein said thick oxide layer is a LOCOS oxide layer.

36. A method of forming a semiconductor device, comprising:
providing a first conductivity type semiconductor substrate;
forming an offset second conductivity type transistor comprising a source and a drain each having a second conductivity type opposite to said first conductivity type, and a gate electrode,
said source and said drain each being formed spatially separated from one another, said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;
forming a triple well formed in said first conductivity type semiconductor substrate having a deep second conductivity type well and a first conductivity type IP well formed therein; wherein:
said low concentration second conductivity type diffusion layer and said deep second conductivity type well are formed simultaneously at a same process stage;
forming an offset first conductivity type channel transistor comprising a source and a drain each having a first conductivity type, and a gate electrode,
said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration first conductivity type diffusion layer and said IP well are formed simultaneously at a same process stage and said second conductivity type well and said deep second conductivity type well are formed simultaneously at a same process stage;

forming a normal first conductivity type well formed in said first conductivity type semiconductor substrate to be used for forming therein an second conductivity type channel MOS transistor; wherein:

said second conductivity type well and said normal second conductivity type well are formed simultaneously at a same process stage, and wherein:

said first conductivity type well and said normal first conductivity type well are formed simultaneously at a same process stage.

37. The method according to claim 36, wherein:

said first conductivity type well and said normal first conductivity type well are formed during impurity doping steps using a thermal oxide layer, formed selectively on a surface of regions for forming said second conductivity type well, said normal second conductivity type well, said low concentration second conductivity type diffusion layer and said deep second conductivity type well, as a mask for doping impurities, said thermal oxide layer being formed previously using another mask for defining regions for forming said second conductivity type well, said normal second conductivity type well, said low concentration second conductivity type diffusion layer and said deep second conductivity type well.

38. The method according to claim 36, wherein said thick oxide layer is a LOCOS oxide layer.

39. A method of forming a semiconductor device, comprising:

providing a first conductivity type semiconductor substrate;

forming an offset second conductivity type transistor comprising a source and a drain each having a second conductivity type opposite to said first conductivity type, and a gate electrode, said source and said drain each being formed spatially separated from one another, said source being formed in a first conductivity type well, said drain being formed adjacent to said first conductivity type well, between said source and said drain at least said drain having a high concentration second conductivity type diffusion layer surrounded by a low concentration second conductivity type diffusion layer of a concentration lower than said high concentration second conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration second conductivity type diffusion layer and said deep second conductivity type well are formed simultaneously at a same process stage;

forming an offset first conductivity type channel transistor comprising a source and a drain each having a first conductivity type, and a gate electrode, said source and said drain each being formed spatially separated from one another in a second conductivity type well formed in said first conductivity type semiconductor substrate, between said source and said drain at least said drain having a high concentration first conductivity type diffusion layer surrounded by a low concentration first conductivity type diffusion layer of a concentration lower than said high concentration first conductivity type diffusion layer, one edge of said gate electrode toward said drain being formed on a thick oxide layer;

forming a triple well formed in said first conductivity type semiconductor substrate having a deep second conductivity type well and a first conductivity type IP well formed therein; wherein:

said low concentration first conductivity type diffusion layer and said IP well are formed simultaneously at a same process stage and said second conductivity type well and said deep second conductivity type well are formed simultaneously at a same process stage;

forming a normal second conductivity type well formed in said first conductivity type semiconductor substrate to be used for forming therein a first conductivity type channel MOS transistor;

forming a normal first conductivity type well formed in said first conductivity type semiconductor substrate to be used for forming therein an second conductivity type channel MOS transistor; wherein:

said low concentration second conductivity type diffusion layer, said second conductivity type well and said deep second conductivity type well are formed simultaneously at a same process stage, and wherein:

said low concentration first conductivity type diffusion layer and said normal first conductivity type well are formed simultaneously at a same process stage.

40. The method according to claim 39, wherein:

said first conductivity type well and said normal first conductivity type well are formed during impurity doping steps using a thermal oxide layer, formed selectively on a surface of regions for forming said second conductivity type well, said normal second conductivity type well, said low concentration second conductivity type diffusion layer and said deep second conductivity type well, as a mask for doping impurities, said thermal oxide layer being formed previously using another mask for defining regions for forming said second conductivity type well, said normal second conductivity type well, said low concentration second conductivity type diffusion layer and said deep second conductivity type well.

41. The method according to claim 39, wherein said thick oxide layer is a LOCOS oxide layer.

* * * * *